(12) United States Patent
Kang et al.

(10) Patent No.: US 12,106,904 B2
(45) Date of Patent: *Oct. 1, 2024

(54) SEMICONDUCTOR DEVICE WITH A BOOSTER LAYER AND METHOD FOR FABRICATING THE SAME

(71) Applicant: SK hynix Inc., Gyeonggi-do (KR)

(72) Inventors: Se-Hun Kang, Gyeonggi-do (KR); Han-Joon Kim, Gyeonggi-do (KR); Ki-Vin Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

This patent is subject to a terminal disclaimer.

(21) Appl. No.: 17/860,367

(22) Filed: Jul. 8, 2022

(65) Prior Publication Data

US 2022/0351903 A1 Nov. 3, 2022

Related U.S. Application Data

(63) Continuation of application No. 16/865,957, filed on May 4, 2020, now Pat. No. 11,410,813.

(30) Foreign Application Priority Data

Nov. 12, 2019 (KR) .......................... 10-2019-0144440

(51) Int. Cl.
*H01G 4/10* (2006.01)
*H01L 29/51* (2006.01)
(Continued)

(52) U.S. Cl.
CPC .............. *H01G 4/10* (2013.01); *H01L 28/40* (2013.01); *H01L 29/517* (2013.01); *H10B 12/30* (2023.02)

(58) Field of Classification Search
CPC ... H01G 4/10; H01L 27/10805; H01L 29/517; H01L 29/518; H01L 21/02189; H01L 21/02181; H01L 28/40–92
See application file for complete search history.

(56) References Cited

U.S. PATENT DOCUMENTS 11,410,813 B2 * 8/2022 Kang ....................... H01G 4/20
2008/0203529 A1 8/2008 Kang et al.
(Continued)

FOREIGN PATENT DOCUMENTS

CN 109216328 A 1/2019
KR 20110008398 A 1/2011
(Continued)

OTHER PUBLICATIONS

Office Action for the Taiwanese Patent Application No. 109117330 issued by the Taiwanese Patent Office on Dec. 12, 2023.
(Continued)

*Primary Examiner* — Nelson Garces
(74) *Attorney, Agent, or Firm* — IP & T GROUP LLP

(57) ABSTRACT

A semiconductor device includes: a first electrode; a second electrode; and a multi-layered stack including a hafnium oxide layer of a tetragonal crystal structure which is positioned between the first electrode and the second electrode, wherein the multi-layered stack includes: a seed layer for promoting tetragonal crystallization of the hafnium oxide layer and having a tetragonal crystal structure; and a booster layer for boosting a dielectric constant of the hafnium oxide layer.

15 Claims, 43 Drawing Sheets

(51) Int. Cl.
*H01L 49/02* (2006.01)
*H10B 12/00* (2023.01)

(56) References Cited

U.S. PATENT DOCUMENTS

| | | | |
|---|---|---|---|
| 2017/0004967 | A1 | 1/2017 | Kil et al. |
| 2018/0315811 | A1 | 11/2018 | Cho et al. |
| 2019/0013391 | A1* | 1/2019 | Moon ............... H01L 21/76221 |
| 2020/0013853 | A1* | 1/2020 | Cho ................. H01L 21/02271 |
| 2020/0058731 | A1* | 2/2020 | Mun .................... H10B 12/03 |
| 2020/0091279 | A1* | 3/2020 | Moon .............. H01L 21/02244 |

FOREIGN PATENT DOCUMENTS

| | | |
|---|---|---|
| KR | 20160038631 A | 4/2016 |
| TW | 201248726 A | 12/2012 |

OTHER PUBLICATIONS

Office Action for the Chinese Patent Application No. 202010452675.5 issued by the Chinese Patent Office on Oct. 30, 2023.
Office Action for the Korean Patent Application No. 10-2019-0144440 issued by the Korean Intellectual Property Office on Jan. 17, 2024.

* cited by examiner

SEMICONDUCTOR DEVICE WITH A BOOSTER LAYER AND METHOD FOR FABRICATING THE SAME

CROSS-REFERENCE TO RELATED APPLICATIONS

The present application is a continuation of U.S. patent application Ser. No. 16/865,957 filed on May 4, 2020, which claims priority of Korean Patent Application No. 10-2019-0144440, filed on Nov. 12, 2019, which is incorporated herein by reference in its entirety.

BACKGROUND

1. Field

Various embodiments of the present invention relate to a semiconductor device, and more particularly, to a semiconductor device and a method for fabricating the semiconductor device.

2. Description of the Related Art

Recently, as the integration of semiconductor memories is being accelerated, the operating voltage is getting lower while the unit cell area is reduced. This requires a high-k material having high capacitance and low leakage current.

Zirconium oxide ($ZrO_2$) is used as a dielectric layer of a capacitor as a high-k material, but there is a limit of how much the capacitance can be increased using zirconium oxide. Therefore, new ways of increasing the capacitance of such devices are needed.

SUMMARY

Embodiments of the present invention are directed to a semiconductor device including a dielectric layer having high dielectric constant and low leakage current, and a method for fabricating the semiconductor device In accordance with an embodiment of the present invention, a semiconductor device includes: a first electrode; a second electrode; and a multi-layered stack including a hafnium oxide layer of a tetragonal crystal structure which is positioned between the first electrode and the second electrode, wherein the multi-layered stack includes: a seed layer for promoting tetragonal crystallization of the hafnium oxide layer and having a tetragonal crystal structure; and a booster layer for boosting a dielectric constant of the hafnium oxide layer.

In accordance with another embodiment of the present invention, a method for fabricating a semiconductor device includes: forming a multi-layered stack of a booster layer, a seed layer having a doped layer embedded therein, and an initial hafnium oxide layer over the first electrode; forming a thermal source layer over the multi-layered stack to crystallize the initial hafnium oxide layer into tetragonal hafnium oxide; and forming a second electrode over the thermal source layer.

DETAILED DESCRIPTION

Figure 1A:
FIGS. 1A to 1C are cross-sectional views illustrating a semiconductor device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hafnium oxide having a tetragonal crystal structure (which is, hereinafter, simply referred to as 'tetragonal hafnium oxide') may have a high energy band gap (hereinafter abbreviated as a "high bandgap") and a high dielectric constant of approximately 60 or more. The tetragonal hafnium oxide may have a higher dielectric constant than tetragonal zirconium oxide.

According to a conventional method, to form tetragonal hafnium oxide, initial hafnium oxide may be deposited and then a high-temperature crystallization annealing process may be performed at approximately 900° C. or higher. The high-temperature crystallization annealing process, however, may deteriorate neighboring structures.

Hereinafter, the various embodiments of the present invention provide methods for forming tetragonal hafnium oxide without performing a high-temperature crystallization annealing process.

Since it is difficult to form pure tetragonal hafnium oxide by using a single layer of hafnium oxide, in the embodiments of the present invention, pure tetragonal hafnium oxide may be formed at a low temperature by using a seed layer as a crystallization promoting layer.

As will be described later, tetragonal hafnium oxide may be easily formed at a low temperature of approximately 500° C. or less by using at least one of a seed layer, a doped layer, and a thermal source layer.

In a multi-layered stack including a hafnium oxide layer and a zirconium oxide layer, a polarization phenomenon may be induced by the contact of the hafnium oxide layer and the zirconium oxide layer, and the polarization phenomenon may provide a high dielectric constant. A booster layer KBL may be proposed as a buffer layer for activating polarization of the hafnium oxide layer. The booster layer KBL may be disposed under the hafnium oxide layer or the zirconium oxide layer. The booster layer KBL may be disposed between the hafnium oxide layer and the zirconium oxide layer.

FIG. 1A is a cross-sectional view illustrating a semiconductor device 100 in accordance with an embodiment of the present invention.

Referring to FIG. 1A, the semiconductor device 100 may include an ultrahigh-k structure (ULKS). The ultrahigh-k structure (ULKS) may include a multi-layered stack in which at least two layers are stacked. For example, the ultrahigh-k structure (ULKS) may include a booster layer KBL and a dielectric layer DE. The booster layer KBL may be thinner than the dielectric layer DE.

The dielectric layer DE may include a single-layered material, a multi-layered material, a laminated material, an intermixing material, or a combination thereof. The dielectric layer DE may have a high dielectric constant of approximately 7 or more. The dielectric layer DE may include at least one high-k material. The high-k material may refer to a material having a higher dielectric constant than silicon oxide. The high-k material may refer to a material having a higher dielectric constant than silicon nitride. The dielectric layer DE may include at least one ultrahigh-k material. The ultrahigh-k material may be made of a material having a higher dielectric constant than the high-k material. The ultrahigh-k material may have a dielectric constant of approximately 60 or more. The dielectric layer DE may include at least one ferroelectric material. The dielectric layer DE may include at least one anti-ferroelectric material. The dielectric layer DE may include at least one ferroelectric material or an anti-ferroelectric material.

The dielectric layer DE may have a hafnium oxide-based structure. For example, the dielectric layer DE may include at least one hafnium oxide layer. The dielectric layer DE may have a multi-layered structure including at least one hafnium oxide layer.

Referring to FIG. 1A, the ultrahigh-k structure ULKS may be or include a stack of a booster layer KBL and a dielectric layer DE. The booster layer KBL and the dielectric layer DE may be in direct contact to each other. The booster layer KBL may be formed under the dielectric layer DE.

The booster layer KBL may boost the dielectric constant of the dielectric layer DE. The booster layer KBL may be used as a dielectric constant booster (k-booster). The booster layer KBL may give the dielectric layer DE an increased dielectric constant. For example, the dielectric layer DE alone may have a dielectric constant of approximately 60, but when the dielectric layer DE and the booster layer KBL are in contact with each other, the dielectric layer DE may have a dielectric constant which is greater than 60. The booster layer KBL may serve as a polarization enhancement layer that enhances polarization of the dielectric layer DE, and the dielectric constant of the dielectric layer DE may be increased by the enhanced polarization.

The booster layer KBL may be or include a metal. The metal of the booster layer KBL may be or include a divalent metal, a trivalent metal, or a pentavalent metal. The divalent metal and the trivalent metal may have high electron affinity.

The booster layer KBL and the dielectric layer DE may be made of different materials. The dielectric layer DE may be or include a first metal, and the booster layer KBL may be or include a second metal. The first metal and the second metal may be different. The first metal may include at least one of hafnium, zirconium, aluminum, and titanium. The second metal may include at least one of niobium, tantalum, and vanadium. In an embodiment, the dielectric layer DE may include an oxide of the first metal while the booster layer KBL may include an oxide of the second metal. For example, the dielectric layer DE may include hafnium oxide, zirconium oxide, aluminum oxide, titanium oxide, or a combination thereof, while the booster layer KBL may include niobium oxide, tantalum oxide, or vanadium oxide. According to another embodiment of the present invention, the dielectric layer DE may be an oxide of the first metal while the booster layer KBL may be an oxynitride of the second metal. For example, the dielectric layer DE may include hafnium oxide, zirconium oxide, aluminum oxide, titanium oxide, or a combination thereof, while the booster layer KBL may include niobium oxynitride, tantalum oxynitride, or vanadium oxynitride. According to an embodiment of the present invention, the dielectric layer DE may include hafnium oxide, and the booster layer KBL may include niobium oxide or niobium oxynitride.

As described above, the booster layer KBL may be or include a second metal and oxygen. Also, the booster layer KBL may be or include a second metal, oxygen, and nitrogen. In order to boost the dielectric constant of the dielectric layer DE, the oxygen content and the nitrogen content of the booster layer KBL may be adjusted. For example, when the booster layer KBL includes an oxide of the second metal, the oxygen content may be adjusted within a range of approximately 1 to 50 at %. When the booster layer KBL includes an oxynitride of the second metal, the oxygen content may be greater than the nitrogen content, and the total content of oxygen and nitrogen may range from approximately 60 to 70 at %. It is advantageous to boost the dielectric constant of the dielectric layer DE by adjusting the oxygen content of the booster layer KBL. The booster layer KBL may include a metal oxynitride having an oxygen content higher than a nitrogen content.

The booster layer KBL may be thinner than the dielectric layer DE. The booster layer KBL may have a thickness of approximately 0.1 Å to 5 Å.

According to an embodiment of the present invention, the dielectric layer DE may be or include a high-k material having a tetragonal crystal structure. Hereinafter, a high-k material having a tetragonal crystal structure may also be referred to as a tetragonal high-k material. A tetragonal high-k material may have a higher dielectric constant than a non-tetragonal high-k material. The non-tetragonal high-k material may have an amorphous structure or a crystal structure, such as a monoclinic structure.

The tetragonal high-k material may be or include tetragonal hafnium oxide. The tetragonal hafnium oxide may have a dielectric constant of approximately 60. The dielectric layer DE may be or include tetragonal hafnium oxide having an increased dielectric constant that is greater than 60 because of the presence of the booster layer KBL. For example, when the tetragonal hafnium oxide has a dielectric constant of approximately 60 without the booster layer KBL, the dielectric constant of the tetragonal hafnium oxide in the structure where it is in direct contact with the booster layer KBL may be increased from approximately 70 to approximately 150.

As described above, as the dielectric layer DE has a tetragonal crystal structure, the dielectric layer DE may have a high dielectric constant and the dielectric constant may be further boosted by the booster layer KBL.

Figure 1B:
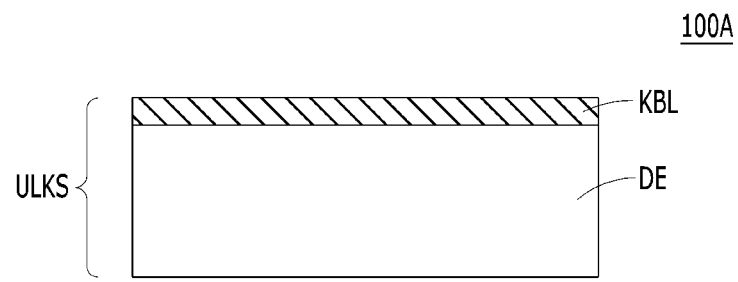
Figure 1C:
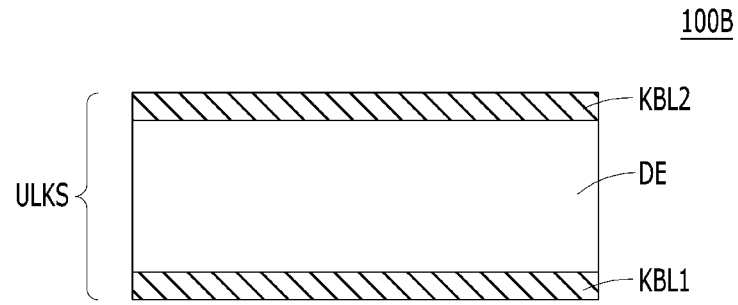

FIGS. 1B and 1C are cross-sectional views illustrating a semiconductor device according to a modified example of FIG. 1A. FIGS. 1A and 1B are cross-sectional views illustrating an example of a single booster layer, and FIG. 1C is a cross-sectional view illustrating an example of a double booster layer.

Referring to FIG. 1B, a semiconductor device 100A may include an ultrahigh-k structure ULKS. The ultrahigh-k structure ULKS may be or include a stack of the dielectric layer DE and the booster layer KBL. The booster layer KBL may be formed over the dielectric layer DE. As the booster layer KBL is formed over the dielectric layer DE, the dielectric constant of the dielectric layer DE may be boosted.

Referring to FIG. 1C, a semiconductor device 100B may include an ultrahigh-k structure ULKS. The ultrahigh-k structure ULKS may be or include a stack of a first booster layer KBL1, a dielectric layer DE, a second booster layer KBL2. The first booster layer KBL1 may be formed under the dielectric layer DE, and the second booster layer KBL2 may be formed over the dielectric layer DE. The first booster layer KBL1 and the second booster layer KBL2 may be formed of the same material as that of the booster layer KBL of FIGS. 1A and 1B.

The first booster layer KBL1 and the second booster layer KBL2 may be formed of the same material or different materials. For example, both of the first booster layer KBL1 and the second booster layer KBL2 may be niobium oxide. The first booster layer KBL1 may be niobium oxide, and the second booster layer KBL2 may include niobium oxynitride, tantalum oxide, tantalum oxynitride, vanadium oxide, or vanadium oxynitride. The first booster layer KBL1 may include niobium oxynitride, and the second booster layer KBL2 may include niobium oxide, tantalum oxide, tantalum oxynitride, vanadium oxide, or vanadium oxynitride. The first booster layer KBL1 may include niobium oxide, tantalum oxide, tantalum oxynitride, vanadium oxide, or vanadium oxynitride, and the second booster layer KBL2 may be niobium oxynitride. The first booster layer KBL1 may include niobium oxynitride, tantalum oxide, tantalum oxynitride, vanadium oxide, or vanadium oxynitride, and the second booster layer KBL2 may be niobium oxide.

According to another embodiment of the present invention, the oxygen contents of the first booster layer KBL1 and the second booster layer KBL2 may be the same or different. The first booster layer KBL1 may have a larger oxygen content than the second booster layer KBL2. The first booster layer KBL1 may have a smaller oxygen content than the second booster layer KBL2.

As described above, the dielectric constant of the dielectric layer DE may be boosted by the first booster layer KBL1 and the second booster layer KBL2. The dielectric constant boosting effect by the double booster layers KBL1 and KBL2 may be greater than that of the single booster layer KBL. For example, when the dielectric layer DE includes tetragonal hafnium oxide, the dielectric constant of the tetragonal hafnium oxide in the structure with the double booster layer may be increased from approximately 70 to approximately 150.

Figure 2A:
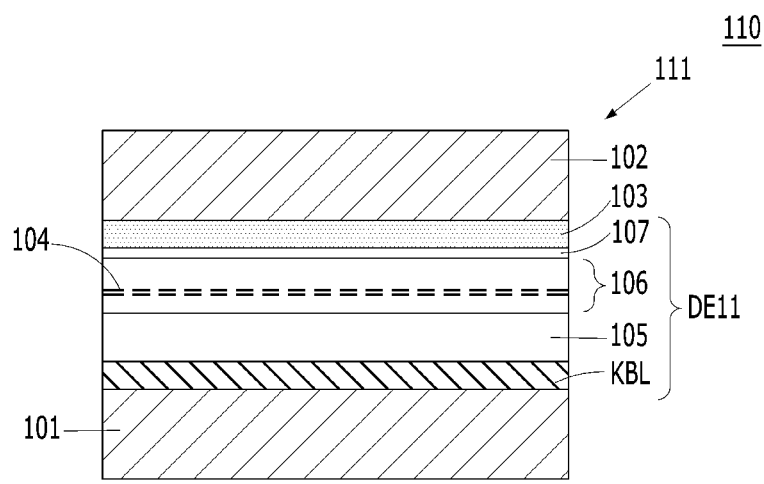
FIG. 2A is a cross-sectional view illustrating a semiconductor device in accordance with another embodiment of the present invention.

FIG. 2A is a cross-sectional view illustrating a semiconductor device in accordance with another embodiment of the present invention.

Referring to FIG. 2A, a semiconductor device 110 may be or include a capacitor 111. The capacitor 111 may include a first electrode 101, a multi-layered stack DE11, and a second electrode 102. The capacitor 111 may further include a thermal source layer 103 disposed between the multi-layered stack DE11 and the second electrode 102. The multi-layered stack DE11 may include a booster layer KBL. The booster layer KBL may be disposed on the bottom surface of the multi-layered stack DE11. The booster layer KBL may be in direct contact with the first electrode 101. The multi-layered stack DE11 may correspond to the ultrahigh-k structure ULKS of FIG. 1A.

The first electrode 101 may be or include a metal-containing material. The first electrode 101 may be or include a metal, a metal nitride, a metal carbide, a conductive metal nitride, a conductive metal oxide, or a combination thereof. The first electrode 101 may be or include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$), niobium nitride (NbN), molybdenum nitride (MoN), or a combination thereof. According to another embodiment of the present invention, the first electrode 101 may be or include a silicon-containing material. The first electrode 101 may be or include silicon, silicon germanium, or a combination thereof. According to another embodiment of the present invention, the first electrode 101 may be or include a stack of a metal-containing material and a silicon-containing material. The first electrode 101 may be referred to as a 'bottom electrode or a storage node'.

The second electrode 102 may be or include a silicon-containing material, a germanium-containing material, a metal-containing material, or a combination thereof. The second electrode 102 may be or include a metal, a metal nitride, a metal carbide, a conductive metal nitride, a conductive metal oxide, or a combination thereof. The second electrode 102 may be or include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), niobium nitride (NbN), molybdenum nitride (MoN), iridium oxide ($IrO_2$), silicon (Si), germanium (Ge), silicon germanium (SiGe) or combinations thereof. The second electrode 102 may be or include a 'Si/SiGe stack' in which silicon germanium is stacked over silicon. The second electrode 102 may be or include a 'Ge/SiGe' stack in which silicon germanium is stacked over germanium. The second electrode 102 may be formed by stacking silicon germanium over a metal nitride. For example, the second electrode 102 may be formed by stacking silicon germanium (SiGe) over titanium nitride (TiN). According to another embodiment of the present invention, the second electrode 102 may be formed by stacking titanium nitride (TiN), silicon germanium (SiGe), and tungsten (W) in the mentioned order. According to another embodiment of the present invention, the second electrode 102 may be formed by stacking titanium nitride (TiN), silicon germanium (SiGe), and tungsten nitride (WN) in the mentioned order.

The multi-layered stack DE11 may be or include a stack of a booster layer KBL, an ultrahigh-k layer 105, a seed layer 106, and a leakage barrier layer 107 in the recited order. At least one of the seed layer 106 and the ultrahigh-k layer 105 may be made of a material having a tetragonal crystal structure. In an embodiment, each of the seed layer 106 and the ultrahigh-k layer 105 may be made of a material having a tetragonal crystal structure.

The seed layer 106 may serve as a seed to promote crystallization of the ultrahigh-k layer 105.

The booster layer KBL may boost the dielectric constant of the ultrahigh-k layer 105. The booster layer KBL may be used as a dielectric constant booster. The ultrahigh-k layer 105 may have an increased dielectric constant due to the booster layer KBL. For example, the ultrahigh-k layer 105 may have a dielectric constant of approximately 150 due to the booster layer KBL.

The booster layer KBL and the ultrahigh-k layer 105 may be different materials. The ultrahigh-k layer 105 may be or include a first metal, and the booster layer KBL may be or include a second metal. The first metal and the second metal may be different. The ultrahigh-k layer 105 may be an oxide of the first metal, and the booster layer KBL may be an oxide of the second metal. According to another embodiment of the present invention, the ultrahigh-k layer 105 may be an oxide of the first metal, and the booster layer KBL may be an oxynitride of the second metal. The ultrahigh-k layer 105 may include hafnium oxide, zirconium oxide, aluminum oxide, titanium oxide, or a combination thereof. The booster layer KBL may include niobium oxide, niobium oxynitride, tantalum oxide, tantalum oxynitride, vanadium oxide, or vanadium oxynitride. In an embodiment of the present invention, the ultrahigh-k layer 105 may be hafnium oxide, and the booster layer KBL may be niobium oxide or niobium oxynitride. According to an embodiment of the present invention, the seed layer 106 may be or include tetragonal zirconium oxide, and the ultrahigh-k layer 105 may include ultrahigh-k hafnium oxide. The ultrahigh-k hafnium oxide may be or include tetragonal hafnium oxide. The ultrahigh-k hafnium oxide may have an increased dielectric constant of approximately 150 or more in this structure due at least partially to the booster layer KBL.

As described above, the booster layer KBL may be or include a second metal and oxygen. The booster layer KBL may be or include a second metal, oxygen, and nitrogen. In order to boost the dielectric constant of the ultrahigh-k layer 105, the oxygen content and the nitrogen content of the booster layer KBL1 may be adjusted. For example, when the booster layer KBL includes an oxide of the second metal, the oxygen content may be adjusted within a range of approximately 1 to 50 at %. When the booster layer KBL includes an oxynitride of the second metal, the nitrogen content may be lower than the oxygen content. The dielectric constant of the ultrahigh-k layer 105 may be boosted by adjusting the oxygen content of the booster layer KBL.

The booster layer KBL may be thinner than the ultrahigh-k layer 105. The booster layer KBL may have a thickness of approximately 0.1 Å to 5 Å.

The ultrahigh-k layer 105 may include a material that is crystallized into a tetragonal crystal structure by a low-temperature thermal source. Herein, the low-temperature thermal source may be provided in a temperature range of approximately 300 to 500° C. The low-temperature thermal source may be provided while the thermal source layer 103 is formed. The low-temperature thermal source does not include a separate high-temperature crystallization annealing process.

The ultrahigh-k layer 105 may be referred to as a 'hafnium oxide-based dielectric layer' or simply as a 'hafnium oxide layer 105'. In an embodiment, each of the hafnium oxide layer 105 and the seed layer 106 may be made of a material having a tetragonal crystal structure. The leakage barrier layer 107 may reduce the leakage current of the multi-layered stack DE11.

The thermal source layer 103 may provide a low-temperature thermal source for crystallization of the hafnium oxide layer 105. The thermal source layer 103 may serve as a thermal source for crystallizing the hafnium oxide layer 105 into a tetragonal crystal structure. The thermal source layer 103 may provide a low-temperature thermal source of approximately 300 to 500° C. The thermal source layer 103 may have a strong tensile stress. For example, it may have a tensile stress of a size of approximately 0.5 GPa to 2.0 Gpa. The strong tensile stress may promote tetragonal crystallization of the hafnium oxide layer 105.

The thermal source layer 103 may be a conductive material. The thermal source layer 103 may be in direct contact with the second electrode 102. The thermal source layer 103 may be a metal-based material. The thermal source layer 103 may be or include a metal, a metal nitride, or a metal silicon nitride. The thermal source layer 103 may be or include titanium nitride (TiN), titanium silicon nitride (TiSiN), tungsten (W), tungsten nitride (WN), molybdenum nitride (MoN), or niobium nitride (NbN).

According to the present invention a high-temperature crystallization annealing process which is typically employed in conventional art is not needed for obtaining tetragonal crystallization of the hafnium oxide layer 105. Instead, by using the seed layer 106, the hafnium oxide layer 105 may be crystallized into a tetragonal crystal structure even at a low-temperature when the thermal source layer 103 is deposited. For example, the thermal source layer 103 may be formed by Atomic Layer Deposition (ALD), and it may be deposited at a temperature of approximately 300 to 500° C. The seed layer 106 may also be crystallized into a tetragonal crystal structure during the deposition of the thermal source layer 103. As a result, the hafnium oxide layer 105 and the seed layer 106 may be crystallized into a tetragonal crystal structure by the low-temperature thermal of the thermal source layer 103.

The thermal source layer 103 may correspond to a portion of the second electrode 102. For example, when titanium nitride (TiN) and silicon germanium (SiGe) are stacked as the second electrode 102, titanium nitride (TiN) may serve as the thermal source layer 103.

The hafnium oxide layer 105 may directly contact the booster layer KBL and the seed layer 106. The hafnium oxide layer 105 may be formed over the booster layer KBL, and the seed layer 106 may be formed over the hafnium oxide layer 105. The booster layer KBL and the hafnium oxide layer 105 may directly contact each other. The seed layer 106 may be formed between the hafnium oxide layer 105 and the leakage barrier layer 107. The booster layer KBL, the hafnium oxide layer 105, the seed layer 106, and the leakage barrier layer 107 may be sequentially deposited by Atomic Layer Deposition (ALD).

The seed layer 106 may serve as a crystallization seed that promotes tetragonal crystallization of the hafnium oxide layer 105 while the thermal source layer 103 is formed. The seed layer 106 may help the hafnium oxide layer 105 crystallize into a tetragonal crystal structure. Since the seed layer 106 has a high dielectric constant of approximately 40 or more, the capacitance of the capacitor 111 may be increased, and since the hafnium oxide layer 105 has a high dielectric constant of approximately 150, the capacitance of the capacitor 111 may be further increased. The seed layer 106 may also serve to suppress leakage current of the dielectric layer stack DE11.

The seed layer 106 may be or include a high-k material having a tetragonal crystal structure. The seed layer 106 may be or include a zirconium oxide-based material. The seed layer 106 may be or include tetragonal zirconium oxide. According to another embodiment of the present invention, the seed layer 106 may be or include a material having a tetragonal crystal structure in addition to the tetragonal zirconium oxide. For example, the seed layer 106 may be niobium oxide, germanium oxide, tin oxide, molybdenum oxide, tantalum oxide, or titanium oxide.

The hafnium oxide layer 105 may have a higher dielectric constant than the seed layer 106. For example, the seed layer 106 may have a dielectric constant of approximately 40, and the hafnium oxide layer 105 may have a dielectric constant of approximately 150. As the seed layer 106, tetragonal zirconium oxide may have a dielectric constant of approximately 40. The capacitor 111 including the hafnium oxide layer 105 and the seed layer 106 may have a high capacitance. The capacitor 111 including the hafnium oxide layer 105 and the seed layer 106 may have a higher capacitance than the capacitor including only the seed layer 106. As a result, the capacitance of the capacitor 111 may be increased by applying the hafnium oxide layer 105 having a tetragonal crystal structure having a higher dielectric constant than the seed layer 106.

The hafnium oxide layer 105 may have a higher band gap than the seed layer 106. As such, the dielectric layer stack DE11 including the hafnium oxide layer 105 may be advantageous in suppressing leakage current. The hafnium oxide layer 105 may improve an effective work function (eWF) between the second electrode 102 and the multi-layered stack DE11. For example, when titanium nitride (TiN) is applied as the second electrode 102, an effective work function of approximately 4.7 eV may be obtained by the hafnium oxide layer 105. Meanwhile, tetragonal zirconium oxide ($ZrO_2$) may obtain an effective work function of approximately 4.5 eV. Therefore, since a higher effective work function than the tetragonal zirconium oxide may be obtained due to the hafnium oxide layer 105, the leakage current of the multi-layered stack DE11 may be suppressed.

The hafnium oxide layer 105 may be thinner than the seed layer 106. The hafnium oxide layer 105 may have a high dielectric constant of approximately 60 or more even though it has a thin thickness.

The hafnium oxide layer 105 and the seed layer 106 may be in direct contact, which is advantageous in crystallizing the hafnium oxide layer 105 into a tetragonal crystal structure.

The multi-layered stack DE11 may include a multi-layered structure in which the booster layer KBL and the hafnium oxide layer 105 are in a direct contact. The multi-layered stack DE11 may include at least one directly contacting interface The multi-layered stack DE11 may include a directly contacting interface in which the booster layer KBL1 and the hafnium oxide layer 105 are in direct contact. When the booster layer KBL includes niobium oxide, the stack in which the booster layer KBL1 and the hafnium oxide layer 105 are sequentially stacked may be referred to as an 'N—H stack'. The directly contacting interface may be disposed in the N—H stack. The multi-layered stack DE11 may include at least one directly contacting interface. For example, the multi-layered stack DE11 may include at least one N—H stack.

The hafnium oxide layer 105 may have a pure tetragonal crystal structure. The crystal structure of the hafnium oxide layer 105 may is not be a mixture of an amorphous structure, a monoclinic crystal structure, and a tetragonal crystal structure, but may be only a tetragonal crystal structure. The hafnium oxide layer 105 having a pure tetragonal crystal structure may have a higher dielectric constant than the hafnium oxide layer having mixed crystal structures. The hafnium oxide layer 105 having a pure tetragonal crystal structure may have a higher dielectric constant than the hafnium oxide layer having a monoclinic crystal structure. The dielectric constant of the hafnium oxide layer having a monoclinic crystal structure may be approximately 40, and the dielectric constant of the hafnium oxide layer having a pure tetragonal crystal structure may be approximately 60.

The hafnium oxide layer 105 may further include a dopant that may promote crystallization. Examples of suitable crystallization-promoting dopants may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg), nitrogen (N), or combinations thereof. The hafnium oxide layer 105 may be made of a material having a tetragonal crystal structure doped with a dopant. For example, the hafnium oxide layer 105 may be a lanthanum (La) doped-tetragonal hafnium oxide ($HfO_2$) layer. The crystallization-promoting dopant may not only promote crystallization of the hafnium oxide layer 105 but may also increase the dielectric constant. The crystallization-promoting dopant may further activate polarization characteristics of the hafnium oxide layer 105.

As described above, the hafnium oxide layer 105 may provide an extremely high dielectric constant, a low leakage current, and a high effective work function.

The dielectric layer stack DE11 may further include a doped layer 104. The doped layer 104 may further promote the crystallization of the hafnium oxide layer 105 and further suppress the leakage current of the dielectric layer stack DE11.

The doped layer 104 may be embedded very thinly in the seed layer 106. The doped layer 104 may not separate crystal grains of the seed layer 106 from each other. In other words, even though the doped layer 104 is embedded, the tetragonal crystal structure of the seed layer 106 may not be separated. The doped layer 104 may be formed by being doped in the seed layer 106.

When the seed layer 106 includes tetragonal zirconium oxide, the doped layer 104 may be or include tetragonal zirconium oxide doped with a dopant. Examples of dopants for the doped layer 104 may, for example, include aluminum (Al) or beryllium (Be). For example, the doped layer 104 may include aluminum-doped tetragonal zirconium oxide or beryllium-doped tetragonal zirconium oxide.

The doped layer 104 may adjust the thicknesses of the hafnium oxide layer 105 and the seed layer 106. Since the doped layer 104 is included, the hafnium oxide layer 105 having a predetermined thickness or more may be formed. The doped layer 104 may adjust the thickness of the hafnium oxide layer 105 to be sufficiently crystallized. For example, the thickness of the hafnium oxide layer 105 that is crystallized may be adjusted to approximately 20 to 80 Å. The seed layer 106 may be thicker than the hafnium oxide layer 105. The zirconium oxide that is used as the seed layer 106 may easily obtain a tetragonal crystal structure due to the high thickness during the deposition. The seed layer 106 may be made of a material having a tetragonal crystal structure in the thickness during the deposition, and the tetragonal crystal structure may be further promoted by the subsequent low-temperature thermal process. The hafnium oxide layer 105 may be formed to be sufficiently thin so even though it has a non-tetragonal crystal structure during the deposition, it may be crystallized into a tetragonal crystal structure by the seed layer 106 and the subsequent low-temperature thermal process.

The doped layer 104 may have a higher energy band gap than each of the seed layer 106 and the hafnium oxide layer 105. The hafnium oxide layer 105 may have an energy band gap (hereinafter abbreviated as a "bandgap") of approximately 6 eV, and the seed layer 106 may have a band gap of approximately 5.8 eV. The doped layer 104 may have a band gap of approximately 8.8 eV to 10.6 eV.

As such, the crystallization of the hafnium oxide layer 105 may be further promoted by the doped layer 104, and the high band gap of the doped layer 104 may suppress the leakage current of the capacitor 111.

The leakage barrier layer 107 may include a high band gap material. The leakage barrier layer 107 may include a material having a higher band gap than the seed layer 106 and the hafnium oxide layer 105. The leakage barrier layer 107, the seed layer 106, and the hafnium oxide layer 105 may be different materials. The leakage barrier layer 107 may be or include a high-k material, but may have a lower dielectric constant than the hafnium oxide layer 105 and the seed layer 106. The leakage barrier layer 107 may have a higher dielectric constant than silicon oxide and silicon nitride. For example, the leakage barrier layer 107 may be or include aluminum oxide or beryllium oxide. Beryllium oxide may be amorphous. The beryllium oxide may be of a wurtzite crystal structure or a rocksalt structure. The leakage barrier layer 107 may be formed by Atomic Layer Deposition (ALD). The leakage barrier layer 107 may be extremely thinner than the seed layer 106 and the hafnium oxide layer 105. The leakage barrier layer 107 and the doped layer 104 may have the same thickness. Since the leakage barrier layer 107 has a relatively lower dielectric constant than the seed layer 106 and the hafnium oxide layer 105, the leakage barrier layer 107 and the doped layer 104 may be formed to be extremely thin in order to increase the capacitance of the capacitor 111. The leakage barrier layer 107 may be thicker than the doped layer 104.

According to another embodiment of the present invention, the leakage barrier layer 107 may be formed of the same material as the doped layer 104. For example, the leakage barrier layer 107 may include aluminum-doped zirconium oxide or beryllium-doped zirconium oxide. In this case, the leakage barrier layer 107 may be made of a material having a tetragonal crystal structure.

Figure 2B:
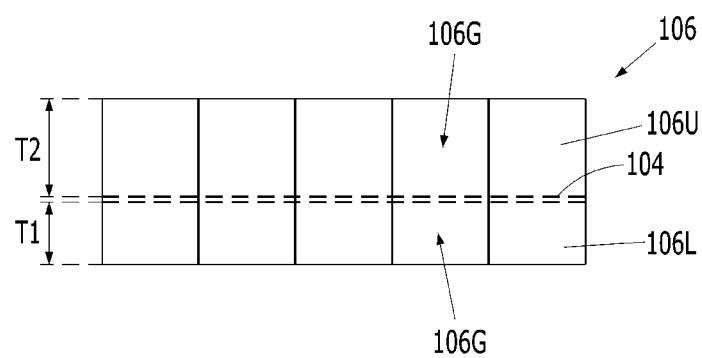
FIG. 2B illustrates a seed layer in detail.

FIG. 2B is a detail view of the seed layer 106.

Referring to FIG. 2B, the seed layer 106 may have the doped layer 104. The doped layer 104 embedded in the seed layer 106. The seed layer 106 may be include crystal grains 106G vertically arranged along the thickness direction from a top surface of the hafnium oxide layer 105. The doped layer 104 embedded in the seed layer 106 to provide a vertical continuity of the crystal grains 106G. The seed layer 106 may have the vertical continuity of the crystal grains 106G. The seed layer 106 with the doped layer 104 may be defined as an undoped lower seed layer 106L, the doped layer 104, and an undoped upper seed layer 106U. Each of the undoped lower seed layer 106L, the doped layer 104, and the undoped upper seed layer 106U may be made of a material having a tetragonal crystal structure. The crystal grains 106G of the undoped lower seed layer 106L, the doped layer 104, and the undoped upper seed layer 106U may be continuous without being separated. The doped layer 104 may not separate the crystal grains 106G of the undoped lower seed layer 106L and the crystal grains 106G of the undoped upper seed layer 106U from each other. The undoped upper seed layer 106U may be thicker than the undoped lower seed layer 106L (T2>T1). The doped layer 104 may be extremely thinner than the undoped upper seed layer 106U and the undoped lower seed layer 106L. The doped layer 104 may be disposed between the undoped lower seed layer 106L and the undoped upper seed layer 106U, while having an extremely thin thickness that does not separate the crystal grains of the undoped lower seed layer 106L and the crystal grains of the undoped upper seed layer 106U from each other. The doped layer 104 has a thickness for a vertical continuity from the crystal grains 106G of the undoped lower seed layer 106L to the crystal grains 106G of the undoped upper seed layer 106U.

For example, each of the undoped lower seed layer 106L and the undoped upper seed layer 106U may be an undoped tetragonal zirconium oxide. The doped layer 104 may be a dopant-doped tetragonal zirconium oxide. Also, as an example, the doped layer 104 may include aluminum or beryllium as a dopant. In an embodiment, the crystal grains 106G may be crystal grains of tetragonal zirconium oxide.

As described above, although the doped layer 104 includes a dopant, the doped layer 104 may not be an oxide layer of the dopant. For example, the doped layer 104 may not be an aluminum oxide region but may be an aluminum-doped tetragonal zirconium oxide region. Also, the doped layer 104 may not be a beryllium oxide region but may be a beryllium-doped tetragonal zirconium oxide region.

The undoped lower seed layer 106L, the doped layer 104, and the undoped upper seed layer 106U may be referred to as a first zirconium oxide region, an aluminum-doped zirconium oxide region, and a second zirconium oxide region, respectively. The seed layer 106 having the doped layer 104 may include a 'Z-AZ-Z stack' in which the first zirconium oxide region, the aluminum-doped zirconium oxide region, and the second zirconium oxide region are stacked in the mentioned order.

According to another embodiment of the present invention, the doped layer 104 may be or include an aluminum oxide region having an extremely thin thickness that is discontinuous. Herein, the discontinuous extremely thin thickness may be a thickness that does not separate the crystal grains of the undoped lower seed layer 106L and the crystal grains of the undoped upper seed layer 106U.

Figure 2C:
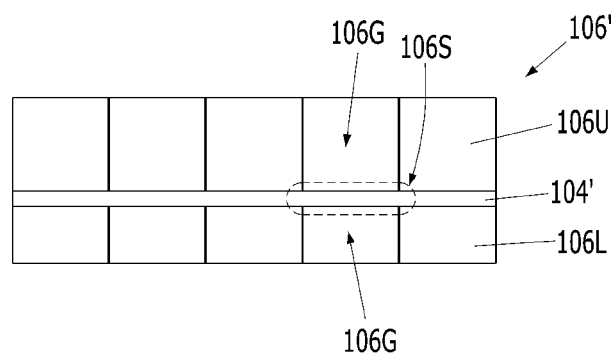
FIG. 2C illustrates a seed layer according to a comparative example.

FIG. 2C illustrates a seed layer 106' according to a comparative example.

Referring to FIG. 2C, aluminum oxide layers ($Al_2O_3$) 104' may be formed between the undoped lower seed layer 106L and the undoped upper seed layer 106U. The aluminum oxide layer ($Al_2O_3$) 104' may have a continuous thickness, and thus the aluminum oxide layer 104' may separate the crystal grains 106G of the undoped lower seed layer 106L and the crystal grains 106G of the undoped upper seed layer 106U (see reference numeral 106S). The crystal grains 106G of the seed layer 106' are vertically separated by the aluminum oxide layer 104'. The aluminum oxide layers (Al$_2$O$_3$) 104' may be thicker than the doped layer 104 and may be continuous layers. The seed layer 106' may be referred to as a 'Z-A-Z stack'.

As described above, when the crystal grains 106G of the seed layer 106' are separated by the aluminum oxide layer 104', the dielectric constant of the seed layer 106' may be decreased. When the dielectric constant of the seed layer 106' decreases, the equivalent oxide layer thickness T$_{ox}$ may not be decreased.

As described above, the hafnium oxide layer 105 may be crystallized into a tetragonal crystal structure by the thermal source layer 103 and the seed layer 106 with the doped layer 104. Also, the hafnium oxide layer 105 may be crystallized into a tetragonal crystal structure by the seed layer 106 even at a low-temperature. Also, the equivalent oxide layer thickness T$_{ox}$ may be lowered while the dielectric constant of the dielectric layer stack DE11 is increased due to the hafnium oxide layer 105 and the seed layer 106 having the doped layer 104. The doped layer 104 and the leakage barrier layer 107 may suppress the leakage current of the multi-layered stack DE11. Also, the booster layer KBL1 may further boost the increased dielectric constant of the hafnium oxide layer 105.

As described above, the seed layer 106 may promote the crystallization of the hafnium oxide layer 105 into a tetragonal crystal structure, and the booster layer KBL may enhance the polarization of the hafnium oxide layer 105. As a result, the hafnium oxide layer 105 may have a dielectric constant increased by the promotion of the tetragonal crystal structure, and the increased dielectric constant may be boosted by the polarization enhancement.

When the multi-layered stack DE11 includes a first stack (which is a stack of the hafnium oxide layer 105 and the seed layer 106) that includes the seed layer 106 without the booster layer KBL, the hafnium oxide layer 105 may have a dielectric constant of approximately 60 because it has a tetragonal crystal structure. When the multi-layered stack DE11 includes a second stack (which is a stack of the booster layer KBL, the hafnium oxide layer 105, and the seed layer 106) that includes all the booster layer KBL and the seed layer 106, the hafnium oxide layer 105 may have a dielectric constant of approximately 150.

The hafnium oxide layer 105 may have a dielectric constant that is adjusted by a dipole changed by an electric field applied from the outside. The booster layer KBL may boost the dielectric constant of the hafnium oxide layer 105.

Figure 3:
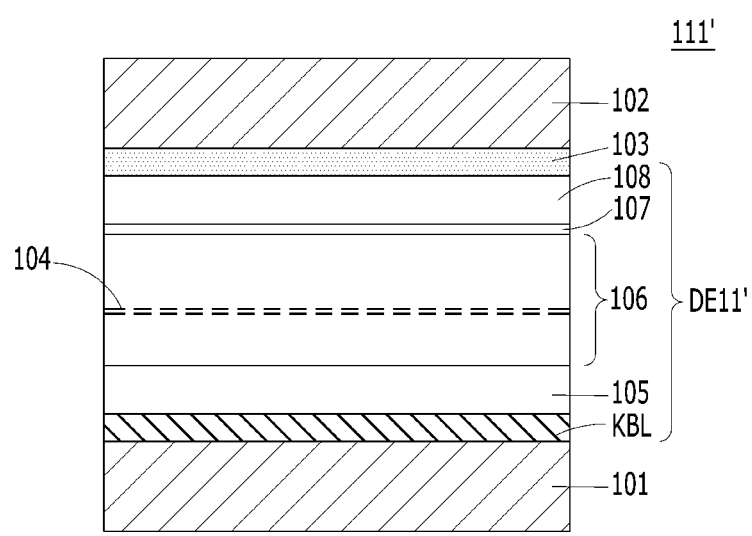
FIG. 3 is a cross-sectional view illustrating a semiconductor device according to a modified example of FIG. 2A.

FIG. 3 is a cross-sectional view illustrating a semiconductor device according to a modified example of FIG. 2A.

Referring to FIG. 3, a capacitor 111' may be similar to the capacitor 111 of FIG. 2A. The capacitor 111' may include a first electrode 101, a second electrode 102, and a multi-layered stack DE11' between the first electrode 101 and the second electrode 102. The capacitor 111' may further include a thermal source layer 103 disposed between the multi-layered stack DE11' and the second electrode 102.

The multi-layered stack DE11' may be or include a stack of a booster layer KBL, a hafnium oxide layer 105, a seed layer 106 with a doped layer 104, a leakage barrier layer 107, and an interface control layer 108. Each of the seed layer 106 and the hafnium oxide layer 105 may be made of a material having a tetragonal crystal structure. The seed layer 106 may be or include tetragonal zirconium oxide. The hafnium oxide layer 105 may include ultrahigh-k hafnium oxide, but the ultrahigh-k hafnium oxide may be made of a material having a tetragonal crystal structure. The seed layer 106 may serve as a seed for promoting crystallization of the hafnium oxide layer 105, while the booster layer KBL may boost the dielectric constant of the hafnium oxide layer 105.

The interface control layer 108 may protect the hafnium oxide layer 105 and the seed layer 106 when the second electrode 102 and the thermal source layer 103 are formed. In addition, the interface control layer 108 may reduce the leakage current of the multi-layered stack DE11'.

The interface control layer 108 may be made of a material that is reduced before the hafnium oxide layer 105 and the seed layer 106 when the thermal source layer 103 and the second electrode 102 are deposited. The interface control layer 108 may serve as a leakage current barrier having a large effective work function (eWF) and a large conduction band offset (CBO). Also, the interface control layer 108 may not increase the equivalent oxide layer thickness T$_{ox}$ of the multi-layered stack DE11'.

The interface control layer 108 may be made of a material having a high electronegativity. The interface control layer 108 may have a higher Pauling electronegativity than the hafnium oxide layer 105. Materials for the interface control layer 108 may include a material having a higher Pauling electronegativity (which is, hereinafter, simply referred to as 'electronegativity') than each of the hafnium oxide layer 105 and the seed layer 106. When the electronegativity is high, the material is hardly oxidized but readily reduced. Accordingly, the interface control layer 108 may be deprived of oxygen instead of the hafnium oxide layer 105 and the seed layer 106. As a result, the interface control layer 108 may prevent oxygen loss of the hafnium oxide layer 105 and the seed layer 106.

The interface control layer 108 may include atoms having high electronegativity, for example, metal atoms, silicon atoms, or germanium atoms. The interface control layer 108 may be or include titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof. The interface control layer 108 may be or include a stack of molybdenum and molybdenum nitride (Mo/MoN) or a stack of tungsten and tungsten nitride (W/WN). The interface control layer 108 may include conductive material. The conductive material for the interface control layer 108 may include atoms having high electronegativity, for example, metal atoms, silicon atoms, or germanium atoms. The interface control layer 108 serve as a portion of the second electrode 102.

The interface control layer 108 may be or include titanium oxide, tantalum oxide, niobium oxide, aluminum oxide, silicon oxide (SiO$_2$), tin oxide, germanium oxide, molybdenum dioxide, molybdenum trioxide, iridium oxide, ruthenium oxide, nickel oxide, or a combination thereof.

The leakage barrier layer 107 and the interface control layer 108 may be disposed at a higher level than the hafnium oxide layer 105 and the seed layer 106.

FIGS. 4A to 13B are cross-sectional views illustrating various modified examples of the semiconductor device. Hereinafter, in the embodiments of the present invention, the semiconductor devices 112A to 120B may be capacitors. The multi-layered stack DE12 to DE39 may include at least one hafnium oxide layer, at least one booster layer, and at least one seed layer. The multi-layered stack may include at least one directly contacting interface, and the directly contacting interface may include a hafnium oxide layer and a booster layer that are in direct contact. The booster layer may be disposed under the hafnium oxide layer.

Figure 4A:
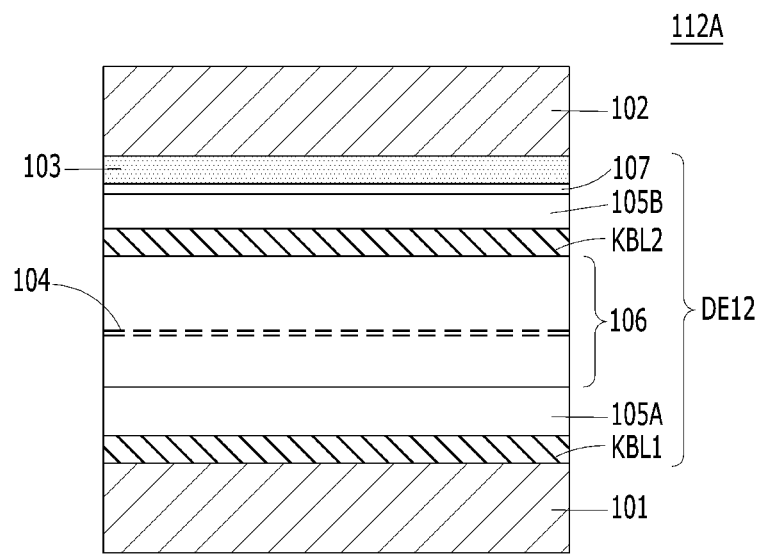
FIGS. 4A to 13B are cross-sectional views illustrating various modified examples of the semiconductor device.

Referring to FIG. 4A, a semiconductor device 112A may be similar to the capacitor 111 of FIG. 2A. The semiconductor device 112A may include a first electrode 101, a second electrode 102, and a multi-layered stack DE12 disposed between the first electrode 101 and the second electrode 102. The semiconductor device 112A may further include a thermal source layer 103 disposed between the multi-layered stack DE12 and the second electrode 102.

The multi-layered stack DE12 may include a first booster layer KBL1, a first hafnium oxide layer 105A, a seed layer 106, a second booster layer KBL2, a second hafnium oxide layer 105B, and a leakage barrier layer 107 that are stacked on top of one another in the mentioned order. The first booster layer KBL1 may be formed between the first electrode 101 and the first hafnium oxide layer 105A, and the seed layer 106 may be formed between the first hafnium oxide layer 105A and the second hafnium oxide layer 105B. The second booster layer KBL2 may be formed between the seed layer 106 and the second hafnium oxide layer 105B. The first booster layer KBL1 may be formed under the first hafnium oxide layer 105A, and the second booster layer KBL2 may be formed under the second hafnium oxide layer 105B.

The first hafnium oxide layer 105A may directly contact the first booster layer KBL1 and the seed layer 106, and the second hafnium oxide layer 105B may directly contact the second booster layer KBL2 and the leakage barrier layer 107. The first hafnium oxide layer 105A and the seed layer 106 may directly contact each other, and the seed layer 106 and the second hafnium oxide layer 105B may directly contact each other.

The first hafnium oxide layer 105A may be thicker than the second hafnium oxide layer 105B. Accordingly, the occupancy of the first hafnium oxide layer 105A in the multi-layered stack DE12 may be greater than that of the second hafnium oxide layer 105B.

The first hafnium oxide layer 105A and the second hafnium oxide layer 105B may have a pure tetragonal crystal structure. The first hafnium oxide layer 105A and the second hafnium oxide layer 105B may have the same dielectric constant. The first hafnium oxide layer 105A and the second hafnium oxide layer 105B may have a higher dielectric constant than the seed layer 106.

According to another embodiment of the present invention, the first hafnium oxide layer 105A may have a pure tetragonal crystal structure, and the second hafnium oxide layer 105B may have a mixed crystal structure including a tetragonal crystal structure and a monoclinic crystal structure. The first hafnium oxide layer 105A may have a higher dielectric constant than the second hafnium oxide layer 105B. As such, even though the second hafnium oxide layer 105B has a lower dielectric constant than the first hafnium oxide layer 105A, the second hafnium oxide layer 105B may have a higher dielectric constant than the seed layer 106. The seed layer 106 may promote tetragonal crystallization of the second hafnium oxide layer 105B. Although the tetragonal crystal structure and the monoclinic crystal structure are mixed in the second hafnium oxide layer 105B, the second hafnium oxide layer 105B may have a dominant tetragonal crystal structure by the seed layer 106. Since the first hafnium oxide layer 105A is thicker than the second hafnium oxide layer 105B, the dielectric layer stack DE12 may have a dominant tetragonal crystal structure.

The multi-layered stack DE12 may further include a doped layer 104. The doped layer 104 may be embedded very thinly into the seed layer 106. The doped layer 104 may further promote crystallization of the first and second hafnium oxide layers 105A and 105B and further suppress leakage current of the multi-layered stack DE12. The doped layer 104 may have a higher band gap than the seed layer 106, the first hafnium oxide layer 105A, and the second hafnium oxide layer 105B. The first and second hafnium oxide layers 105A and 105B may have a band gap of approximately 6 eV, and the seed layer 106 may have a band gap of approximately 5.8 eV. The doped layer 104 may have a bandgap of approximately 8.8 eV to 10.6 eV.

The multi-layered stack DE12 may include at least one directly contacting interface. For example, the multi-layered stack DE12 may include a directly contacting interface between the first booster layer KBL1 and the first hafnium oxide layer 105A, and a directly contacting interface between the second booster layer KBL2 and the second hafnium oxide layer 105B.

Also, the multi-layered stack DE12 may further include a directly contacting interface between the first hafnium oxide layer 105A and the seed layer 106 and a directly contacting interface between the seed layer 106 and the second hafnium oxide layer 105B. When the seed layer 106 includes tetragonal zirconium oxide, the stack of the first hafnium oxide layer 105A and the seed layer 106 may be referred to as an 'HZ stack', and the stack of the seed layer 106 and the second hafnium oxide layer 105B may be referred to as a 'ZH stack'.

The seed layer 106 may promote crystallization of the first and second hafnium oxide layers 105A and 105B. The dielectric constant of the first hafnium oxide layer 105A may be boosted by the first booster layer KBL1. The dielectric constant of the second hafnium oxide layer 105B may be boosted by the second booster layer KBL2.

Figure 4B:
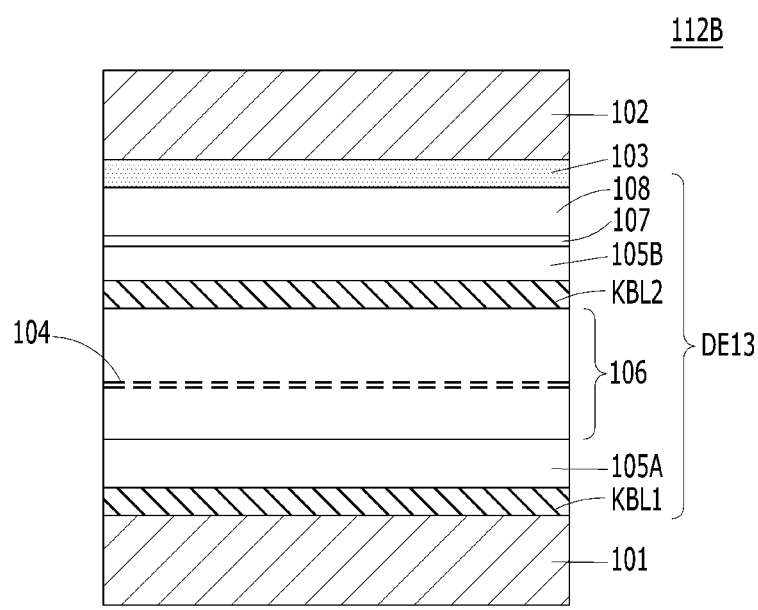

Referring to FIG. 4B, a semiconductor device 112B may be similar to the semiconductor device 112A of FIG. 4A. Thus, the same reference numerals may refer to the same elements and any further discussion with respect to the same elements will not be repeated.

The semiconductor device 112B may include a first electrode 101, a multi-layered stack DE13, a thermal source layer 103, and a second electrode 102. The multi-layered stack DE13 may include a first booster layer KBL1, a first hafnium oxide layer 105A, a seed layer 106 having the doped layer 104, a second booster layer KBL2, and a second hafnium oxide layer 105B, a leakage barrier layer 107, and an interface control layer 108 that are stacked on top of one another in the mentioned order.

The first booster layer KBL1 may be formed under the first hafnium oxide layer 105A, and the second booster layer KBL2 may be formed under the second hafnium oxide layer 105B. The first hafnium oxide layer 105A may directly contact the first booster layer KBL1, and the second hafnium oxide layer 105B may directly contact the second booster layer KBL2. The first booster layer KBL1 may be disposed between the first electrode 101 and the first hafnium oxide layer 105A. The second booster layer KBL2 may be disposed between the seed layer 106 and the second hafnium oxide layer 105B.

The seed layer 106 may promote crystallization of the first and second hafnium oxide layers 105A and 105B. The dielectric constant of the first hafnium oxide layer 105A may be boosted by the first booster layer KBL1. The dielectric constant of the second hafnium oxide layer 105B may be boosted by the second booster layer KBL2.

Figure 4C:
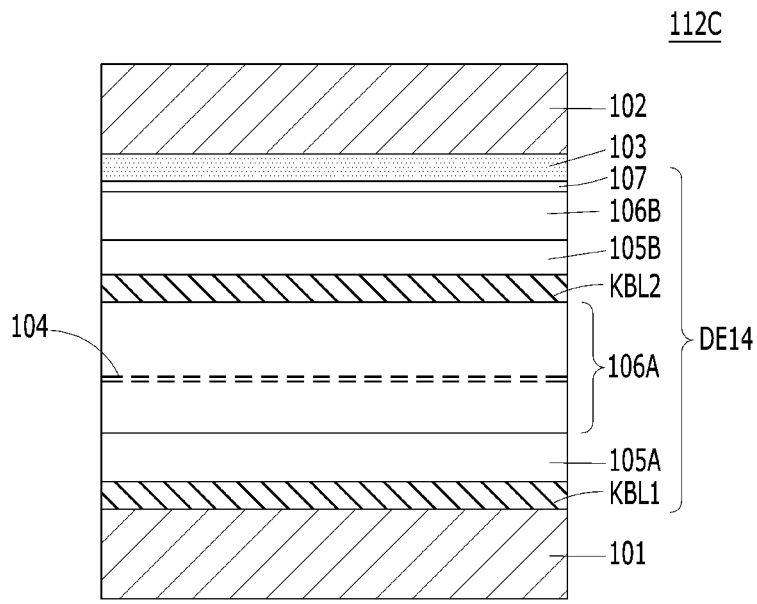

Referring to FIG. 4C, a semiconductor device 112C may be similar to the semiconductor device 112A of FIG. 4A. Thus, the same reference numerals may refer to the same elements and any further discussion with respect to the same elements will not be repeated. The semiconductor device 112C may include a first electrode 101, a multi-layered stack DE14, a thermal source layer 103, and a second electrode 102.

The multi-layered stack DE14 may include a first booster layer KBL1, a first hafnium oxide layer 105A, a first seed layer 106A having a doped layer 104, a second booster layer KBL2, a second hafnium oxide layer 105B, a second seed layer 106B, and a leakage barrier layer 107 that are stacked on top of one another in the mentioned order. The first booster layer KBL1 may be formed under the first hafnium oxide layer 105A, and the second booster layer KBL2 may be formed under the second hafnium oxide layer 105B. The first hafnium oxide layer 105A may directly contact the first booster layer KBL1, and the second hafnium oxide layer 105B may directly contact the second booster layer KBL2. The first booster layer KBL1 may be disposed between the first electrode 101 and the first hafnium oxide layer 105A. The second booster layer KBL2 may be disposed between the first seed layer 106A and the second hafnium oxide layer 105B.

The first seed layer 106A and the second seed layer 106B may be of the same material. The first seed layer 106A and the second seed layer 106B may be made of a material having a tetragonal crystal structure. The first seed layer 106A and the second seed layer 106B may be or include tetragonal zirconium oxide. The first seed layer 106A may be a tetragonal zirconium oxide having the doped layer 104, and the second seed layer 106B may include an undoped tetragonal zirconium oxide. Herein, the doped layer 104 may not exist in the undoped tetragonal zirconium oxide. The first seed layer 106A may be thicker than the second seed layer 106B, and thus the occupancy of the first seed layer 106A in the dielectric layer stack DE14 may be greater.

As described above, the doped layer 104 may be embedded in the first seed layer 106A, while no doped layer is formed in the second seed layer 106B. The first seed layer 105A and the second seed layer 106B may further promote the crystallization of the second hafnium oxide layer 105B.

According to another embodiment of the present invention, the leakage barrier layer 107 may be embedded in the second seed layer 106B.

The crystallization of the first and second hafnium oxide layers 105A and 105B may be promoted by the first seed layer 106A and the second seed layer 106B. The dielectric constant of the first hafnium oxide layer 105A may be boosted by the first booster layer KBL1. The dielectric constant of the second hafnium oxide layer 105B may be boosted by the second booster layer KBL2.

Figure 4D:
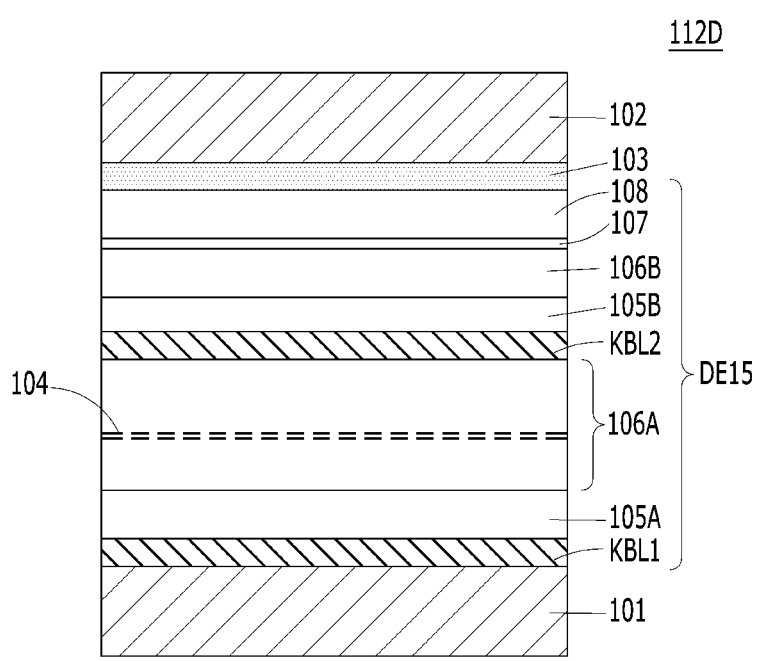

Referring to FIG. 4D, a semiconductor device 112D may be similar to the semiconductor device 112C of FIG. 4C. Thus, the same reference numerals may refer to the same elements and any further discussion with respect to the same elements will not be repeated. The semiconductor device 112D may include a first electrode 101, a multi-layered stack DE15, a thermal source layer 103, and a second electrode 102.

The multi-layered stack DE15 may include a first booster layer KBL1, a first hafnium oxide layer 105A, a first seed layer 106A with the doped layer 104, a second booster layer KBL2, a second hafnium oxide layer 105B, a second seed layer 106B, a leakage barrier layer 107, and an interface control layer 108 that are stacked on top of one another in the mentioned order.

The first booster layer KBL1 may be formed under the first hafnium oxide layer 105A, and the second booster layer KBL2 may be formed under the second hafnium oxide layer 105B. The first hafnium oxide layer 105A may directly contact the first booster layer KBL1, and the second hafnium oxide layer 105B may directly contact the second booster layer KBL2.

The crystallization of the first and second hafnium oxide layers 105A and 105B may be promoted by the first seed layer 106A and the second seed layer 106B. The dielectric constant of the first hafnium oxide layer 105A may be boosted by the first booster layer KBL1. The dielectric constant of the second hafnium oxide layer 105B may be boosted by the second booster layer KBL2.

Referring to FIGS. 4C and 4D, the first seed layer 106A, the second seed layer 106B, and the thermal source layer 103 may promote tetragonal crystallization of the first hafnium oxide layer 105A and the second hafnium oxide layer 105B. The thermal source layer 103 may provide a low temperature thermal process at which the first hafnium oxide layer 105A and the second hafnium oxide layer 105B may be crystallized into a tetragonal crystal structure. The first hafnium oxide layer 105A and the second hafnium oxide layer 105B may be crystallized into a tetragonal crystal structure by the first seed layer 106A. The second hafnium oxide layer 105B may be crystallized into a tetragonal crystal structure by the second seed layer 106B. The second hafnium oxide layer 105B may be crystallized into a tetragonal crystal structure by the first seed layer 106A and the second seed layer 106B.

Both of the first hafnium oxide layer 105A and the second hafnium oxide layer 105B may have a pure tetragonal crystal structure.

According to another embodiment of the present invention, the first hafnium oxide layer 105A may have a pure tetragonal crystal structure, and the second hafnium oxide layer 105B may be made of a material having a tetragonal crystal structure and a monoclinic crystal structure that are mixed together. The first hafnium oxide layer 105A may have a higher dielectric constant than the second hafnium oxide layer 105B. As described above, even though the second hafnium oxide layer 105B has a lower dielectric constant than the first hafnium oxide layer 105A, the second hafnium oxide layer 105B may have a higher dielectric constant than the first and second seed layers 106A and 106B. Although the second hafnium oxide layer 105B includes the tetragonal crystal structure and the monoclinic crystal structure that are mixed together, the tetragonal crystal structure may be more dominant than the monoclinic crystal structure in the second hafnium oxide layer 105B. Since the first hafnium oxide layer 105A is thicker than the second hafnium oxide layer 105B, the tetragonal crystal structure may be dominant in the multi-layered stacks DE14 and DE15.

Referring to FIGS. 4A to 4D, each of the first hafnium oxide layer 105A and the second hafnium oxide layer 105B may further include a dopant for promoting crystallization. Herein, the dopant may be the same material as or different materials from the dopant of the doped layer 104. The dopant may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N). The first and second hafnium oxide layers 105A and 105B may be made of a material having a tetragonal crystal structure doped with a dopant.

Figure 5A:
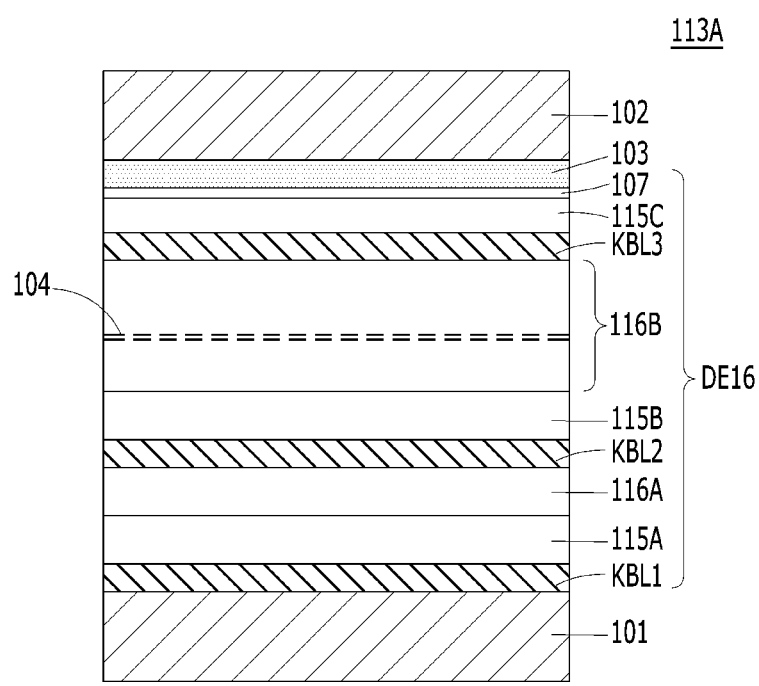

Referring to FIG. 5A, a semiconductor device 113A may include a first electrode 101, a multi-layered stack DE16, a thermal source layer 103, and a second electrode 102.

The multi-layered stack DE16 may include a first booster layer KBL1, a first hafnium oxide layer 115A, a first seed layer 116A, a second booster layer KBL2, a second hafnium oxide layer 115B, a second seed layer 116B having a doped layer 104, a third booster layer KBL3, a third hafnium oxide layer 115C, and a leakage barrier layer 107 that are stacked on top of one another in the mentioned order.

The crystallization of the first to third hafnium oxide layers 115A, 115B, and 115C may be promoted by the first seed layer 116A and the second seed layer 116B. The dielectric constant of the first hafnium oxide layer 115A may be boosted by the first booster layer KBL1. The dielectric constant of the second hafnium oxide layer 115B may be boosted by the second booster layer KBL2. The dielectric constant of the third hafnium oxide layer 115C may be boosted by the third booster layer KBL3.

The first booster layer KBL1 may be formed under the first hafnium oxide layer 115A, the second booster layer KBL2 may be formed under the second hafnium oxide layer 115B, and the third booster layer KBL3 may be formed under the third hafnium oxide layer 115C. The first booster layer KBL1 may directly contact the first hafnium oxide layer 115A, the second booster layer KBL2 may directly contact the second hafnium oxide layer 115B, and the third booster layer KBL3 may directly contact the third hafnium oxide layer 115C.

The doped layer 104 may not be embedded in the first seed layer 116A. The doped layer 104 may be embedded in the second seed layer 116B. The first seed layer 116A may be thinner than the second seed layer 116B.

The first hafnium oxide layer 115A may be thicker than the second hafnium oxide layer 115B and the third hafnium oxide layer 115C. According to another embodiment of the present invention, the first hafnium oxide layer 115A, the second hafnium oxide layer 115B, and the third hafnium oxide layer 115C may have the same thickness.

Figure 5B:
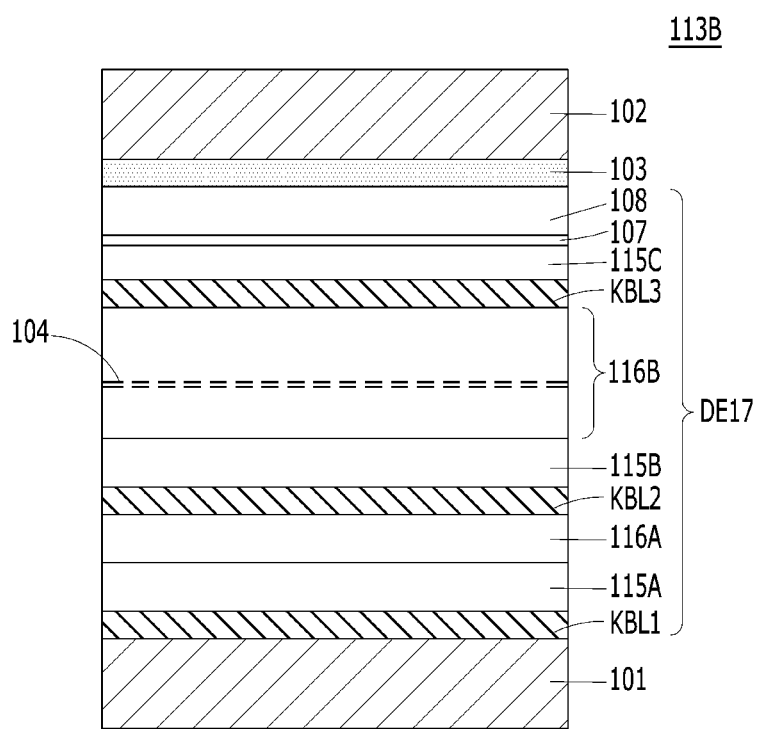

Referring to FIG. 5B, a semiconductor device 113B may be similar to the semiconductor device 113A of FIG. 5A. Thus, the same reference numerals may refer to the same elements and any further discussion with respect to the same elements will not be repeated.

The semiconductor device 113B may include a first electrode 101, a multi-layered stack DE17, a thermal source layer 103, and a second electrode 102. The multi-layered stack DE17 may include a first booster layer KBL1, a first hafnium oxide layer 115A, a first seed layer 116A, a second booster layer KBL2, a second hafnium oxide layer 115B, a second seed layer 116B having a doped layer 104, a third booster layer KBL3, a third hafnium oxide layer 115C, and a leakage barrier layer 107 that are stacked on top of one another in the mentioned order. The multi-layered stack DE17 may further include an interface control layer 108 between the leakage barrier layer 107 and the thermal source layer 103.

The crystallization of the first to third hafnium oxide layers 115A, 115B, and 115C may be promoted by the first seed layer 116A and the second seed layer 116B. The dielectric constant of the first hafnium oxide layer 115A may be boosted by the first booster layer KBL1. The dielectric constant of the second hafnium oxide layer 115B may be boosted by the second booster layer KBL2. The dielectric constant of the third hafnium oxide layer 115C may be boosted by the third booster layer KBL3.

The first booster layer KBL1 may be formed under the first hafnium oxide layer 115A, the second booster layer KBL2 may be formed under the second hafnium oxide layer 115B, and the third booster layer KBL3 may be formed under the third hafnium oxide layer 115C. The first booster layer KBL1 may directly contact the first hafnium oxide layer 115A, the second booster layer KBL2 may directly contact the second hafnium oxide layer 115B, and the third booster layer KBL3 may directly contact the third hafnium oxide layer 115C.

Referring to FIGS. 5A and 5B, the first seed layer 116A, the second seed layer 116B, and the thermal source layer 103 may promote the tetragonal crystallization of the first hafnium oxide layer 115A, the second hafnium oxide layer 115B, and the third hafnium oxide layer 115C. The thermal source layer 103 may provide a low-temperature thermal process at which the first hafnium oxide layer 115A, the second hafnium oxide layer 115B, and the third hafnium oxide layer 115C may be crystallized into a tetragonal crystal structure. The first hafnium oxide layer 115A and the second hafnium oxide layer 115B may be crystallized into a tetragonal crystal structure by the first seed layer 116A. The second hafnium oxide layer 115B and the third hafnium oxide layer 115C may be crystallized into a tetragonal crystal structure by the second seed layer 116B.

The first hafnium oxide layer 115A, the second hafnium oxide layer 115B, and the third hafnium oxide layer 115C may all have a pure tetragonal crystal structure. According to another embodiment of the present invention, the first hafnium oxide layer 115A and the second hafnium oxide layer 115B may have a pure tetragonal crystal structure, and the third hafnium oxide layer 115C may have a monoclinic crystal structure and a tetragonal crystal structure that are mixed together. The tetragonal crystal structure may be dominant in the third hafnium oxide layer 115C.

Figure 5C:
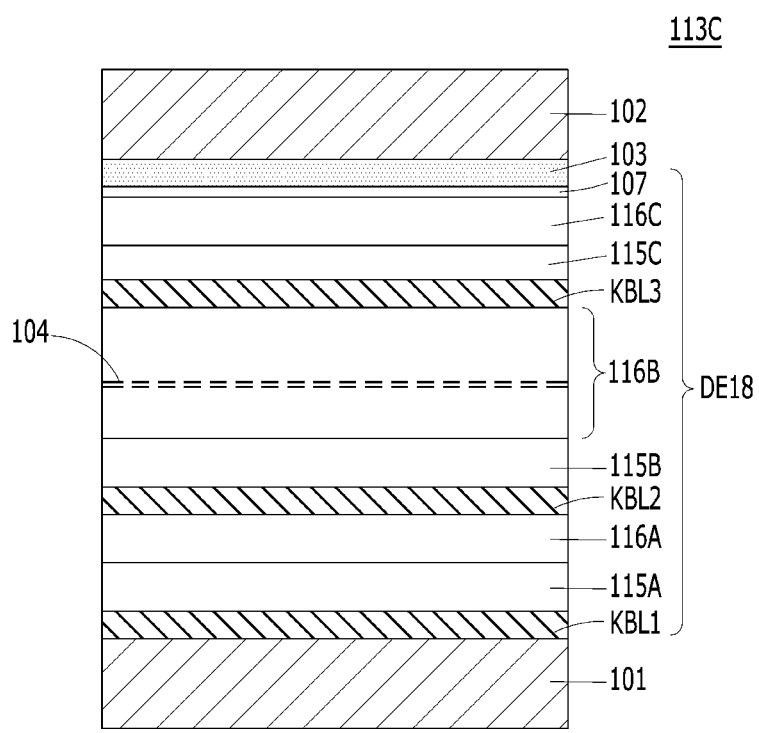

Referring to FIG. 5C, a semiconductor device 113C may be similar to the semiconductor device 113A of FIG. 5A. Thus, the same reference numerals may refer to the same elements and any further discussion with respect to the same elements will not be repeated.

The semiconductor device 113C may include a first electrode 101, a multi-layered stack DE18, a thermal source layer 103, and a second electrode 102. The multi-layered stack DE18 may include a first booster layer KBL1, a first hafnium oxide layer 115A, a first seed layer 116A, a second booster layer KBL2, a second hafnium oxide layer 115B, a second seed layer 116B having the doped layer 104, a third booster layer KBL3, a third hafnium oxide layer 115C, a third seed layer 116C, and a leakage barrier layer 107 that are stacked on top of one another in the mentioned order.

The third seed layer 116C may be disposed between the third hafnium oxide layer 115C and the leakage barrier layer 107. The first seed layer 116A, the second seed layer 116B, and the third seed layer 116C may be of the same material. The first seed layer 116A, the second seed layer 116B, and the third seed layer 116C may be made of a material having a tetragonal crystal structure. The first seed layer 116A, the second seed layer 116B, and the third seed layer 116C may be or include tetragonal zirconium oxide. The second seed layer 116B may be tetragonal zirconium oxide having the doped layer 104, while the first seed layer 116A and the third seed layer 116C may include an undoped tetragonal zirconium oxide. Herein, the doped layer 104 may not exist in the undoped tetragonal zirconium oxide.

As described above, the doped layer 104 may be embedded in the second seed layer 116B. The doped layer 104 may not be embedded in the first seed layer 116A and the third seed layer 116C. The third seed layer 116C and the second seed layer 116B may further promote the crystallization of the third hafnium oxide layer 115C.

According to another embodiment of the present invention, the leakage barrier layer 107 may be embedded in the third seed layer is 116C. For example, a top region of the seed layer 116C may include a leakage barrier layer 107. The third seed layer 116C may include Zirconium oxide, and the leakage barrier layer 107 may include aluminum-doped Zirconium oxide.

The crystallization of the first to third hafnium oxide layers 115A, 115B, and 115C may be promoted by the first seed layer 116A to the third seed layer 116C. The dielectric constant of the first hafnium oxide layer 115A may be boosted by the first booster layer KBL1. The dielectric constant of the second hafnium oxide layer 115B may be boosted by the second booster layer KBL2. The dielectric constant of the third hafnium oxide layer 115C may be boosted by the third booster layer KBL3.

The first booster layer KBL1 may be formed under the first hafnium oxide layer 115A, the second booster layer KBL2 may be formed under the second hafnium oxide layer 115B, and the third booster layer KBL3 may be formed under the third hafnium oxide layer 115C. The first booster layer KBL1 may directly contact the first hafnium oxide layer 115A, the second booster layer KBL2 may directly contact the second hafnium oxide layer 115B, and the third booster layer KBL3 may directly contact the third hafnium oxide layer 115C.

Figure 5D:
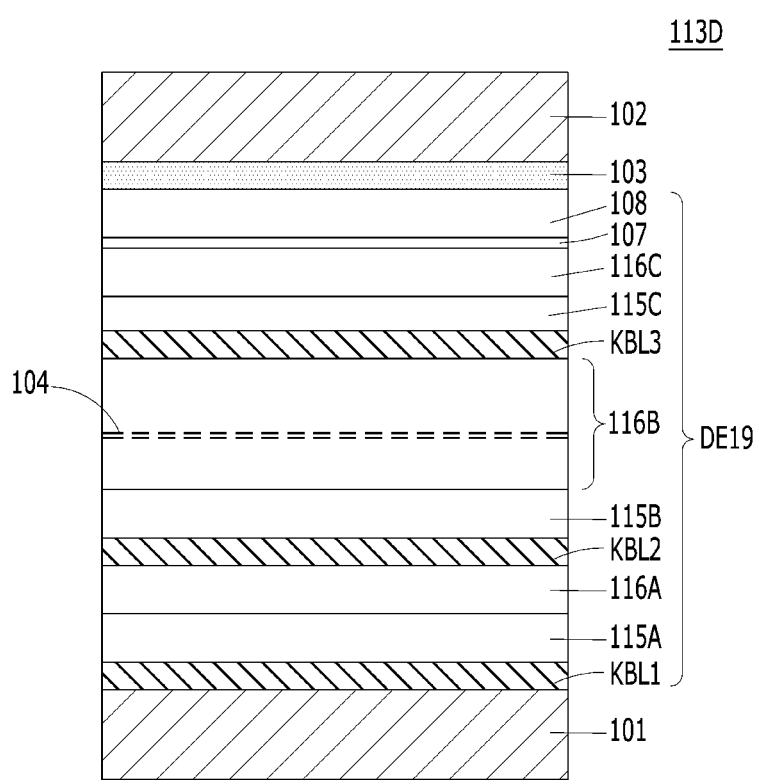

Referring to FIG. 5D, a semiconductor device 113D may be similar to the semiconductor device 113C of FIG. 5C. Thus, the same reference numerals may refer to the same elements and any further discussion with respect to the same elements will not be repeated.

The semiconductor device 113D may include a first electrode 101, a multi-layered stack DE19, a thermal source layer 103, and a second electrode 102. The multi-layered stack DE19 may include a first booster layer KBL1, a first hafnium oxide layer 115A, a first seed layer 116A, a second booster layer KBL2, a second hafnium oxide layer 115B, a second seed layer 116B having the doped layer 104, a third booster layer KBL3, a third hafnium oxide layer 115C, a third seed layer 116C, and a leakage barrier layer 107 that are stacked on top of one another in the mentioned order. The multi-layered stack DE19 may further include an interface control layer 108 between the leakage barrier layer 107 and the thermal source layer 103.

The crystallization of the first to third hafnium oxide layers 115A, 115B, and 115C may be promoted by the first seed layer 116A to the third seed layer 116C. The dielectric constant of the first hafnium oxide layer 115A may be boosted by the first booster layer KBL1. The dielectric constant of the second hafnium oxide layer 115B may be boosted by the second booster layer KBL2. The dielectric constant of the third hafnium oxide layer 115C may be boosted by the third booster layer KBL3.

The first booster layer KBL1 may be formed under the first hafnium oxide layer 115A, the second booster layer KBL2 may be formed under the second hafnium oxide layer 115B, and the third booster layer KBL3 may be formed under the third hafnium oxide layer 115C. The first booster layer KBL1 may directly contact the first hafnium oxide layer 115A, the second booster layer KBL2 may directly contact the second hafnium oxide layer 115B, and the third booster layer KBL3 may directly contact the third hafnium oxide layer 115C.

Referring to FIGS. 5A to 5D, each of the first to third hafnium oxide layers 115A, 115B, and 115C may further include a dopant. The dopant may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N). Each of the first to third hafnium oxide layers 115A, 115B, and 115C may be made of a material having a tetragonal crystal structure doped with a dopant.

Figure 6A:
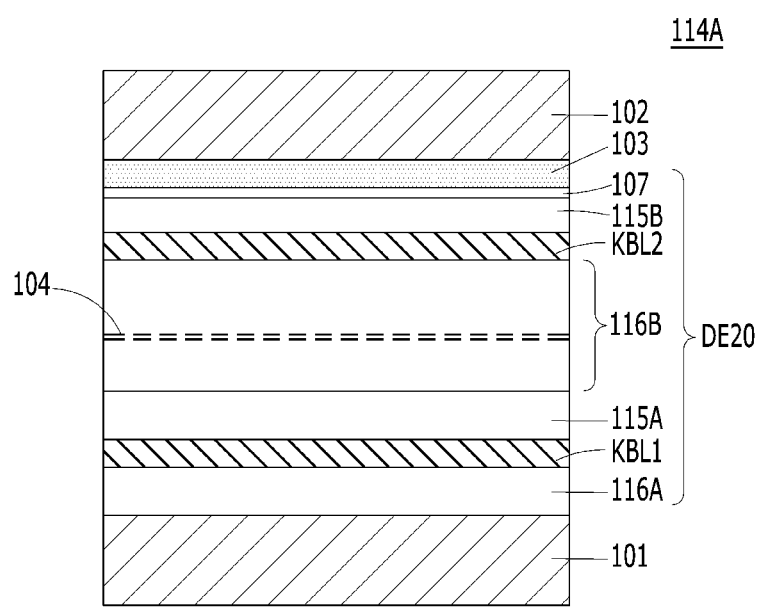

Referring to FIG. 6A, a semiconductor device 114A may include a first electrode 101, a multi-layered stack DE20, a thermal source layer 103, and a second electrode 102.

The multi-layered stack DE20 may include a first seed layer 116A, a first booster layer KBL1, a first hafnium oxide layer 115A, a second seed layer 116B having a doped layer 104, a second booster layer KBL2, a second hafnium oxide layer 115B, and a leakage barrier layer 107 that are stacked on top of one another in the mentioned order.

The first seed layer 116A and the second seed layer 116B may be of the same material. The first seed layer 116A and the second seed layer 116B may be made of a material having a tetragonal crystal structure individually. The first seed layer 116A and the second seed layer 116B may be or include tetragonal zirconium oxide. The first seed layer 116A may include an undoped tetragonal zirconium oxide, and the second seed layer 116B may include a tetragonal zirconium oxide having the doped layer 104. Herein, the doped layer 104 may not exist in the undoped tetragonal zirconium oxide.

As described above, the doped layer 104 may be embedded in the second seed layer 116B. The doped layer 104 may not be embedded in the first seed layer 116A. The second seed layer 116B may promote the crystallization of the second hafnium oxide layer 115B. The first seed layer 116A and the second seed layer 116B may further promote the crystallization of the first hafnium oxide layer 115A.

The crystallization of the first and second hafnium oxide layers 115A and 115B may be promoted by the first seed layer 116A and the second seed layer 116B. The dielectric constant of the first hafnium oxide layer 115A may be boosted by the first booster layer KBL1. The dielectric constant of the second hafnium oxide layer 115B may be boosted by the second booster layer KBL2.

The first booster layer KBL1 may be formed under the first hafnium oxide layer 115A, and the second booster layer KBL2 may be formed under the second hafnium oxide layer 115B. The first booster layer KBL1 may directly contact the first hafnium oxide layer 115A, and the second booster layer KBL2 may directly contact the second hafnium oxide layer 115B.

Figure 6B:
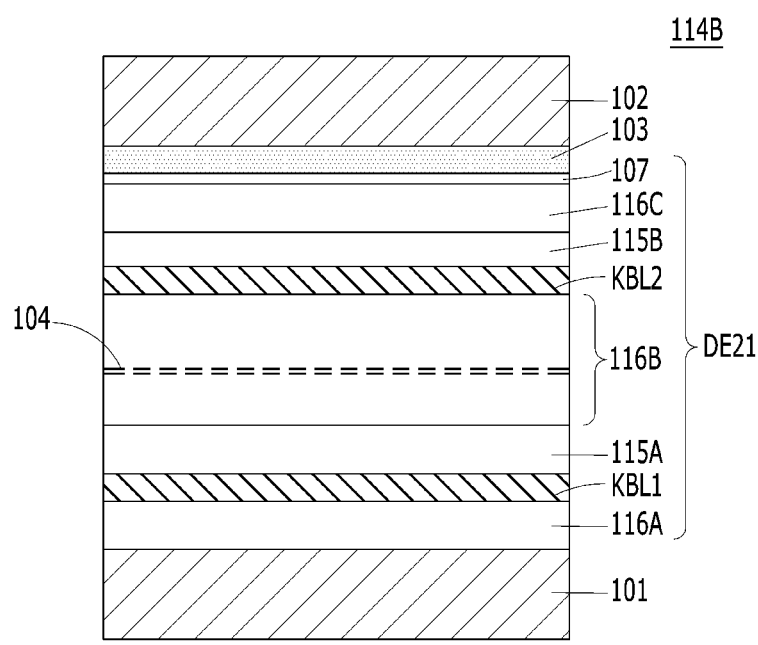

Referring to FIG. 6B, a semiconductor device 114B may include a first electrode 101, a multi-layered stack DE21, a thermal source layer 103, and a second electrode 102.

The multi-layered stack DE21 may include a first seed layer 116A, a first booster layer KBL1, a first hafnium oxide layer 115A, a second seed layer 116B having a doped layer 104, a second booster layer KBL2, a second hafnium oxide layer 115B, a third seed layer 116C, and a leakage barrier layer 107 that are stacked on top of one another in the mentioned order.

The first seed layer 116A, the second seed layer 116B, and the third seed layer 116C may be of the same material. The first to third seed layers 116A, 116B, and 116C may have tetragonal crystal structures.

The first to third seed layers 116A, 116B, and 116C may be or include tetragonal zirconium oxide. The second seed layer 116B may be or include tetragonal zirconium oxide with the doped layer 104, and the first and third seed layers 116A and 116C may include undoped tetragonal zirconium oxide. Herein, the doped layer 104 may not exist in the undoped tetragonal zirconium oxide.

As described above, the doped layer 104 may be embedded in the second seed layer 116B. The doped layer 104 may not be embedded in the first and third seed layers 116A and 116C. The first and second seed layers 116A and 116B may further promote crystallization of the first hafnium oxide layer 115A. The second and third seed layers 116B and 116C may further promote crystallization of the second hafnium oxide layer 115B. In another embodiment, the leakage barrier layer 107 may be embedded in the third seed layer 116C.

As described above, the doped layer 104 may be embedded in the second seed layer 116B. The doped layer 104 may not be embedded in the first and third seed layers 116A and 116C. The first and second seed layers 116A and 116B may further promote the crystallization of the first hafnium oxide layer 115A. The second and third seed layers 116B and 116C may further promote the crystallization of the second hafnium oxide layer 115B.

According to another embodiment of the present invention, the leakage barrier layer 107 may be embedded in the third seed layer 116C.

The crystallization of the first and second hafnium oxide layers 115A and 115B may be promoted by the first seed layer 116A to the third seed layer 116C. The dielectric constant of the first hafnium oxide layer 115A may be boosted by the first booster layer KBL1. The dielectric constant of the second hafnium oxide layer 115B may be boosted by the second booster layer KBL2.

The first booster layer KBL1 may be formed under the first hafnium oxide layer 115A, and the second booster layer KBL2 may be formed under the second hafnium oxide layer 115B. The first booster layer KBL1 may directly contact the first hafnium oxide layer 115A, and the second booster layer KBL2 may directly contact the second hafnium oxide layer 115B.

The multi-layered stacks DE20 and DE21 of FIGS. 6A and 6B may further include an interface control layer (not shown) between the leakage barrier layer 107 and the thermal source layer 103, individually. Herein, the interface control layer may correspond to the interface control layer 108 of the above-described embodiments of the present invention.

Referring to FIGS. 6A and 6B, each of the first and second hafnium oxide layers 115A and 115B may further include a dopant. The dopant may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N). Each of the first and second hafnium oxide layers 115A and 115B may be made of a material having a tetragonal crystal structure doped with a dopant.

Figure 7A:
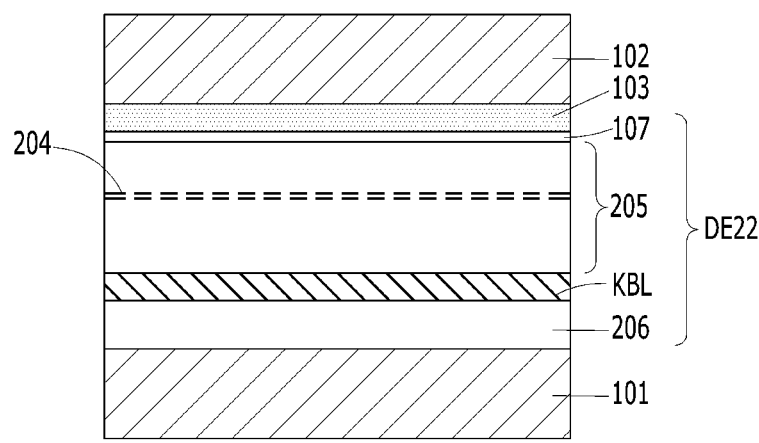

Referring to FIG. 7A, a semiconductor device 115 may include a first electrode 101, a multi-layered stack DE22, a thermal source layer 103, and a second electrode 102. As for the description on the first electrode 101, the leakage barrier layer 107, the thermal source layer 103, and the second electrode 102, the above-described embodiments will be referred to.

The multi-layered stack DE22 may include a seed layer 206, a booster layer (KBL), a hafnium oxide layer 205, and a doped layer 204. The booster layer KBL may be formed between the seed layer 206 and the hafnium oxide layer 205. The seed layer 206 may directly contact the first electrode 101 and the booster layer KBL, and may be formed between the booster layer KBL and the first electrode 101.

The booster layer KBL may be in direct contact with the hafnium oxide layer 205, which is advantageous for boosting the dielectric constant of the hafnium oxide layer 205.

The hafnium oxide layer 205 may have a pure tetragonal crystal structure.

The multi-layered stack DE22 may further include a doped layer 204. The doped layer 204 may further promote the crystallization of the hafnium oxide layer 205 and further suppress the leakage current of the multi-layered stack DE22. The doped layer 204 may be embedded very thinly in the hafnium oxide layer 205. The doped layer 204 may not separate crystal grains of the hafnium oxide layer 205. The tetragonal crystal structure of the hafnium oxide layer 205 may not be separated. The doped layer 204 may be formed by doping the inside of the hafnium oxide layer 205 with a dopant. The doped layer 204 may be embedded in the hafnium oxide layer 205 to be spaced apart from the booster layer KBL.

When the hafnium oxide layer 205 includes tetragonal hafnium oxide, the doped layer 204 may be or include tetragonal hafnium oxide doped with a dopant. Examples of the dopant of the doped layer 204 may, for example, include aluminum (Al) or beryllium (Be). For example, the doped layer 204 may be or include aluminum-doped tetragonal hafnium oxide or beryllium-doped tetragonal hafnium oxide.

The hafnium oxide layer 205 may be crystallized into a tetragonal crystal structure by the seed layer 206 and the thermal source layer 103.

The doped layer 204 may have a higher band gap than the seed layer 206 and the hafnium oxide layer 205.

In this manner, the doped layer 204 may further promote the crystallization of the hafnium oxide layer 205, while the high band gap of the doped layer 204 may suppress the leakage current of the semiconductor device 115.

The leakage barrier layer 107 may be formed between the hafnium oxide layer 205 and the thermal source layer 103. For example, the leakage barrier layer 107 may be or include aluminum oxide or beryllium oxide.

According to another embodiment of the present invention, the leakage barrier layer 107 may be embedded on the top surface of the hafnium oxide layer 205. For example, the leakage barrier layer 107 may include aluminum-doped hafnium oxide or beryllium-doped hafnium oxide.

Figure 7B:
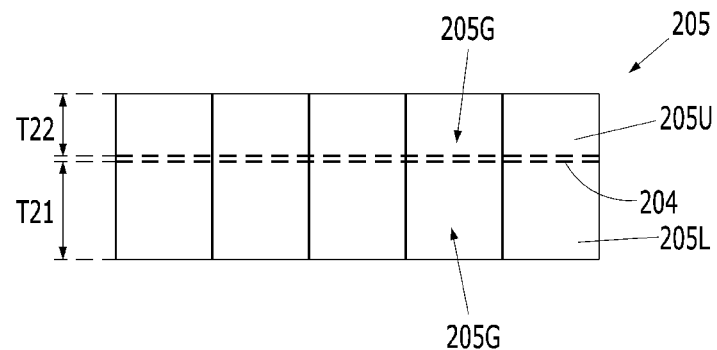

FIG. 7B is a detailed view of the hafnium oxide layer 205.

Referring to FIG. 7B, in the hafnium oxide layer 205 in which the doped layer 204 is embedded, the doped layer 204 may be embedded in the hafnium oxide layer 205. The hafnium oxide layer 205 with the doped layer 204 may be defined as an undoped lower hafnium oxide layer 205L, the doped layer 204, and an undoped upper hafnium oxide layer 205U. Each of the undoped lower hafnium oxide layer 205L, the doped layer 204, and the undoped upper hafnium oxide layer 205U may be made of a material having a tetragonal crystal structure. The undoped lower hafnium oxide layer 205L, the doped layer 204, and the undoped upper hafnium oxide layer 205U may be continuous without the crystal grains 205G being separated. The doped layer 204 may not separate the crystal grains 205G of the undoped lower hafnium oxide layer 205L and the crystal grains 205G of the undoped upper hafnium oxide layer 205U from each other. The undoped lower hafnium oxide layer 205L may be thicker than the undoped upper hafnium oxide layer 205U (T21>T22). The doped layer 204 may be extremely thinner than the undoped upper hafnium oxide layer 205U and the undoped lower hafnium oxide layer 205L. The doped layer 204 may be disposed between the undoped lower hafnium oxide layer 205L and the undoped upper hafnium oxide layer 205U, wherein the doped layer 204 may have an extremely thin thickness that does not separate the crystal grains of the undoped lower hafnium oxide layer 205L and the crystal grains of the undoped upper hafnium oxide layer 205U. The undoped lower hafnium oxide layer 205L and the undoped upper hafnium oxide layer 205U may have the same thickness. The undoped lower hafnium oxide layer 205L may be thinner than the undoped upper hafnium oxide layer 205U.

In an embodiment, the doped layer 204 may include an aluminum oxide layer having an extremely thin thickness that is discontinuous so that the doped layer 204 does not separate the crystal grains of the undoped lower hafnium oxide layer 205L and the crystal grains of the undoped upper hafnium oxide layer 205U.

Each of the undoped lower hafnium oxide layer 205L and the undoped upper hafnium oxide layer 205U may be undoped tetragonal hafnium oxide. The doped layer 204 may be tetragonal hafnium oxide doped with a dopant. For example, the doped layer 204 may include aluminum or beryllium as the dopant.

Moreover, as above, the doped layer 204 may include a dopant, but the doped layer 204 may not be an oxide layer of the dopant. For example, the doped layer 204 may not be an aluminum oxide ($Al_2O_3$) layer but may be an aluminum-doped tetragonal hafnium oxide. Also, the doped layer 204 may not be a beryllium oxide layer but be a beryllium-doped tetragonal hafnium oxide.

The undoped lower hafnium oxide layer 205L, the doped layer 204, and the undoped upper hafnium oxide layer 205U may be referred to as a first hafnium oxide layer, an aluminum-doped hafnium oxide layer, and a second hafnium oxide layer, respectively. The hafnium oxide layer 205 having the doped layer 204 may include an 'H-AH-H stack' in which the first hafnium oxide layer, the aluminum-doped hafnium oxide layer, and the second hafnium oxide layer are stacked in the mentioned order.

Figure 8A:
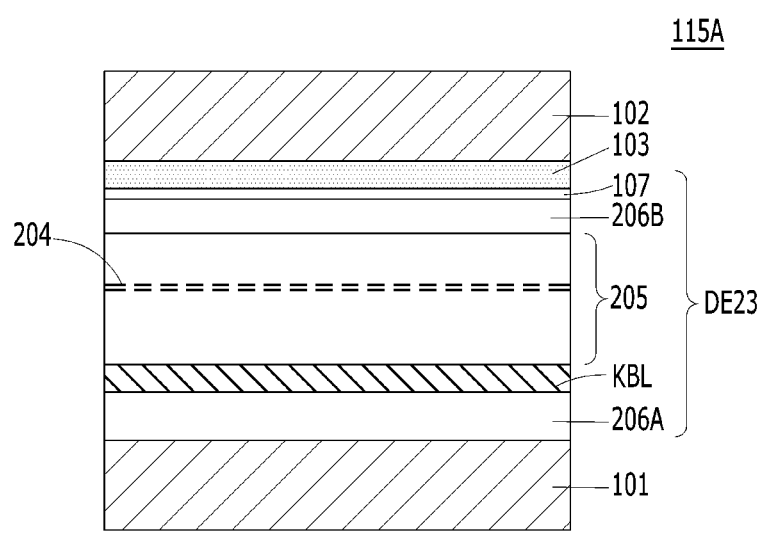

Referring to FIG. 8A, a semiconductor device 115A may include a first electrode 101, a multi-layered stack DE23, a thermal source layer 103, and a second electrode 102. For the first electrode 101, the leakage barrier layer 107, the thermal source layer 103, and the second electrode 102, the above-described embodiments may be referred to.

The multi-layered stack DE23 may include a first seed layer 206A, a booster layer (KBL), a hafnium oxide layer 205, a doped layer 204, and a second seed layer 206B.

The first seed layer 206A and the second seed layer 206B may be advantageous for crystallizing the hafnium oxide layer 205 into a tetragonal crystal structure.

The hafnium oxide layer 205 may have a pure tetragonal crystal structure.

The multi-layered stack DE23 may further include the doped layer 204. The doped layer 204 may further promote the crystallization of the hafnium oxide layer 205. The doped layer 204 may be embedded very thinly in the hafnium oxide layer 205 so that the doped layer 204 may not separate the crystal grains of the hafnium oxide layer 205. The tetragonal crystal structure of the hafnium oxide layer 205 may not be separated. The doped layer 204 may be formed by doping the inside of the hafnium oxide layer 205 with a dopant.

When the hafnium oxide layer 205 includes tetragonal hafnium oxide, the doped layer 204 may be or include tetragonal hafnium oxide doped with a dopant. The dopant of the doped layer 204 may, for example, include aluminum (Al) or beryllium (Be). For example, the doped layer 204 may be or include aluminum-doped tetragonal hafnium oxide or beryllium-doped tetragonal hafnium oxide.

The hafnium oxide layer 205 may be crystallized into a tetragonal crystal structure by the first and second seed layers 206A and 206B and the thermal source layer 103.

The doped layer 204 may have a higher band gap than the first and second seed layers 206A and 206B and the hafnium oxide layer 205.

In this manner, the doped layer 204 may further promote the crystallization of the hafnium oxide layer 205, while the high band gap of the doped layer 204 may suppress the leakage current of the semiconductor device 115A.

The leakage barrier layer 107 may be formed between the second seed layer 206B and the thermal source layer 103. For example, the leakage barrier layer 107 may be or include aluminum oxide or beryllium oxide.

According to another embodiment of the present invention, the leakage barrier layer 107 may be embedded on the top surface of the second seed layer 206B. The leakage barrier layer 107 may include aluminum-doped zirconium oxide or beryllium-doped zirconium oxide.

The crystallization of the hafnium oxide layer 205 may be promoted by the first and second seed layers 206A and 206B. The dielectric constant of the hafnium oxide layer 205 may be boosted by the booster layer KBL. The booster layer KBL may be formed under the hafnium oxide layer 205. The booster layer KBL may directly contact the hafnium oxide layer 205.

Figure 8B:
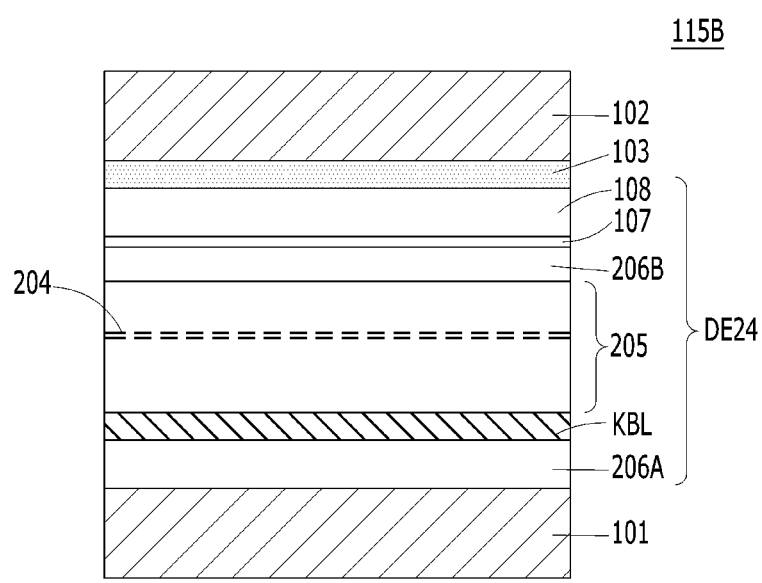

Referring to FIG. 8B, a semiconductor device 115B may be similar to the semiconductor device 115A of FIG. 8A. Thus, the same reference numerals may refer to the same elements and any further discussion with respect to the same elements will not be repeated.

The semiconductor device 115B may include a first electrode 101, a multi-layered stack DE24, a thermal source layer 103, and a second electrode 102. The multi-layered stack DE24 may be or include a stack of a first seed layer 206A, a booster layer KBL, a hafnium oxide layer 205 having the doped layer 204, a second seed layer 206B, a leakage barrier layer 107, and an interfacial control layer 108.

The crystallization of the hafnium oxide layer 205 may be promoted by the first and second seed layers 206A and 206B. The dielectric constant of the hafnium oxide layer 205 may be boosted by the booster layer KBL. The booster layer KBL may be formed under the hafnium oxide layer 205. The booster layer KBL may directly contact the hafnium oxide layer 205.

Figure 8C:
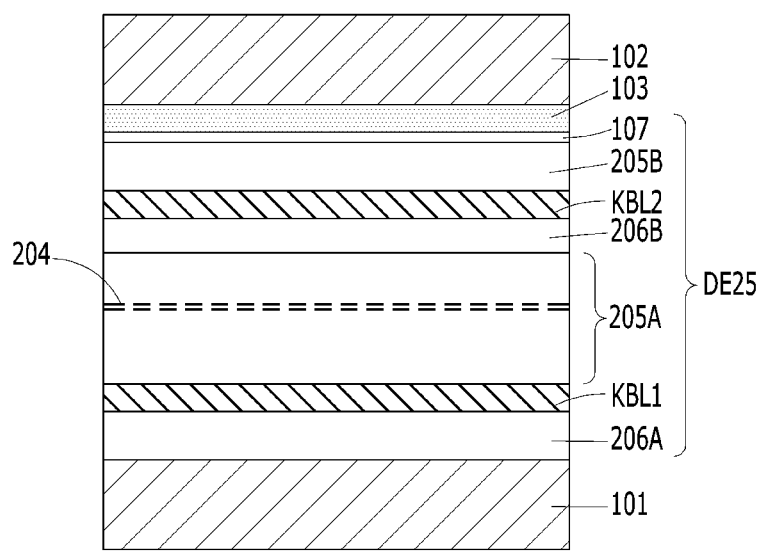

Referring to FIG. 8C, a semiconductor device 115C may be similar to the semiconductor device 115A of FIG. 8A. Thus, the same reference numerals may refer to the same elements and any further discussion with respect to the same elements will not be repeated.

The semiconductor device 115C may include a first electrode 101, a multi-layered stack DE25, a thermal source layer 103, and a second electrode 102. The multi-layered stack DE25 may be or include a stack of a first seed layer 206A, a booster layer KBL, a first hafnium oxide layer 205A having a doped layer 204, a second seed layer 206B, a second booster layer KBL2, a second hafnium oxide layer 205B, and a leakage barrier layer 107 in the recited order.

The first hafnium oxide layer 205A and the second hafnium oxide layer 205B may be of the same material. The first hafnium oxide layer 205A and the second hafnium oxide layer 205B may be made of a material having a tetragonal crystal structure. The first hafnium oxide layer 205A and the second hafnium oxide layer 205B may be or include tetragonal hafnium oxide. The first hafnium oxide layer 205A may be or include tetragonal hafnium oxide having the doped layer 204, and the second hafnium oxide layer 205B may include undoped tetragonal hafnium oxide. The undoped tetragonal hafnium oxide does not include doped layer 204.

As described above, the doped layer 204 may be embedded in the first hafnium oxide layer 205A. The doped layer 204 may not be embedded in the second hafnium oxide layer 205B. The capacitance of the dielectric layer stack DE25 may be further increased by the second hafnium oxide layer 205B.

The crystallization of the first and second hafnium oxide layers 205A and 205B may be promoted by the first and second seed layers 206A and 206B. The dielectric constant of the first hafnium oxide layer 205A may be boosted by the first booster layer KBL1. The dielectric constant of the second hafnium oxide layer 205B may be boosted by the second booster layer KBL2. The first booster layer KBL1 may be formed under the first hafnium oxide layer 205A. The second booster layer KBL2 may be formed under the second hafnium oxide layer 205B. The first booster layer KBL1 may directly contact the first hafnium oxide layer 205A. The second booster layer KBL2 may directly contact the second hafnium oxide layer 205B.

Figure 8D:
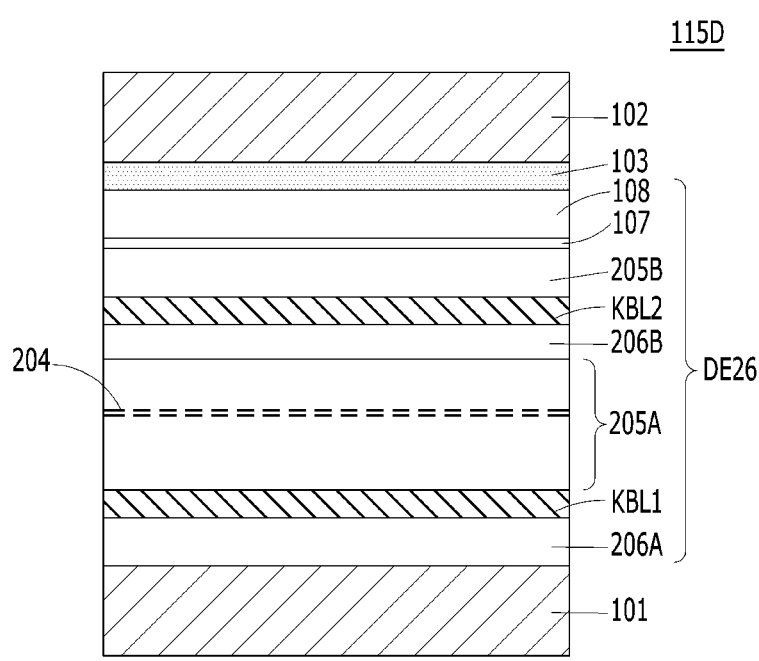

Referring to FIG. 8D, a semiconductor device 115D may be similar to the semiconductor device 115C of FIG. 8C. Thus, the same reference numerals may refer to the same elements and any further discussion with respect to the same elements will not be repeated.

The semiconductor device 115D may include a first electrode 101, a multi-layered stack DE26, a thermal source layer 103, and a second electrode 102. The multi-layered stack DE26 may be or include a stack of a first seed layer 206A, a first booster layer KBL1, a first hafnium oxide layer 205A having a doped layer 204, a second seed layer 206B, a second booster layer KBL2, a second hafnium oxide layer 205B, a leakage barrier layer 107, and an interface control layer 108.

The crystallization of the first and second hafnium oxide layers 205A and 205B may be promoted by the first and second seed layers 206A and 206B. The dielectric constant of the first hafnium oxide layer 205A may be boosted by the first booster layer KBL1. The dielectric constant of the second hafnium oxide layer 205B may be boosted by the second booster layer KBL2. The first booster layer KBL1 may be formed under the first hafnium oxide layer 205A. The second booster layer KBL2 may be formed under the second hafnium oxide layer 205B. The first booster layer KBL1 may directly contact the first hafnium oxide layer 205A. The second booster layer KBL2 may directly contact the second hafnium oxide layer 205B.

Figure 9A:
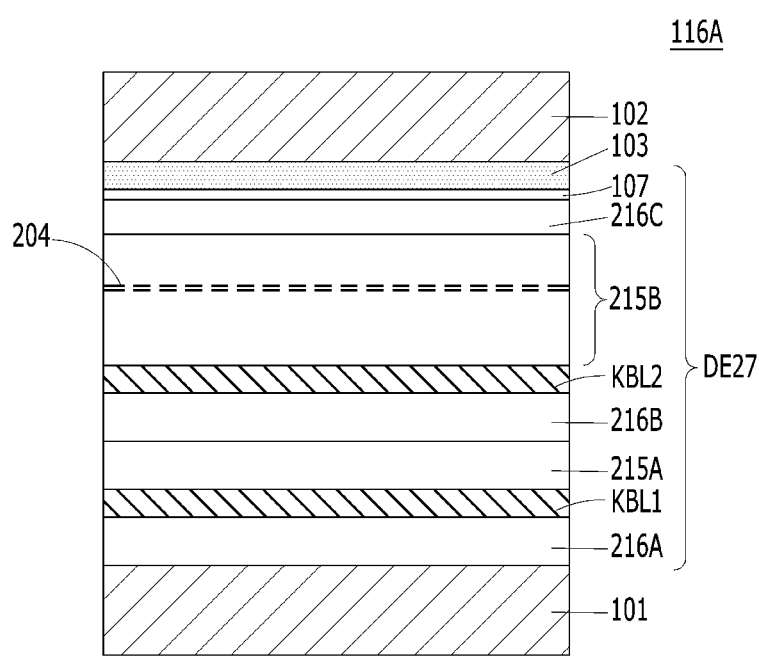

Referring to FIG. 9A, a semiconductor device 116A may include a first electrode 101, a multi-layered stack DE27, a thermal source layer 103, and a second electrode 102.

The multi-layered stack DE27 may be or include a stack of a first seed layer 216A, a first booster layer KBL1, a first hafnium oxide layer 215A, a second seed layer 216B, a second booster layer KBL2, a second hafnium oxide layer 215B having a doped layer 204, a third seed layer 216C, and a leakage barrier layer 107 in the recited order.

The first hafnium oxide layer 215A may include undoped tetragonal hafnium oxide. The first hafnium oxide layer 215A may be thinner than the second hafnium oxide layer 215B.

The crystallization of the first and second hafnium oxide layers 215A and 215B may be promoted by the first to third seed layers 216A, 216B, and 216C. The dielectric constant of the first hafnium oxide layer 215A may be boosted by the first booster layer KBL1. The dielectric constant of the second hafnium oxide layer 215B may be boosted by the second booster layer KBL2. The first booster layer KBL1 may be formed under the first hafnium oxide layer 215A. The second booster layer KBL2 may be formed under the second hafnium oxide layer 215B. The first booster layer KBL1 may directly contact the first hafnium oxide layer 215A. The second booster layer KBL2 may directly contact the second hafnium oxide layer 215B.

Figure 9B:
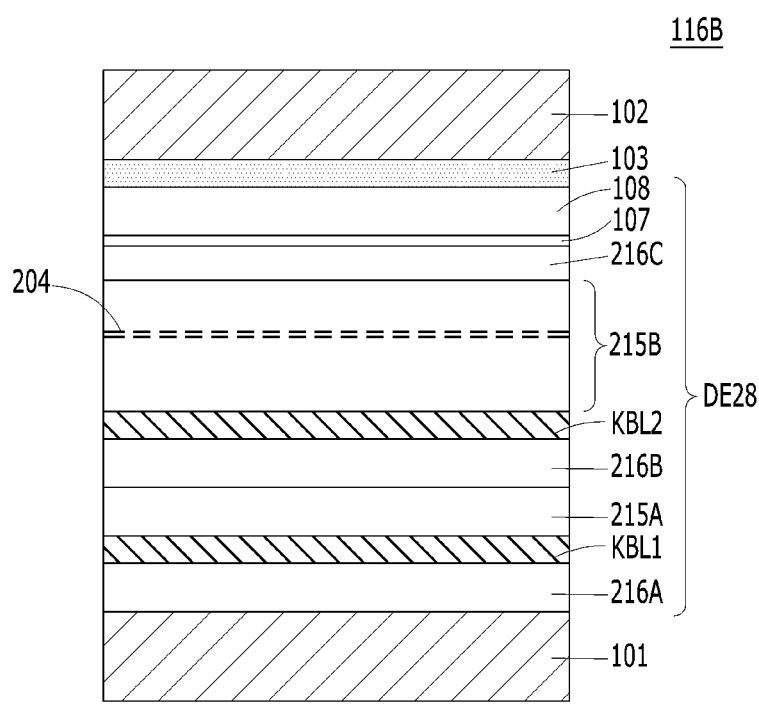

Referring to FIG. 9B, a semiconductor device 116B may be similar to the semiconductor device 116A of FIG. 9A. Thus, the same reference numerals may refer to the same elements and any further discussion with respect to the same elements will not be repeated.

The semiconductor device 116B may include a first electrode 101, a multi-layered stack DE28, a thermal source layer 103, and a second electrode 102. The multi-layered stack DE28 may be or include a stack of a first seed layer 216A, a first booster layer KBL1, a first hafnium oxide layer 215A, a second seed layer 216B, a second booster layer KBL2, a second hafnium oxide layer 215B having a doped layer 204, a third seed layer 216C, a leakage barrier layer 107, and an interface control layer 108.

The crystallization of the first and second hafnium oxide layers 215A and 215B may be promoted by the first to third seed layers 216A, 216B, and 216C. The dielectric constant of the first hafnium oxide layer 215A may be boosted by the first booster layer KBL1. The dielectric constant of the second hafnium oxide layer 215B may be boosted by the second booster layer KBL2. The first booster layer KBL1 may be formed under the first hafnium oxide layer 215A. The second booster layer KBL2 may be formed under the second hafnium oxide layer 215B. The first booster layer KBL1 may directly contact the first hafnium oxide layer 215A. The second booster layer KBL2 may directly contact the second hafnium oxide layer 215B.

Figure 9C:
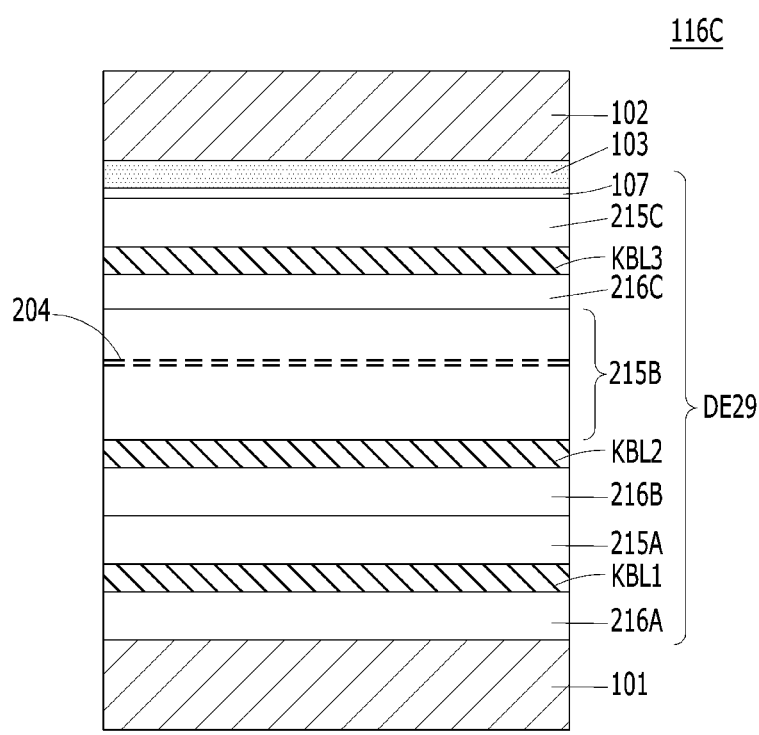

Referring to FIG. 9C, a semiconductor device 116C may be similar to the semiconductor device 116A of FIG. 9A. Thus, the same reference numerals may refer to the same elements and any further discussion with respect to the same elements will not be repeated.

The semiconductor device 116C may include a first electrode 101, a multi-layered stack DE29, a thermal source layer 103, and a second electrode 102. The multi-layered stack DE29 may be or include a stack of a first seed layer 216A, a first booster layer KBL1, a first hafnium oxide layer 215A, a second seed layer 216B, a second booster layer KBL2, a second hafnium oxide layer 215B having a doped layer 204, a third seed layer 216C, a third booster layer KBL3, a third hafnium oxide layer 215C, and a leakage barrier layer 107 in the recited order.

The first hafnium oxide layer 215A, the second hafnium oxide layer 215B, and the third hafnium oxide layer 215C may be of the same material. The first hafnium oxide layer 215A, the second hafnium oxide layer 215B, and the third hafnium oxide layer 215C may be made of a material having a tetragonal crystal structure. The first hafnium oxide layer 215A, the second hafnium oxide layer 215B, and the third hafnium oxide layer 215C may be or include tetragonal hafnium oxide. The first and third hafnium oxide layers 215A and 215C may include undoped tetragonal hafnium oxide. The undoped tetragonal hafnium oxide does not include doped layer 204.

As described above, the doped layer 204 may be embedded in the second hafnium oxide layer 215B. The doped layer 204 may not be embedded in the first hafnium oxide layer 215A and the third hafnium oxide layer 215C. The capacitance of the multi-layered stack DE29 may be further increased by the third hafnium oxide layer 215C.

The crystallization of the first to third hafnium oxide layers 215A, 215B, and 215C may be promoted by the first to third seed layers 216A, 216B, and 216C. The dielectric constant of the first hafnium oxide layer 215A may be boosted by the first booster layer KBL1. The dielectric constant of the second hafnium oxide layer 215B may be boosted by the second booster layer KBL2. The dielectric constant of the third hafnium oxide layer 215C may be boosted by the third booster layer KBL3. The first booster layer KBL1 may be formed under the first hafnium oxide layer 215A. The second booster layer KBL2 may be formed under the second hafnium oxide layer 215B. The third booster layer KBL3 may be formed under the third hafnium oxide layer 215C. The first booster layer KBL1 may directly contact the first hafnium oxide layer 215A. The second booster layer KBL2 may directly contact the second hafnium oxide layer 215B. The third booster layer KBL3 may directly contact the third hafnium oxide layer 215C.

Figure 9D:
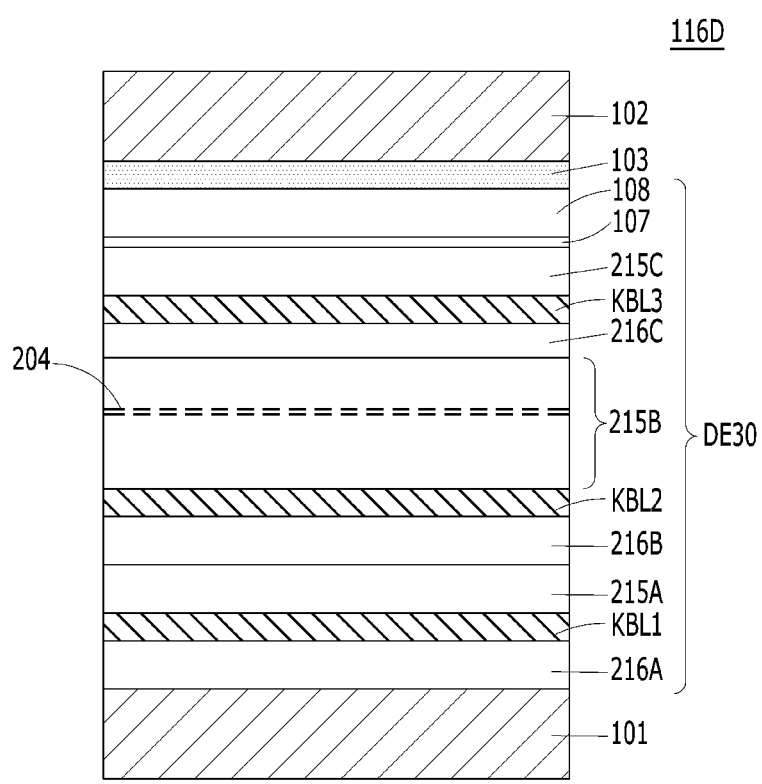

Referring to FIG. 9D, a semiconductor device 116D may be similar to the semiconductor device 116C of FIG. 9C. Thus, the same reference numerals may refer to the same elements and any further discussion with respect to the same elements will not be repeated.

The semiconductor device 116D may include a first electrode 101, a multi-layered stack DE30, a thermal source layer 103, and a second electrode 102. The multi-layered stack DE30 may be or include a stack of a first seed layer 216A, a first booster layer KBL1, a first hafnium oxide layer 215A, a second seed layer 216B, a second booster layer KBL2, a second hafnium oxide layer 215B having a doped layer 204, a third seed layer 216C, a third booster layer KBL3, a third hafnium oxide layer 215C, a leakage barrier layer 107, and an interface control layer 108.

The crystallization of the first to third hafnium oxide layers 215A, 215B, and 215C may be promoted by the first to third seed layers 216A, 216B, and 216C. The dielectric constant of the first hafnium oxide layer 215A may be boosted by the first booster layer KBL1. The dielectric constant of the second hafnium oxide layer 215B may be boosted by the second booster layer KBL2. The dielectric constant of the third hafnium oxide layer 215C may be boosted by the third booster layer KBL3. The first booster layer KBL1 may be formed under the first hafnium oxide layer 215A. The second booster layer KBL2 may be formed under the second hafnium oxide layer 215B. The third booster layer KBL3 may be formed under the third hafnium oxide layer 215C. The first booster layer KBL1 may directly contact the first hafnium oxide layer 215A. The second booster layer KBL2 may directly contact the second hafnium oxide layer 215B. The third booster layer KBL3 may directly contact the third hafnium oxide layer 215C.

Figure 10A:
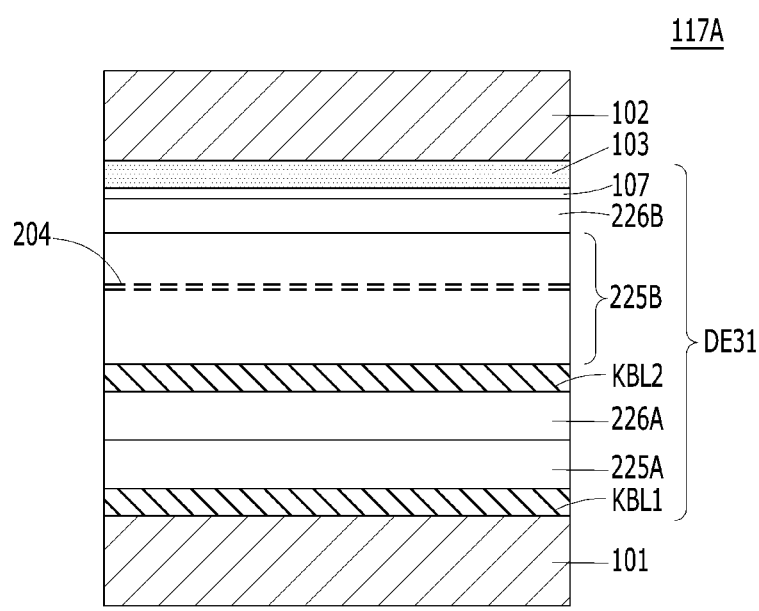

Referring to FIG. 10A, a semiconductor device 117A may include a first electrode 101, a multi-layered stack DE31, a thermal source layer 103, and a second electrode 102. The multi-layered stack DE31 may be or include a stack of a first booster layer KBL1, a first hafnium oxide layer 225A, a first seed layer 226A, a second booster layer KBL2, a hafnium oxide layer 225B having a doped layer 204, a second seed layer 226B, and a leakage barrier layer 107 in the recited order.

The first hafnium oxide layer 225A and the second hafnium oxide layer 225B may be of the same material. The first hafnium oxide layer 225A and the second hafnium oxide layer 225B may be made of a material having a tetragonal crystal structure. The first hafnium oxide layer 225A and the second hafnium oxide layer 225B may be or include tetragonal hafnium oxide. The first hafnium oxide layer 225A may include undoped tetragonal hafnium oxide. The undoped tetragonal hafnium oxide does not include doped layer 204.

The doped layer 204 may be embedded in the second hafnium oxide layer 225B. The doped layer 204 may not be embedded in the first hafnium oxide layer 225A. The second hafnium oxide layer 225B may be thicker than the first hafnium oxide layer 225A.

The crystallization of the first and second hafnium oxide layers 225A and 225B may be promoted by the first and second seed layers 226A and 226B. The dielectric constant of the first hafnium oxide layer 225A may be boosted by the first booster layer KBL1. The dielectric constant of the second hafnium oxide layer 225B may be boosted by the second booster layer KBL2. The first booster layer KBL1 may be formed under the first hafnium oxide layer 225A. The second booster layer KBL2 may be formed under the second hafnium oxide layer 225B. The first booster layer KBL1 may directly contact the first hafnium oxide layer 225A. The second booster layer KBL2 may directly contact the second hafnium oxide layer 225B.

Figure 10B:
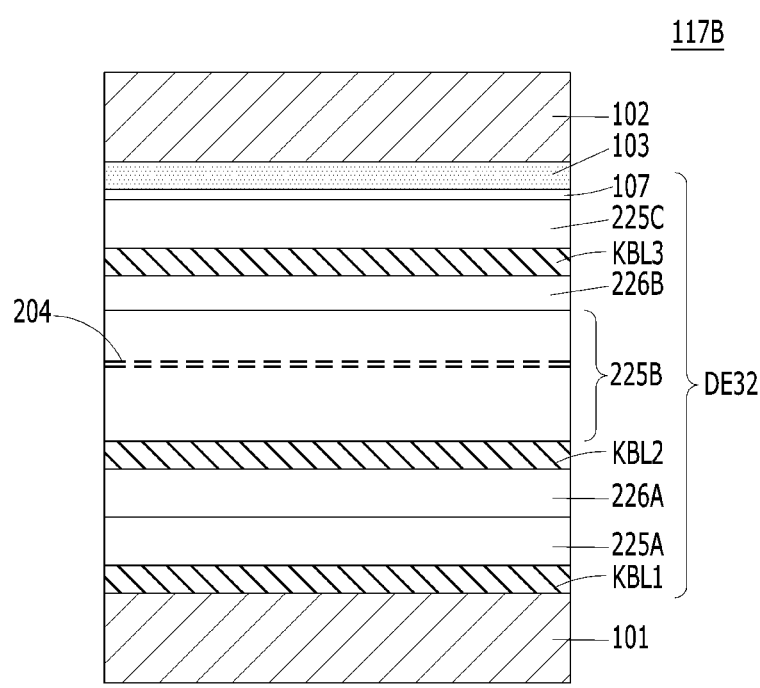

Referring to FIG. 10B, a semiconductor device 117B may be similar to the semiconductor device 117A of FIG. 10A. Thus, the same reference numerals may refer to the same elements and any further discussion with respect to the same elements will not be repeated.

The semiconductor device 117B may include a first electrode 101, a multi-layered stack DE32, a thermal source layer 103, and a second electrode 102. The multi-layered stack DE32 may be or include a stack of a first booster layer KBL1, a first hafnium oxide layer 225A, a first seed layer 226A, a second booster layer KBL2, a second hafnium oxide layer 225B having a doped layer 204, a second seed layer 226B, a third booster layer KBL3, a third hafnium oxide layer 225C, and a leakage barrier layer 107 in the recited order.

The first hafnium oxide layer 225A, the second hafnium oxide layer 225B, and the third hafnium oxide layer 225C may be of the same material. The first hafnium oxide layer 225A, the second hafnium oxide layer 225B, and the third hafnium oxide layer 225C may be made of a material having a tetragonal crystal structure. The first hafnium oxide layer 225A, the second hafnium oxide layer 225B, and the third hafnium oxide layer 225C may be or include tetragonal hafnium oxide. The first and third hafnium oxide layers 225A and 225C may include undoped tetragonal hafnium oxide. The undoped tetragonal hafnium oxide does not include doped layer 204.

The doped layer 204 may be embedded in the second hafnium oxide layer 225B. The doped layer 204 may not be embedded in the first hafnium oxide layer 225A and the third hafnium oxide layer 225C.

The crystallization of the first to third hafnium oxide layers 225A, 225B, and 225C may be promoted by the first and second seed layers 226A and 226B. The dielectric constant of the first hafnium oxide layer 225A may be boosted by the first booster layer KBL1. The dielectric constant of the second hafnium oxide layer 225B may be boosted by the second booster layer KBL2. The dielectric constant of the third hafnium oxide layer 225C may be boosted by the third booster layer KBL3. The first booster layer KBL1 may be formed under the first hafnium oxide layer 225A. The second booster layer KBL2 may be formed under the second hafnium oxide layer 225B. The third booster layer KBL3 may be formed under the third hafnium oxide layer 225C. The first booster layer KBL1 may directly contact the first hafnium oxide layer 225A. The second booster layer KBL2 may directly contact the second hafnium oxide layer 225B. The third booster layer KBL3 may directly contact the third hafnium oxide layer 225C.

Referring to FIGS. 10A and 10B, an interface control layer (not shown) may be further formed between the leakage barrier layer 107 and the thermal source layer 103. As for the interface control layer, the above-described embodiments may be referred to.

Figure 11A:
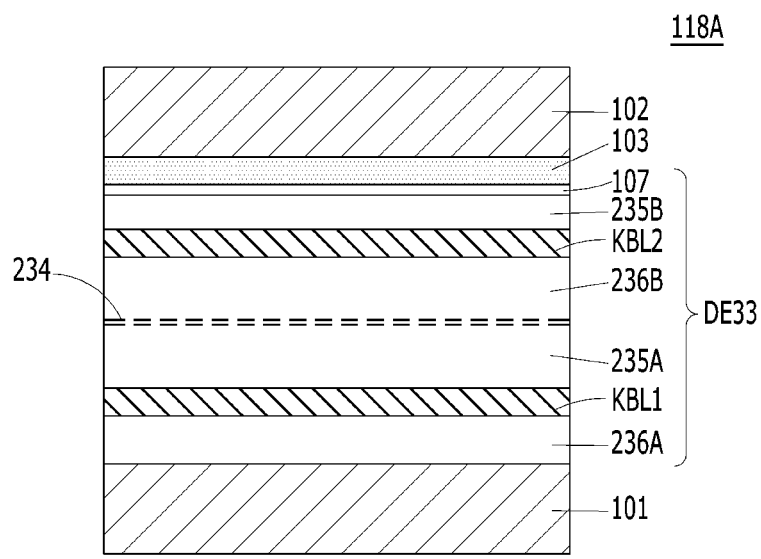

Referring to FIG. 11A, a semiconductor device 118A may include a first electrode 101, a multi-layered stack DE33, a thermal source layer 103, and a second electrode 102.

The multi-layered stack DE33 may be or include a stack of a first seed layer 236A, a first booster layer KBL1, a first hafnium oxide layer 235A, a doped layer 234, a second seed layer 236B, a second booster layer KBL2, a second hafnium oxide layer 235B, and a leakage barrier layer 107 in the recited order. When the first seed layer 236A and the second seed layer 236B include tetragonal zirconium oxide, the first booster layer KBL1 may be disposed between the first seed layer 236A and the first hafnium oxide layer 235A. The second booster layer KBL2 may be formed between the second seed layer 236B and the second hafnium oxide layer 235B.

The doped layer 234 may be disposed between the first hafnium oxide layer 235A and the second seed layer 236B. The doped layer 234 may not separate the crystal grains of the first hafnium oxide layer 235A and the crystal grains of the second seed layer 236B. The first hafnium oxide layer 235A and the second seed layer 236B may have the same thickness. The doped layer 234 may be extremely thinner than the first hafnium oxide layer 235A and the second seed layer 236B so that it does not separate the crystal grains of the first hafnium oxide layer 235A and the crystal grains of the second seed layer 236B.

The doped layer 234 may be embedded in the second seed layer 236B. In other words, it may be embedded in the bottom surface of the second seed layer 236B which is in contact with the first hafnium oxide layer 235A. The doped layer 234 may be, for example, aluminum-doped tetragonal zirconium oxide or beryllium-doped tetragonal zirconium oxide.

According to another embodiment of the present invention, the doped layer 234 may be embedded on the top surface of the first hafnium oxide layer 235A. The doped layer 234 may be, for example, aluminum-doped tetragonal hafnium oxide or beryllium-doped tetragonal hafnium oxide. The doped layer 234 may be embedded in the first hafnium oxide layer 235A by contacting the direct contact interface of the first hafnium oxide layer 235A and the second seed layer 236B.

The crystallization of the first and second hafnium oxide layers 235A and 235B may be promoted by the first and second seed layers 236A and 236B. The dielectric constant of the first hafnium oxide layer 235A may be boosted by the first booster layer KBL1. The dielectric constant of the second hafnium oxide layer 235B may be boosted by the second booster layer KBL2. The first booster layer KBL1 may be formed under the first hafnium oxide layer 235A. The second booster layer KBL2 may be formed under the second hafnium oxide layer 235B. The first booster layer KBL1 may directly contact the first hafnium oxide layer 235A. The second booster layer KBL2 may directly contact the second hafnium oxide layer 235B.

Figure 11B:
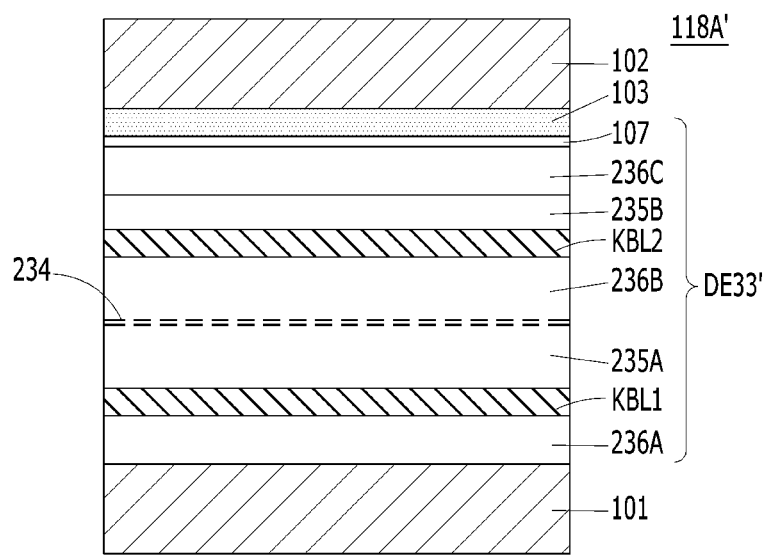

Referring to FIG. 11B, a semiconductor device 118A' may is include a first electrode 101, a multi-layered stack DE33', a thermal source layer 103, and a second electrode 102.

The multi-layered stack DE33' may be or include a stack of a first seed layer 236A, a first booster layer KBL1, a first hafnium oxide layer 235A, a doped layer 234, a second seed layer 236B, a second booster layer KBL2, a second hafnium oxide layer 235B, a third seed layer 236C, and a leakage barrier layer 107 in the recited order. When the first seed layer 236A and the second seed layer 236B include tetragonal zirconium oxide, the first booster layer KBL1 may be disposed between the first seed layer 236A and the first hafnium oxide layer 235A. The second booster layer KBL2 may be formed between the second seed layer 236B and the second hafnium oxide layer 235B. The third seed layer 236C may be formed between the second hafnium oxide layer 235B and the leakage barrier layer 107, and the third seed layer 236C may be or include tetragonal zirconium oxide.

The doped layer 234 may be disposed between the first hafnium oxide layer 235A and the second seed layer 236B. The doped layer 234 may not separate the crystal grains of the first hafnium oxide layer 235A and the crystal grains of the second seed layer 236B. The first hafnium oxide layer 235A and the second seed layer 236B may have the same thickness. The doped layer 234 may be extremely thinner than the first hafnium oxide layer 235A and the second seed layer 236B so that it does not separate the crystal grains of the first hafnium oxide layer 235A and the crystal grains of the second seed layer 236B.

The doped layer 234 may be embedded in the second seed layer 236B. In other words, it may be embedded in the bottom surface of the second seed layer 236B which is in contact with the first hafnium oxide layer 235A. The doped layer 234 may be, for example, aluminum-doped tetragonal zirconium oxide or beryllium-doped tetragonal zirconium oxide.

According to another embodiment of the present invention, the doped layer 234 may be embedded on the top surface of the first hafnium oxide layer 235A. Accordingly, the doped layer 234 may be, for example, aluminum-doped tetragonal hafnium oxide or beryllium-doped tetragonal hafnium oxide.

The crystallization of the first and second hafnium oxide layers 235A and 235B may be promoted by the first and second seed layers 236A and 236B. The dielectric constant of the first hafnium oxide layer 235A may be boosted by the first booster layer KBL1. The dielectric constant of the second hafnium oxide layer 235B may be boosted by the second booster layer KBL2. The first booster layer KBL1 may be formed under the first hafnium oxide layer 235A. The second booster layer KBL2 may be formed under the second hafnium oxide layer 235B. The first booster layer KBL1 may directly contact the first hafnium oxide layer 235A. The second booster layer KBL2 may directly contact the second hafnium oxide layer 235B.

Figure 11C:
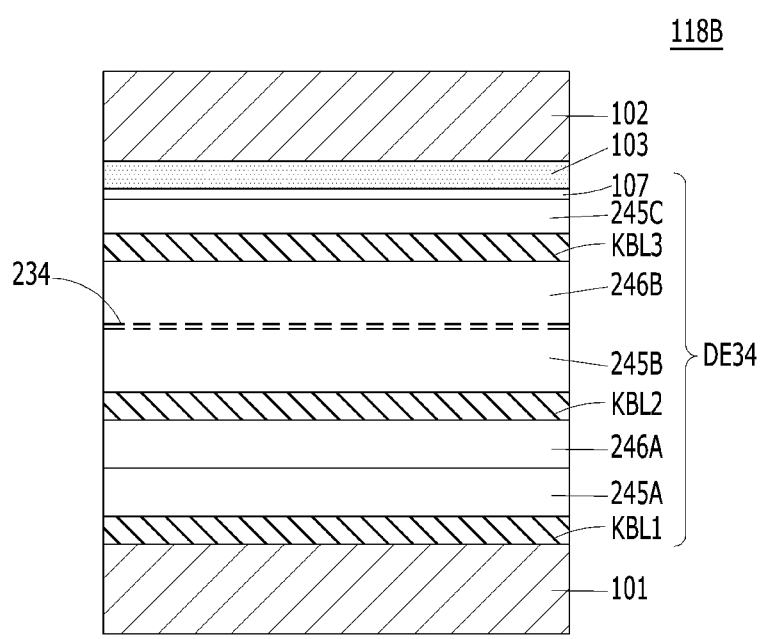

Referring to FIG. 11C, the semiconductor device 118B may include a first electrode 101, a multi-layered stack DE34, a thermal source layer 103, and a second electrode 102.

The multi-layered stack DE34 may be or include a stack of a first booster layer KBL1, a first hafnium oxide layer 245A, a first seed layer 246A, a second booster layer KBL2, a second hafnium oxide layer 245B, a doped layer 234, a second seed layer 246B, a third booster layer KBL3, a third hafnium oxide layer 245C, and a leakage barrier layer 107 in the recited order.

The doped layer 234 may be disposed between the second hafnium oxide layer 245B and the second seed layer 246B. The doped layer 234 may not separate the crystal grains of the second hafnium oxide layer 245B and the crystal grains of the second seed layer 246B.

The doped layer 234 may be embedded in the second seed layer 246B. In other words, it may be embedded in the bottom surface of the second seed layer 246B which is in contact with the second hafnium oxide layer 245B. Accordingly, the doped layer 234 may be, for example, aluminum-doped tetragonal zirconium oxide or beryllium-doped tetragonal zirconium oxide.

According to another embodiment of the present invention, the doped layer 234 may be embedded on the top surface of the second hafnium oxide layer 245B. Accordingly, the doped layer 234 may be, for example, aluminum-doped tetragonal hafnium oxide or beryllium-doped tetragonal hafnium oxide.

The crystallization of the first to third hafnium oxide layers 245A, 245B, and 245C may be promoted by the first and second seed layers 246A and 246B. The dielectric constant of the first hafnium oxide layer 245A may be boosted by the first booster layer KBL1. The dielectric constant of the second hafnium oxide layer 245B may be boosted by the second booster layer KBL2. The dielectric constant of the third hafnium oxide layer 245C may be boosted by the third booster layer KBL3. The first booster layer KBL1 may be formed under the first hafnium oxide layer 245A. The second booster layer KBL2 may be formed under the second hafnium oxide layer 245B. The third booster layer KBL3 may be formed under the third hafnium oxide layer 245C. The first booster layer KBL1 may directly contact the first hafnium oxide layer 245A. The second booster layer KBL2 may directly contact the second hafnium oxide layer 245B. The third booster layer KBL3 may directly contact the third hafnium oxide layer 245C.

Figure 11D:
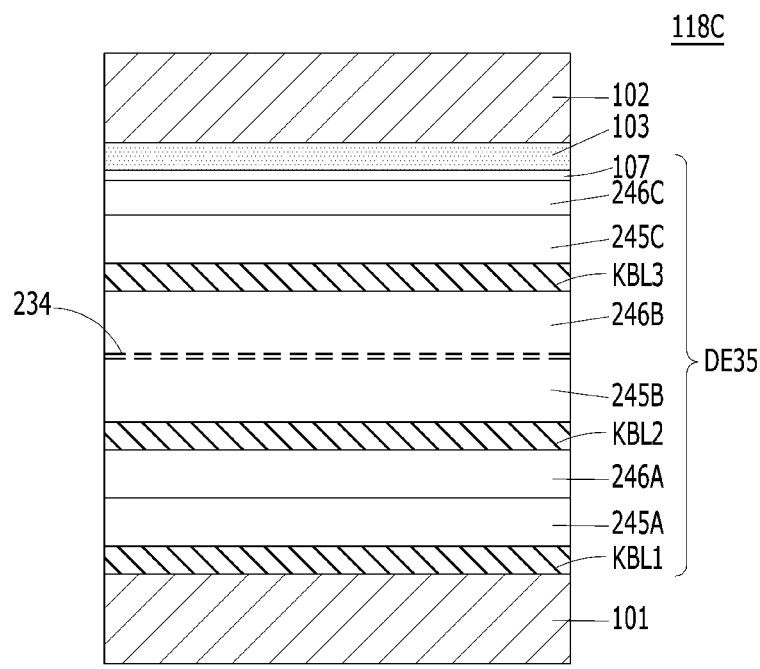

Referring to FIG. 11D, the semiconductor device 118C may include a first electrode 101, a multi-layered stack DE35, a thermal source layer 103, and a second electrode 102.

The multi-layered stack DE35 may be or include a stack of a first booster layer KBL1, a first hafnium oxide layer 245A, a first seed layer 246A, a second booster layer KBL2, a second hafnium oxide layer 245B, a doped layer 234, a second seed layer 246B, a third booster layer KBL3, a third hafnium oxide layer 245C, a third seed layer 246C, and a leakage barrier layer 107 in the recited order.

The doped layer 234 may be disposed between the second hafnium oxide layer 245B and the second seed layer 246B. The doped layer 234 may not separate the crystal grains of the second hafnium oxide layer 245B and the crystal grains of the second seed layer 246B.

The doped layer 234 may be embedded in the second seed layer 246B. In other words, it may be embedded in the bottom surface of the second seed layer 246B which is in contact with the second hafnium oxide layer 245B. Accordingly, the doped layer 234 may be, for example, aluminum-doped tetragonal zirconium oxide or beryllium-doped tetragonal zirconium oxide.

According to another embodiment of the present invention, the doped layer 234 may be embedded on the top surface of the second hafnium oxide layer 245B. Accordingly, the doped layer 234 may be, for example, aluminum-doped tetragonal hafnium oxide or beryllium-doped tetragonal hafnium oxide.

The crystallization of the first to third hafnium oxide layers 245A, 245B, and 245C may be promoted by the first to third seed layers 246A, 246B, and 246C. The dielectric constant of the first hafnium oxide layer 245A may be boosted by the first booster layer KBL1. The dielectric constant of the second hafnium oxide layer 245B may be boosted by the second booster layer KBL2. The dielectric constant of the third hafnium oxide layer 245C may be boosted by the third booster layer KBL3. The first booster layer KBL1 may be formed under the first hafnium oxide layer 245A. The second booster layer KBL2 may be formed under the second hafnium oxide layer 245B. The third booster layer KBL2 may be formed under the third hafnium oxide layer 245C. The first booster layer KBL1 may directly contact the first hafnium oxide layer 245A. The second booster layer KBL2 may directly contact the second hafnium oxide layer 245B. The third booster layer KBL3 may directly contact the third hafnium oxide layer 245C.

Figure 12A:
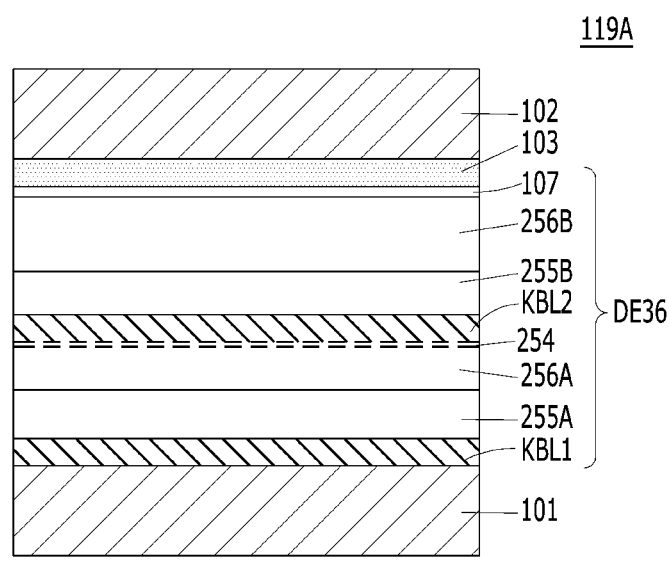

Referring to FIG. 12A, a semiconductor device 119A may include a first electrode 101, a multi-layered stack DE36, a thermal source layer 103, and a second electrode 102.

The multi-layered stack DE36 may be or include a stack of a first booster layer KBL1, a first hafnium oxide layer 255A, a first seed layer 256A, a doped layer 254, a second booster layer KBL2, a second hafnium oxide layer 255B, a second seed layer 256B, and a leakage barrier layer 107 in the recited order.

The second booster layer KBL2 may be disposed between the first seed layer 256A and the second hafnium oxide layer 255B. The doped layer 254 may be disposed between the first seed layer 256A and the second booster layer KBL2. The doped layer 254 may be embedded on the top surface of the first seed layer 256A. Therefore, the second booster layer KBL2 may be disposed between the first seed layer 256A in which the doped layer 254 is embedded and the second hafnium oxide layer 255B. The doped layer 254 may be extremely thinner than the second booster layer KBL2 and the second hafnium oxide layer 255B.

The crystallization of the first and second hafnium oxide layers 255A and 255B may be promoted by the first and second seed layers 256A and 256B. The dielectric constant of the first hafnium oxide layer 255A may be boosted by the first booster layer KBL1. The dielectric constant of the second hafnium oxide layer 255B may be boosted by the second booster layer KBL2. The first booster layer KBL1 may be formed under the first hafnium oxide layer 255A. The second booster layer KBL2 may be formed under the second hafnium oxide layer 255B. The first booster layer KBL1 may directly contact the first hafnium oxide layer 255A. The second booster layer KBL2 may directly contact the second hafnium oxide layer 255B.

Figure 12B:
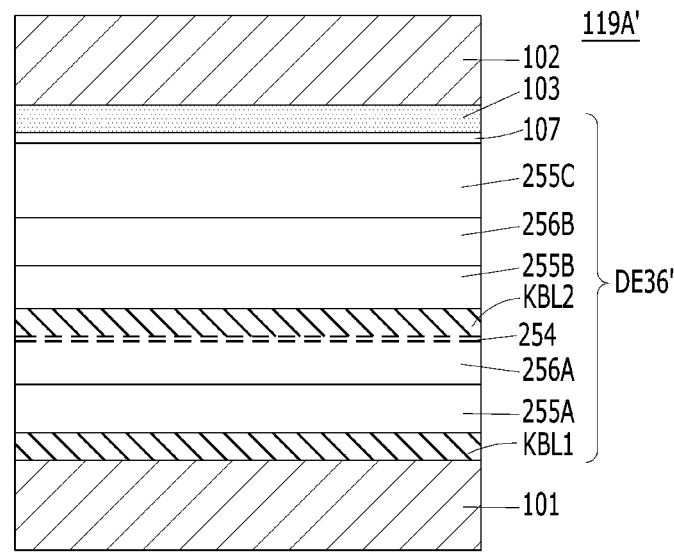

Referring to FIG. 12B, a semiconductor device 119A' may include a first electrode 101, a multi-layered stack DE36', a thermal source layer 103, and a second electrode 102.

The multi-layered stack DE36' may be or include a stack of a first booster layer KBL1, a first hafnium oxide layer 255A, a first seed layer 256A, a doped layer 254, a second booster layer KBL2, a second hafnium oxide layer 255B, a second seed layer 256B, a third hafnium oxide layer 255C, and a leakage barrier layer 107 in the recited order.

The second booster layer KBL2 may be disposed between the first seed layer 256A and the second hafnium oxide layer 255B. The doped layer 254 may be disposed between the first seed layer 256A and the second booster layer KBL2. The doped layer 254 may be embedded on the top surface of the first seed layer 256A. Therefore, the second booster layer KBL2 may be disposed between the first seed layer 256A having a doped layer 254 and the second hafnium oxide layer 255B. The doped layer 254 may be extremely thinner than the second booster layer KBL2 and the second hafnium oxide layer 255B.

The crystallization of the first to third hafnium oxide layers 255A, 255B, and 255C may be promoted by the first and second seed layers 256A and 256B. The dielectric constant of the first hafnium oxide layer 255A may be boosted by the first booster layer KBL1. The dielectric constant of the second hafnium oxide layer 255B may be boosted by the second booster layer KBL2. The first booster layer KBL1 may be formed under the first hafnium oxide layer 255A. The second booster layer KBL2 may be formed under the second hafnium oxide layer 255B. The first booster layer KBL1 may directly contact the first hafnium oxide layer 255A. The second booster layer KBL2 may directly contact the second hafnium oxide layer 255B. According to another embodiment of the present invention, a third booster layer may be further formed between the second seed layer 256B and the third hafnium oxide layer 255C.

Figure 12C:
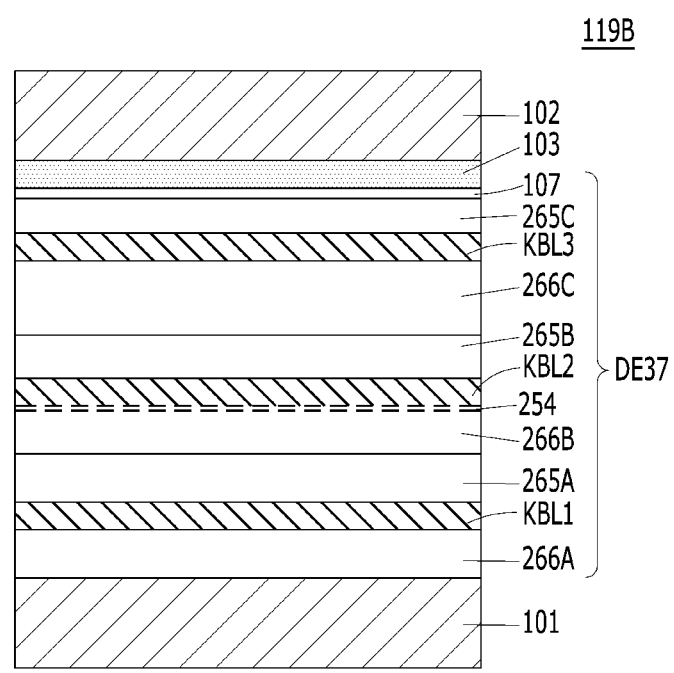

Referring to FIG. 12C, a semiconductor device 119B may include a first electrode 101, a multi-layered stack DE37, a thermal source layer 103, and a second electrode 102.

The multi-layered stack DE37 may be or include a stack of a first seed layer 266A, a first booster layer KBL1, a first hafnium oxide layer 265A, a second seed layer 266B, a doped layer 254, a second booster layer KBL2, a second hafnium oxide layer 265B, a second seed layer 266C, a third booster layer KBL3, a third hafnium oxide layer 265C, and a leakage barrier layer 107 in the recited order.

The second booster layer KBL2 may be disposed between the second seed layer 266B and the second hafnium oxide layer 265B. The doped layer 254 may be disposed between the second seed layer 266B and the second booster layer KBL2. The doped layer 254 may be embedded on the top surface of the second seed layer 266B. Accordingly, the second booster layer KBL2 may be disposed between the second seed layer 266B having a doped layer 254 and the second hafnium oxide layer 265B. The doped layer 254 may be extremely thinner than the second booster layer KBL2 and the second hafnium oxide layer 265B.

The crystallization of the first to third hafnium oxide layers 265A, 265B, and 265C may be promoted by the first to third seed layers 266A, 266B, and 266C. The dielectric constant of the first hafnium oxide layer 265A may be boosted by the first booster layer KBL1. The dielectric constant of the second hafnium oxide layer 265B may be boosted by the second booster layer KBL2. The dielectric constant of the third hafnium oxide layer 265C may be boosted by the third booster layer KBL3. The first booster layer KBL1 may be formed under the first hafnium oxide layer 265A. The second booster layer KBL2 may be formed under the second hafnium oxide layer 265B. The third booster layer KBL3 may be formed under the third hafnium oxide layer 265C. The first booster layer KBL1 may directly contact the first hafnium oxide layer 265A. The second booster layer KBL2 may directly contact the second hafnium oxide layer 265B. The third booster layer KBL3 may directly contact the third hafnium oxide layer 265C.

Figure 13A:
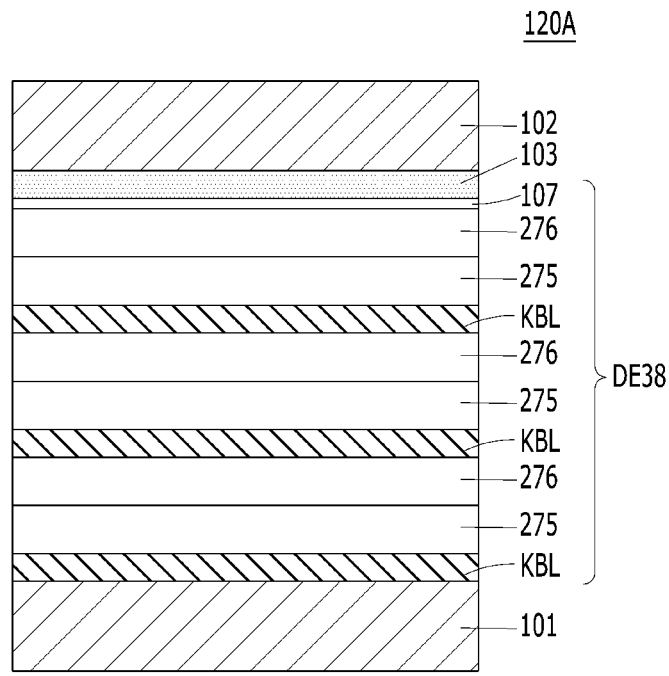

Referring to FIG. 13A, a semiconductor device 120A may include a first electrode 101, a multi-layered stack DE38, a thermal source layer 103, and a second electrode 102.

The multi-layered stack DE38 may be or include a stack of an alternating stack and a leakage barrier layer 107 in the recited order. In the alternating stack, a booster layer KBL, a hafnium oxide layer 275, and a seed layer 276 may be alternately stacked. The booster layer KBL may be formed under each of the hafnium oxide layers 275. The hafnium oxide layer 275 may be disposed between the booster layer KBL and the seed layer 276. In the alternating stack, the booster layer KBL, the hafnium oxide layer 275, and the seed layer 276 may be alternately stacked at least two times. FIG. 13A illustrates a case in which the booster layer KBL, the hafnium oxide layer 275, and the seed layer 276 are alternately stacked three times.

The booster layers KBL may directly contact the hafnium oxide layers 275. The crystallization of the hafnium oxide layers 275 may be promoted by the seed layers 276. The dielectric constant of the hafnium oxide layers 275 may be boosted by the booster layers KBL.

Figure 13B:
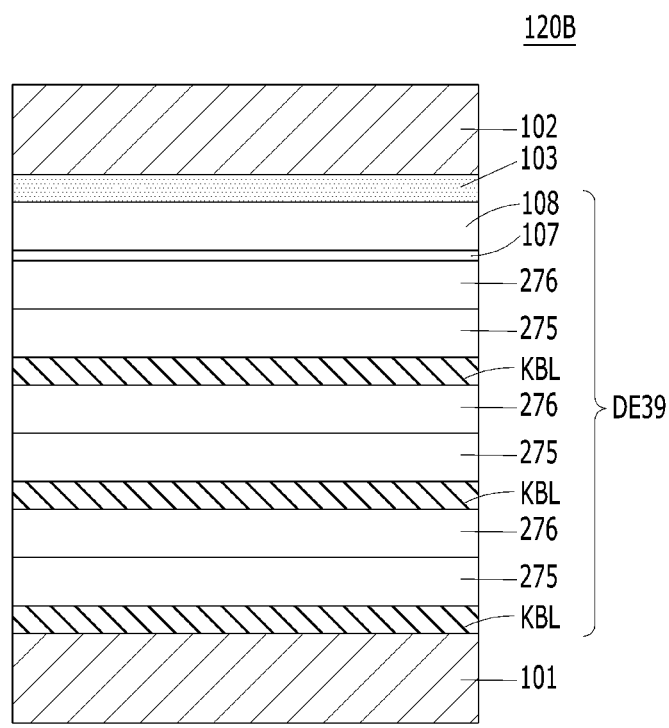

Referring to FIG. 13B, a semiconductor device 120B may include a first electrode 101, a multi-layered stack DE39, a thermal source layer 103, and a second electrode 102.

The multi-layered stack DE39 may be or include a stack of an alternating stack, a leakage barrier layer 107, and an interface control layer 108. In the alternating stack, the booster layer KBL, the hafnium oxide layer 275, and the seed layer 276 may be alternately stacked multiple times. A booster layer KBL may be formed under each of the hafnium oxide layers 275.

The booster layers KBL may directly contact the hafnium oxide layers 275. The crystallization of the hafnium oxide layers 275 may be promoted by the seed layers 276. The dielectric constant of the hafnium oxide layers 275 may be boosted by the booster layers KBL.

Figure 14A:
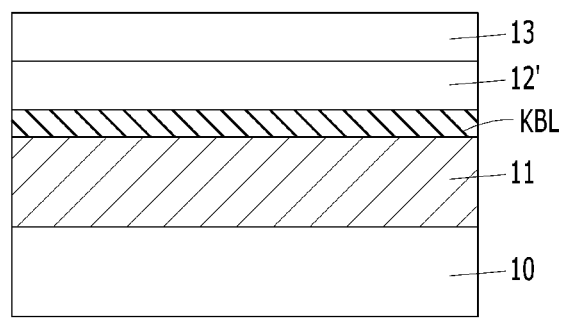
FIGS. 14A and 14B are cross-sectional views illustrating an example of a method for fabricating a semiconductor device.
Figure 14B:
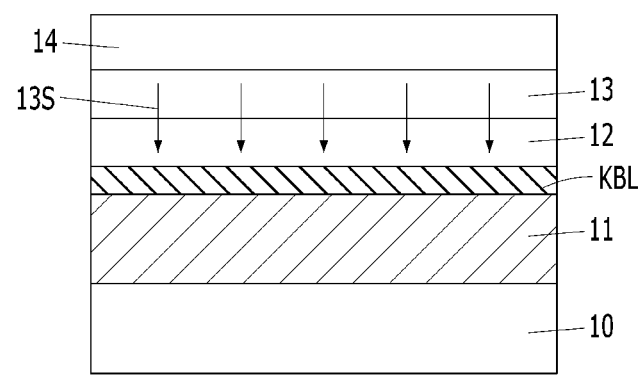

FIGS. 14A and 14B are cross-sectional views illustrating an example of a method for fabricating a semiconductor device.

Referring to FIG. 14A, a first electrode 11 may be formed over the substrate 10, and a booster layer KBL may be formed over the first electrode 11. The booster layer KBL may be formed of niobium oxynitride. The booster layer KBL may be formed by Atomic Layer Deposition (ALD). For example, atomic layer deposition of niobium oxynitride may include a unit cycle which includes supplying a niobium source material, purging, supplying an oxidizing gas, purging, supplying a nitride gas, and purging. A niobium source material may include a cyclopentadienyl (Cp)-based alkyl-amide source or a Cl-based source. The oxidizing gas may include $O_2$ or $O_3$, and the nitriding gas may include $NH_3$, $N_2$ or $N_2/H_2$ plasma. Atomic layer deposition of niobium oxynitride may be carried out at a temperature of approximately 250 to 400° C. at a pressure of approximately 0.5 to 2 Torr.

An initial hafnium oxide layer 12' may be formed over the booster layer KBL. The initial hafnium oxide layer 12' may be deposited by Atomic Layer Deposition (ALD). For example, after loading a substrate 10 on which the first electrode 11 is formed into an atomic layer deposition chamber, the deposition process of the booster layer KBL and the initial hafnium oxide layer 12' may be performed.

The initial hafnium oxide layer 12' may include an amorphous structure, a monoclinic crystal structure, or a mixed crystal structure in which the amorphous structure and the monoclinic crystal structure are uniformly or non-uniformly mixed.

As described above, the initial hafnium oxide layer 12' may be formed to have a non-tetragonal crystal structure.

Subsequently, a seed layer 13 may be formed over the initial hafnium oxide layer 12'. The seed layer 13 may include zirconium oxide. The seed layer 13 may be formed by Atomic Layer Deposition. The seed layer 13 may be thicker than the initial hafnium oxide layer 12'. As described in the above embodiments of the present invention, the seed layer 13 may include a doped layer embedded therein or may not include a doped layer embedded therein.

After the seed layer 13 is formed, the initial hafnium oxide layer 12' may maintain the initial crystal structure without phase transition. Due to the deposition temperature of the seed layer 13, the initial hafnium oxide layer 12' may not be crystallized into a tetragonal crystal structure.

Referring to FIG. 14B, a thermal source layer 14 may be formed over the seed layer 13. The thermal source layer 14 may be formed at a temperature at which the initial hafnium oxide layer 12' may be crystallized into a tetragonal crystal structure. The formation of the thermal source layer 14 may provide the thermal energy needed to the initial hafnium oxide layer 12' to cause a phase transition of the initial hafnium oxide layer 12'. The thermal source layer 14 may be formed by Atomic Layer Deposition (ALD) at a low temperature of approximately 500° C. or less. For example, when the thermal source layer 14 is deposited, low-temperature thermal energy may be provided to the substrate 10, and the initial hafnium oxide layer 12' may be crystallized into a tetragonal crystal structure by the low-temperature thermal energy, which is provided to the substrate 10, and the seed layer 13. The seed layer 13 may also be crystallized into a tetragonal crystal structure by the low-temperature process.

Although not shown, after the formation of the thermal source layer 14, a second electrode (not shown) may be formed over the thermal source layer 14. According to another embodiment of the present invention, the thermal source layer 14 may serve as a second electrode. According to another embodiment of the present invention, a leakage barrier layer and an interface control layer may be further formed prior to the formation of the thermal source layer 14.

Figure 15A:
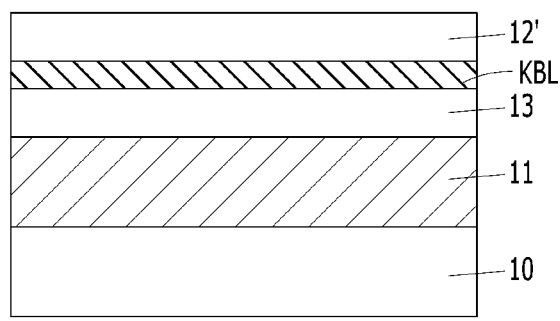
FIGS. 15A and 15B are cross-sectional views illustrating another example of a method for fabricating a semiconductor device.
Figure 15B:
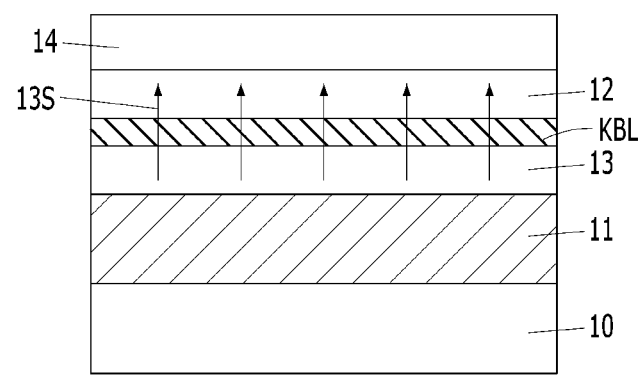

FIGS. 15A and 15B are cross-sectional views illustrating another example of a method for fabricating a semiconductor device.

Referring to FIG. 15A, the first electrode 11 may be formed over the substrate 10, the seed layer 13 may be formed over the first electrode 11, and the seed layer 13 may be formed by Atomic Layer Deposition (ALD). For example, a deposition process of the seed layer 13 may be performed after loading the substrate 10 with the first electrode 11 formed thereon into an atomic layer deposition chamber. The seed layer 13 may be or include tetragonal zirconium oxide.

The booster layer KBL and the initial hafnium oxide layer 12' may be formed over the seed layer 13. The booster layer KBL and the initial hafnium oxide layer 12' may be deposited by Atomic Layer Deposition (ALD). The initial hafnium oxide layer 12' may include an amorphous structure, a monoclinic crystal structure, or a mixed crystal structure in which the amorphous structure and the monoclinic crystal structure are uniformly or non-uniformly mixed.

As described above, the initial hafnium oxide layer 12' may be formed to have a non-tetragonal crystal structure.

Although the initial hafnium oxide layer 12' is deposited over the booster layer KBL, the initial hafnium oxide layer 12' may maintain the initial crystal structure without phase transition. The seed layer 13 may be thicker than the initial hafnium oxide layer 12'. As described in the above embodiments of the present invention, the seed layer 13 may be formed with a doped layer embedded therein or may not be formed with a doped layer embedded therein.

Referring to FIG. 15B, a thermal source layer 14 may be formed over the initial hafnium oxide layer 12'. The thermal source layer 14 may be formed at a temperature at which the initial hafnium oxide layer 12' may be crystallized into a tetragonal crystal structure. The thermal source layer 14 may provide thermal energy that may cause a phase transition of the initial hafnium oxide layer 12'. The thermal source layer 14 may be formed by Atomic Layer Deposition (ALD) at a low temperature of approximately 500° C. or less. For example, when the thermal source layer 14 is deposited, a low-temperature thermal energy may be provided to the substrate 10, and the initial hafnium oxide layer 12' may be crystallized into a tetragonal crystal structure by a low-temperature thermal energy, which is provided to the substrate 10, and the seed layer 13. The seed layer 13 may also be crystallized into a tetragonal crystal structure by a low-temperature thermal energy, which is provided to the substrate 10.

Although not shown, after the formation of the thermal source layer 14, a second electrode (not shown) may be formed over the thermal source layer 14. According to another embodiment of the present invention, the thermal source layer 14 may serve as a second electrode. According to another embodiment of the present invention, a leakage barrier layer and an interface control layer may be further formed prior to the formation of the thermal source layer 14.

Referring to FIGS. 14A to 15B, when the thermal source layer 14 is formed, the crystallization of the initial hafnium oxide layer 12' may be accelerated by the seed layer 13 and thus the initial hafnium oxide layer 12' may be crystallized into a tetragonal hafnium oxide layer 12.

The crystallinity of the hafnium oxide layer 12 may also depend on the thickness of the thermal source layer 14. The thermal source layer 14 may have a thickness of approximately 20 to 60 Å.

As described above, when the thermal source layer 14 is deposited, the seed layer 13 may sufficiently crystallize the initial hafnium oxide layer 12' into a tetragonal crystal structure. In addition, the dielectric constant of the hafnium oxide layer 12 may be boosted by the booster layer KBL.

The stack of the seed layer 13 and the initial hafnium oxide layer 12' may be obtained by various methods. For example, a single seed layer 13 may be formed between two initial hafnium oxide layers 12'. A single layer of the initial hafnium oxide layer 12' may be formed between two seed layers 13. A plurality of the seed layers 13 and a plurality of the initial hafnium oxide layers 12' may be alternately stacked.

Figure 16A:
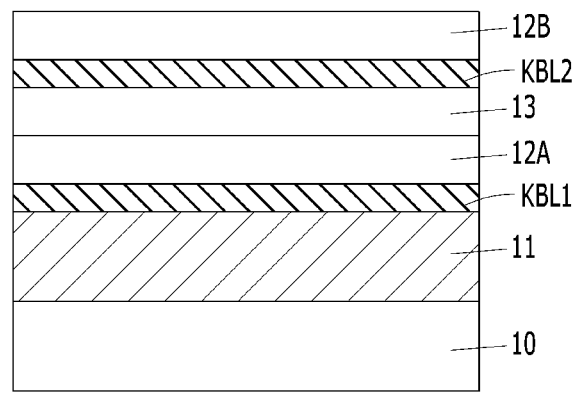
FIGS. 16A and 16B are cross-sectional views illustrating yet another example of a method for fabricating a semiconductor device.
Figure 16B:
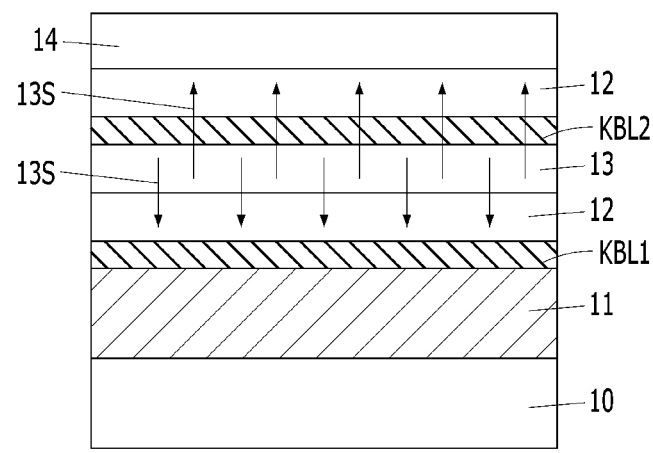

FIGS. 16A and 16B are cross-sectional views illustrating another example of a method for fabricating a semiconductor device.

Referring to FIG. 16A, a first electrode 11 may be formed over a substrate 10, and a first booster layer KBL1, a first initial hafnium oxide layer 12A, and a seed layer 13, a second booster layer KBL2, and a second initial hafnium oxide layer 12B may be sequentially formed over the first electrode 11. The first booster layer KBL1, the first initial hafnium oxide layer 12A, the seed layer 13, the second booster layer KBL2, and the second initial hafnium oxide layer 12B may be formed by Atomic Layer Deposition (ALD). For example, after loading the substrate 10 with the first electrode 11 formed thereon into an atomic layer deposition chamber, the atomic layer depositions of the first booster layer KBL1, the first initial hafnium oxide layer 12A, the seed layer 13, and the second booster layer KBL2, and the second initial hafnium oxide layer 12B may be performed. The seed layer 13 may be thicker than the first and second initial hafnium oxide layers 12A and 12B. As described in the above-described embodiments of the present invention, the seed layer 13 may be formed with a doped layer embedded therein or may be formed without a doped layer embedded therein.

The first and second initial hafnium oxide layers 12A and 12B may include an amorphous structure, a monoclinic crystal structure, or a mixed crystal structure in which the amorphous structure and the monoclinic crystal structure are uniformly or non-uniformly mixed.

As described above, the first and second initial hafnium oxide layers 12A and 12B may have a non-tetragonal crystal structure. The seed layer 13 may be made of a material having a tetragonal crystal structure.

Referring to FIG. 16B, a thermal source layer 14 may be formed over a second initial hafnium oxide layer 12B. The thermal source layer 14 may be formed at a temperature at which the first and second initial hafnium oxide layers 12A and 12B may be crystallized into a tetragonal crystal structure. Thermal source layer 14 may provide thermal energy that may cause phase transition of first and second initial hafnium oxide layers 12A and 12B. The thermal source layer 14 may be formed by Atomic Layer Deposition (ALD) at a low temperature of approximately 500° C. or less. For example, a low-temperature thermal energy may be provided to the substrate 10 upon deposition of the thermal source layer 14, and the first and second initial hafnium oxide layers 12A and 12B may be crystallized into a tetragonal crystal structure by the low-temperature thermal energy, which is provided to the substrate 10, and the seed layers 13. The seed layer 13 may also be crystallized into a tetragonal crystal structure by the low-temperature thermal provided to the substrate 10.

Although not illustrated, after the formation of the thermal source layer 14, a second electrode may be formed over the thermal source layer 14.

Referring to FIG. 16B, when the thermal source layer 14 is formed, the crystallization of the first and second initial hafnium oxide layers 12A and 12B may be promoted by the seed layer 13 (See reference numeral 13S). Thus, the first and second initial hafnium oxide layers 12A and 12B may be crystallized into a tetragonal hafnium oxide layer 12. Also, the dielectric constant of the hafnium oxide layer 12 may be boosted by the first and second booster layers KBL1 and KBL2.

In FIGS. 14A to 16B, the thermal source layer 14 may have a strong tensile stress. For example, it may have a tensile stress of approximately 0.5 GPa to 2.0 Gpa. The strong tensile stress may promote the crystallization of the tetragonal hafnium oxide layer 12.

Figure 17A:
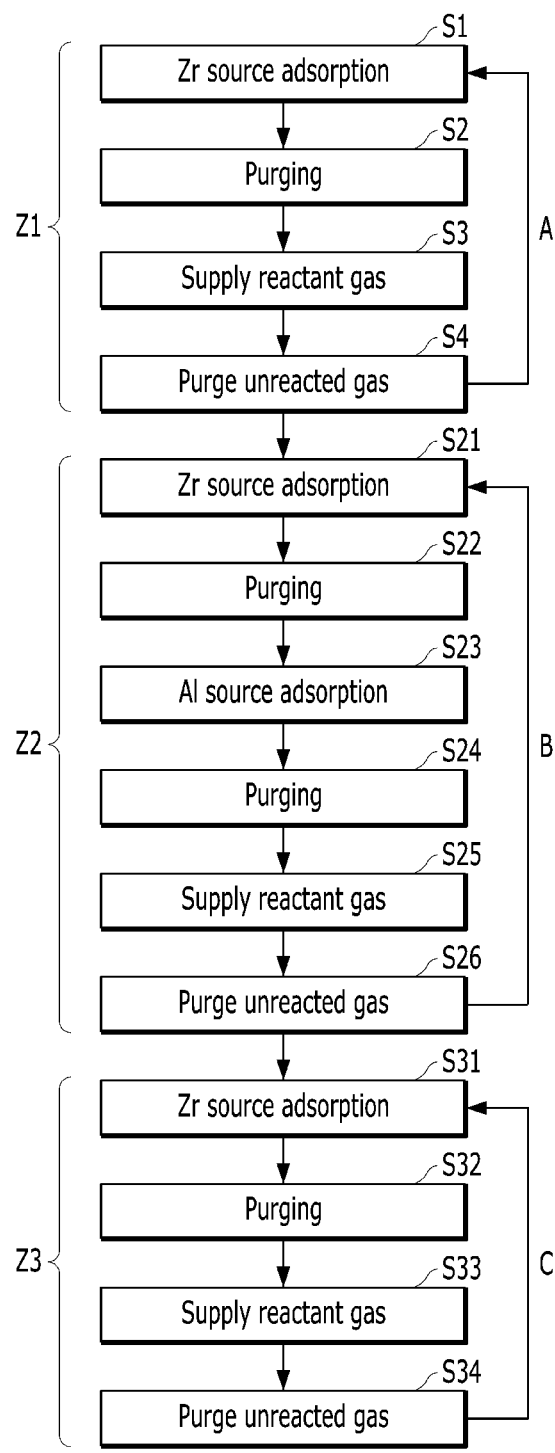
FIGS. 17A and 17B are flowcharts describing an example of a method for forming a seed layer shown in FIGS. 14A to 16B.
Figure 17B:
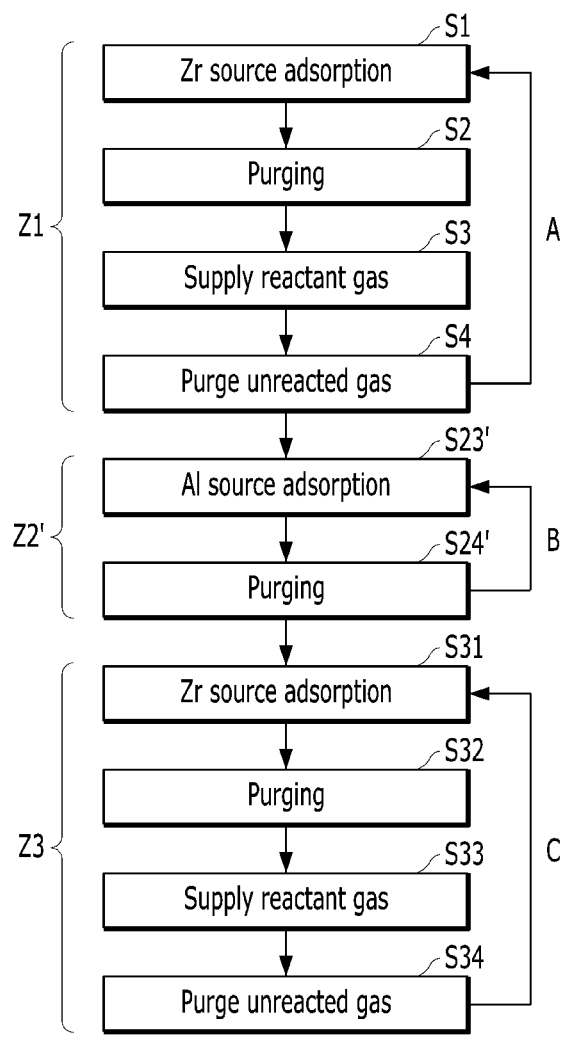

FIGS. 17A and 17B are flowcharts describing an example of a method for forming a seed layer shown in FIGS. 14A to 16B. A seed layer 13 may be a zirconium oxide layer, and the zirconium oxide layer may be formed by Atomic Layer Deposition (ALD). The seed layer 13 may correspond to the seed layer 106 of FIG. 2B. The seed layer 13 may include a doped layer embedded therein. The seed layer 13 may include a 'Z-AZ-Z stack' in which a first zirconium oxide layer, an aluminum-doped zirconium oxide layer, and a second zirconium oxide layer are sequentially stacked. The Z-AZ-Z stack may be different from a Z-A-Z stack in which a first zirconium oxide layer, an aluminum oxide layer, and a second zirconium oxide layer are sequentially stacked. In the Z-AZ-Z stack, the crystal grains of the first zirconium oxide layer and the crystal grains of the second zirconium oxide layer may not be separated by the aluminum-doped zirconium oxide layer. In contrast, in the Z-A-Z stack, the crystal grains of the first zirconium oxide layer and the crystal grains of the second zirconium oxide layer may be separated by the aluminum oxide layer.

Referring to FIG. 17A, the atomic layer deposition method of the Z-AZ-Z stack is as follows.

The atomic layer deposition of the Z-AZ-Z stack may be performed by repeating a plurality of cycles at approximately 250° C. to 380° C. Herein, the plurality of cycles may include a first cycle Z1 for depositing a first zirconium oxide layer, a second cycle Z2 for depositing an aluminum-doped zirconium oxide layer, and a third cycle Z3 for depositing a second zirconium oxide layer. The first cycle Z1 may be repeatedly performed A times to deposit the first zirconium oxide layer, and the second cycle Z2 may be repeatedly performed B times to deposit the aluminum-doped zirconium oxide layer. The third cycle Z3 may be repeatedly performed C times to deposit the second zirconium oxide layer. Herein, A, B and C may be different natural numbers, and B may be smaller than A and C. For example, B may be a number between 1 and 10, and A and C may be greater than 10. A and C may be the same to deposit the first zirconium oxide layer and the second zirconium oxide layer in the same thickness. According to another embodiment of the present invention, C may be larger than A to deposit the second zirconium oxide layer thicker than the first zirconium oxide layer.

The first cycle Z1, the second cycle Z2, and the third cycle Z3 may be performed at approximately 250° C. to 380° C., thereby easily depositing the seed layer 13 having a tetragonal crystal structure.

The first cycle Z1 may include a Zr source adsorption step S1, a purging step S2, a reactant gas supplying step S3, and an unreacted gas purging step S4. The first cycle Z1 may be repeated A times. An undoped first zirconium oxide layer may be deposited by the first cycle Z1.

The second cycle Z2 may include a Zr source adsorption step S21, a purging step S22, an Al source adsorption step S23, a purging step S24, a reactant gas supplying step S25, and an unreacted gas purging step S26. The second cycle Z2 may be repeatedly performed B times. An aluminum-doped zirconium oxide layer may be deposited by the second cycle Z2.

The third cycle Z3 may include a Zr source adsorption step S31, a purging step S32, a reactant gas supplying step S33, and an unreacted gas purging step S34, and the third cycle Z3 may be repeatedly performed C times. The undoped second zirconium oxide layer may be deposited by the third cycle Z3.

In the first cycle Z1, the second cycle Z2, and the third cycle Z3, the Zr source may include TEMAZ (Tetrakis EthylMethylAmino Zirconium) and TDMAZ (Tetrakis DiMethylAmino Zirconium), and the Al source may include TMA (Tri Methyl Aluminum), and the reactant gas may include an oxidizing agent. The oxidizing agent may include $O_3$, $O_2$, $H_2O$, $H_2O_2$, $O_2$ plasma, or a combination thereof. When ozone ($O_3$) is used as the oxidizing agent, the concentration and flow rate of ozone may be optimized and supplied. For example, ozone is used in a concentration ranging from approximately 50 $g/m^3$ to 310 $g/m^3$, the flow rate of ozone may be in the range of approximately 100 sccm to 5000 sccm. The purging step may be sufficiently long in the range of approximately 1 second to 100 seconds.

A structure in which aluminum (Al) is doped in the zirconium oxide layer may be obtained by the first cycle Z1, the second cycle Z2, and the third cycle Z3.

Referring to FIG. 17B, another embodiment of the present invention is described, wherein the second cycle Z2' may include only an Al source adsorption step S23' and a purging step S24'. For example, after the first zirconium oxide layer is deposited by the first cycle Z1, the Al source adsorption step S23' and the purging step S24' may be repeatedly performed a predetermined number of times to adsorb aluminum on the surface of the first zirconium oxide layer, and then a second zirconium oxide layer may be deposited by performing the third cycle Z3. Even when aluminum is adsorbed as described above, the crystal grains of the first zirconium oxide layer and the crystal grains of the second zirconium oxide layer may not be separated.

The first cycle Z1 or the third cycle Z3 may be used for depositing a seed layer without a doped layer embedded therein.

Figure 18A:
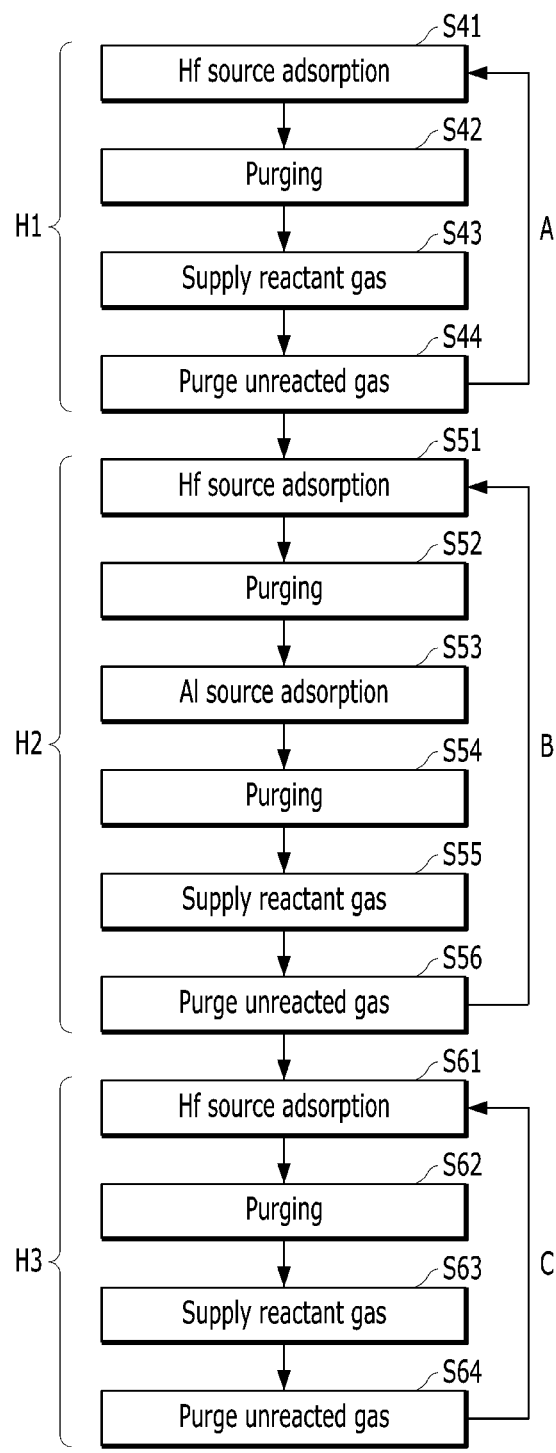
FIG. 18A is a flowchart describing an example of a method for forming an initial hafnium oxide layer shown in FIGS. 14A to 16B.

FIG. 18A is a flowchart describing an example of a method for forming an initial hafnium oxide layer shown in FIGS. 14A to 16B.

Referring to FIG. 18A, the initial hafnium oxide layer 12' may be a hafnium oxide layer with a doped layer embedded therein. The initial hafnium oxide layer 12' may be formed by Atomic Layer Deposition (ALD). The initial hafnium oxide layer 12' may include an 'H-AH-H stack' in which the first hafnium oxide layer, the doped layer, and the second hafnium oxide layer are sequentially stacked. The H-AH-H stack may be different from the H-A-H stack in which the first hafnium oxide layer, the aluminum oxide layer, and the second hafnium oxide layer are sequentially stacked. In the H-AH-H stack, the crystal grains of the first hafnium oxide layer and the crystal grains of the second hafnium oxide layer are not separated by an aluminum-doped hafnium oxide layer. In contrast, in the H-A-H stack, the crystal grains of the first hafnium oxide layer and the crystal grains of the second hafnium oxide layer are separated by the aluminum oxide layer.

Referring to FIG. 18A, the atomic layer deposition method of the H-AH-H stack as a hafnium oxide layer with a doped layer embedded therein is described as follows.

Atomic layer deposition of the H-AH-H stack may be performed by repeating a plurality of cycles at approximately 250° C. to 380° C. Herein, the plurality of cycles may include a first cycle H1 for depositing a first hafnium oxide layer, a second cycle H2 for depositing an aluminum-doped hafnium oxide layer, and a third cycle H3 for depositing a second hafnium oxide layer. The first cycle H1 may be repeatedly performed A times to deposit a first hafnium oxide layer, and the second cycle H2 may be repeatedly performed B times to deposit an aluminum-doped hafnium oxide layer. The third cycle H3 may be repeatedly performed C times to deposit a second hafnium oxide layer. Herein, A, B and C may be different natural numbers, and B may be smaller than A and C. For example, B may be a number between 1 and 10, and A and C may be greater than 10. The A and C may be made the same to deposit the first hafnium oxide layer and the second hafnium oxide layer in the same thickness. According to another embodiment of the present invention, A may be made larger than C to deposit the first hafnium oxide layer thicker than the second hafnium oxide layer.

The first cycle H1, the second cycle H2, and the third cycle H3 may be performed at approximately 250° C. to 380° C., thereby easily depositing the hafnium oxide layer.

The first cycle H1 may include an Hf source adsorption step S41, a purging step S42, a reactant gas supplying step S43, and an unreacted gas purging step S44, and the first cycle H1 may be repeatedly performed A times. An undoped first hafnium oxide layer may be deposited by the first cycle H1.

The second cycle H2 may include an Hf source adsorption step S51, a purging step S52, an Al source adsorption step S53, a purging step S54, a reactant gas supplying step S55, and an unreacted gas purging step S56, and the second cycle H2 may be repeated B times. An aluminum-doped hafnium oxide layer may be deposited by the second cycle H2.

The third cycle H3 may include an Hf source adsorption step S61, a purging step S62, a reactant gas supplying step S63, and an unreacted gas purging step S64. The third cycle H3 may be repeated C times. An undoped second hafnium oxide layer may be deposited by the third cycle H3.

In the first cycle H1, the second cycle H2, and the third cycle H3, the Hf source may include TEMAH (Tetrakis EthylMethylAmino Hafnium), TDEAH (Tetrakis DiEthylAmino Hafnium), TDMAH (Tetrakis DiMethylAmino Hafnium), and the like. Also, the Al source may include TMA (Tri Methyl Aluminum), and the reactant gas may include an oxidizing agent. The oxidizing agent may include $O_3$, $O_2$, $H_2O$, $H_2O_2$, $O_2$ plasma, or a combination thereof. When ozone ($O_3$) is used as the oxidizing agent, the concentration and flow rate of ozone may be optimized and supplied. For example, the ozone may be used in a concentration ranging from approximately 50 g/m$^3$ to 310 g/m$^3$, and the flow rate of ozone may be in the range of approximately 100 sccm to 5000 sccm. The purging step may be sufficiently long in the range of approximately 1 second to 100 seconds.

A structure doped in which aluminum (Al) doped in the hafnium oxide layer may be obtained by the first cycle H1, the second cycle H2, and the third cycle H3.

The first cycle H1 or the third cycle H3 may be used for depositing the initial hafnium oxide layer without a doped layer embedded therein.

According to another embodiment of the present invention, the second cycle H2 may include only an Al source adsorption step S53 and a purging step S54. For example, after the first hafnium oxide layer is deposited by the first cycle H1, only the Al source adsorption step S53 and the purging step S54 may be repeatedly performed a predetermined number of times to adsorb aluminum onto the surface of the first hafnium oxide layer. Then, a second hafnium oxide layer may be deposited by performing the third cycle H3. Even when aluminum is adsorbed, the crystal grains of the first hafnium oxide layer and the crystal grains of the second hafnium oxide layer may not be separated.

Figure 18B:
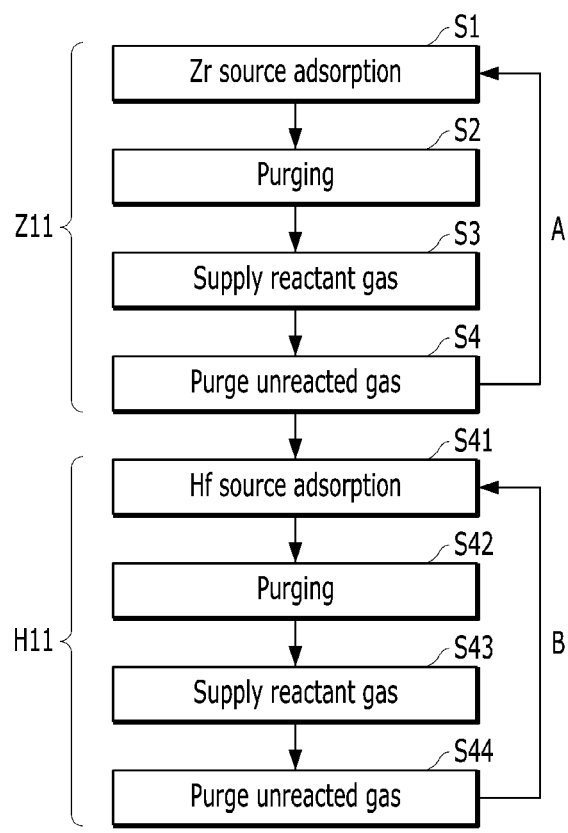
FIG. 18B is a flowchart describing an example of a method for forming a stack of the seed layer and the initial hafnium oxide layer shown in FIGS. 14A to 16B.

FIG. 18B is a flowchart describing an example of a method for forming a stack of the seed layer and the initial hafnium oxide layer shown in FIGS. 14A to 16B. FIG. 18B illustrates an atomic layer deposition method of a Z-H stack as a stack of the seed layer and the initial hafnium oxide layer.

Atomic layer deposition of the Z-H stack may be performed by repeating a plurality of cycles at approximately 250° C. to 380° C. Herein, the plurality of cycles may include a first cycle Z11 for depositing a zirconium oxide layer as the seed layer 13, and a second cycle H11 for depositing the initial hafnium oxide layer 12'. The zirconium oxide layer may be deposited by repeating the first cycle Z11 A times, and the initial hafnium oxide layer may be deposited by repeatedly performing the second cycle H11 B times.

The first cycle Z11 may include a Zr source adsorption step S1, a purging step S2, a reactant gas supplying step S3, and an unreacted gas purging step S4. The first cycle Z11 may be repeated A times. The undoped zirconium oxide layer may be deposited by the first cycle Z11. According to another embodiment of the present invention, after the first cycle Z11, the second cycle Z2 of FIG. 17A or the second cycle Z2' of FIG. 17B may be performed. As a result, an aluminum-doped zirconium oxide layer may be deposited.

The second cycle H11 may include an Hf source adsorption step S41, a purging step S42, a reactant gas supplying step S43, and an unreacted gas purging step S44. The second cycle H11 may be repeated B times. An undoped hafnium oxide layer may be deposited by the second cycle H11.

According to another embodiment of the present invention, after the first cycle Z11, the second cycle Z2 of FIG. 17A or the second cycle Z2' of FIG. 17B may be performed to deposit an aluminum-doped zirconium oxide layer.

According to another embodiment of the present invention, the second cycle $H_2$ of FIG. 18A may be performed before the second cycle H11 is performed. As a result, an aluminum-doped hafnium oxide layer may be deposited.

Although not shown, in FIGS. 18A and 18B, a cycle for depositing a booster layer KBL may be performed before the cycle H1 and H11 for depositing a hafnium oxide layer.

The dielectric layer stacks according to the above-described embodiments of the present invention may be formed by combining the cycles shown in FIGS. 17A to 18B. For example, a stack of the first hafnium oxide layer 105A, the seed layer 106 having the doped layer 104, and the second hafnium oxide layer 105B shown in FIG. 4A may be formed. The initial hafnium oxide layer of the first hafnium oxide layer 105A and the second hafnium oxide layer 105B may be deposited by performing the first cycle H1 of FIG. 18A, and the seed layer 106 in which the doped layer 104 is embedded may be deposited by performing the first to third cycles Z1 to Z3 of FIG. 17A.

Figure 19A:
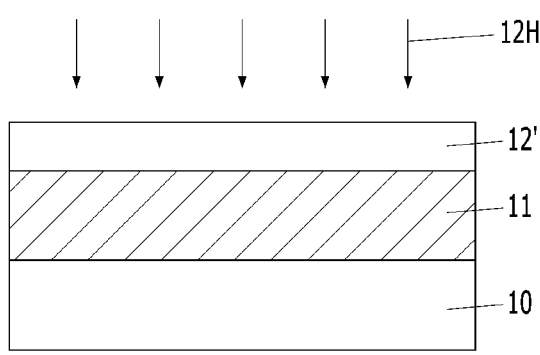
FIGS. 19A and 19B are cross-sectional views illustrating a method for crystallizing an initial hafnium oxide according to comparative examples.
Figure 19B:
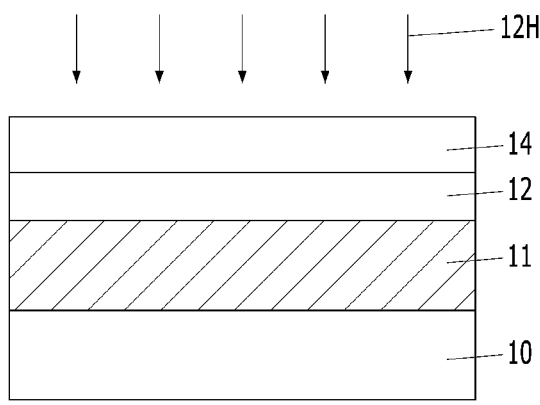

FIGS. 19A and 19B are cross-sectional views illustrating a method for crystallizing an initial hafnium oxide according to comparative examples. The initial hafnium oxide layer 12' according to the comparative examples may be deposited by Atomic Layer Deposition (ALD) and it may be a single hafnium oxide layer ($HfO_2$) without a seed layer 13.

Referring to FIG. 19A, in Comparative Example 1 without a seed layer 13 and a thermal source layer 14, a high-temperature thermal treatment (12H) of approximately 900° C. or higher may be additionally required to crystallize the initial hafnium oxide layer 12' into tetragonal hafnium oxide. Even though the high-temperature thermal treatment 12H is performed, the initial hafnium oxide layer 12' is hardly crystallized into pure tetragonal hafnium oxide. In other words, after the high temperature thermal treatment 12H, the initial hafnium oxide layer 12' may be crystallized not into a pure tetragonal crystal structure but into a tetragonal crystal structure and a monoclinic crystal structure that are mixed together. Also, even when the high-temperature thermal treatment 12H is performed, it may be stabilized into the monoclinic crystal structure which has a relatively lower dielectric constant than the tetragonal crystal structure. Also, a quick quenching process of approximately 1 ms or less is required after the high-temperature thermal treatment.

Referring to FIG. 19B, in Comparative Example 2 without the seed layer 13, it is difficult to sufficiently crystallize the initial hafnium oxide layer 12' into tetragonal hafnium oxide with the deposition of the thermal source layer 14. Therefore, in Comparative Example 2, in order to crystallize the initial hafnium oxide layer 12' into the tetragonal hafnium oxide, the high-temperature thermal treatment 12H of approximately 900° C. or higher may be required after the deposition of the thermal source layer 14. In Comparative Example 2 unlike the Comparative Example 1, the initial hafnium oxide layer 12' may be crystallized into a hafnium oxide layer 12 having a pure tetragonal crystal structure by the thermal source layer 14 and the high-temperature thermal treatment 12H. However, Comparative Example 2 may deteriorate the characteristics of a capacitor and peripheral structures by the high-temperature thermal treatment 12H.

As described above, it is difficult to form pure tetragonal hafnium oxide with a single hafnium oxide.

According to the embodiments of the present invention, the seed layer 13 and the thermal source layer 14 may be applied, and the seed layer 13 and the initial hafnium oxide layer 12' may be formed to directly contact each other. Accordingly, when the thermal source layer 14 is deposited, the initial hafnium oxide layer 12' may be sufficiently crystallized into the hafnium oxide layer 12.

According to the embodiments of the present invention, the hafnium oxide layer 12 having a pure tetragonal crystal structure at a low temperature may be formed without performing a high-temperature thermal treatment. The hafnium oxide layer 12 having a pure tetragonal crystal structure may have a high dielectric constant of approximately 60 or more.

The dielectric constant of the hafnium oxide layer 12 having the pure tetragonal crystal structure may be greater than the dielectric constant (approximately 40) of the tetragonal zirconium oxide. As a result, the capacitance of a capacitor may be increased.

Also, since the hafnium oxide layer 12 is formed at a low temperature, the characteristics of a capacitor and peripheral structures may not be deteriorated.

Figure 20A:
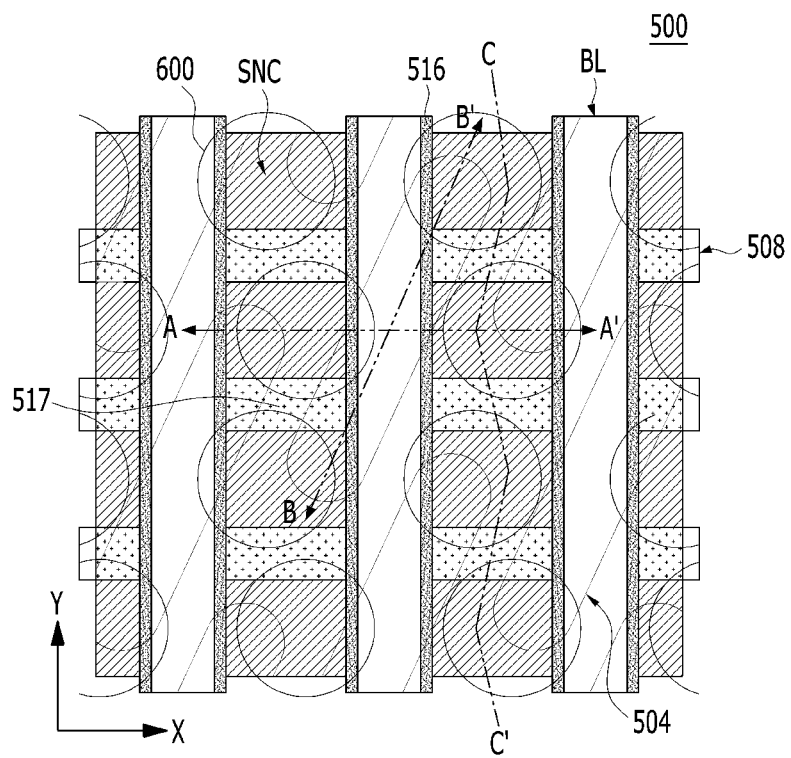
FIGS. 20A to 20C illustrate memory cells.
Figure 20B:
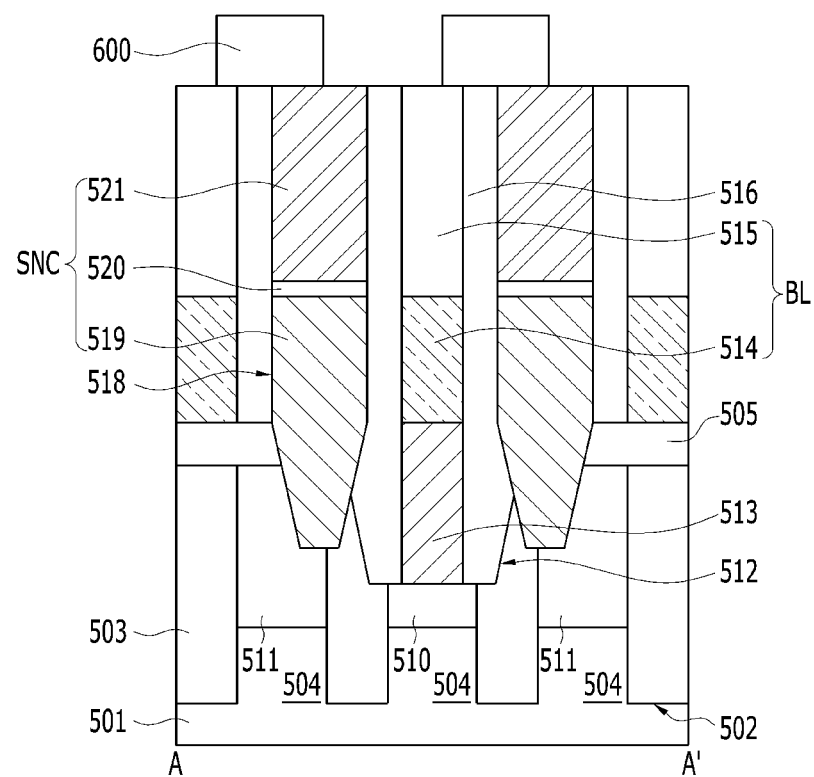
Figure 20C:
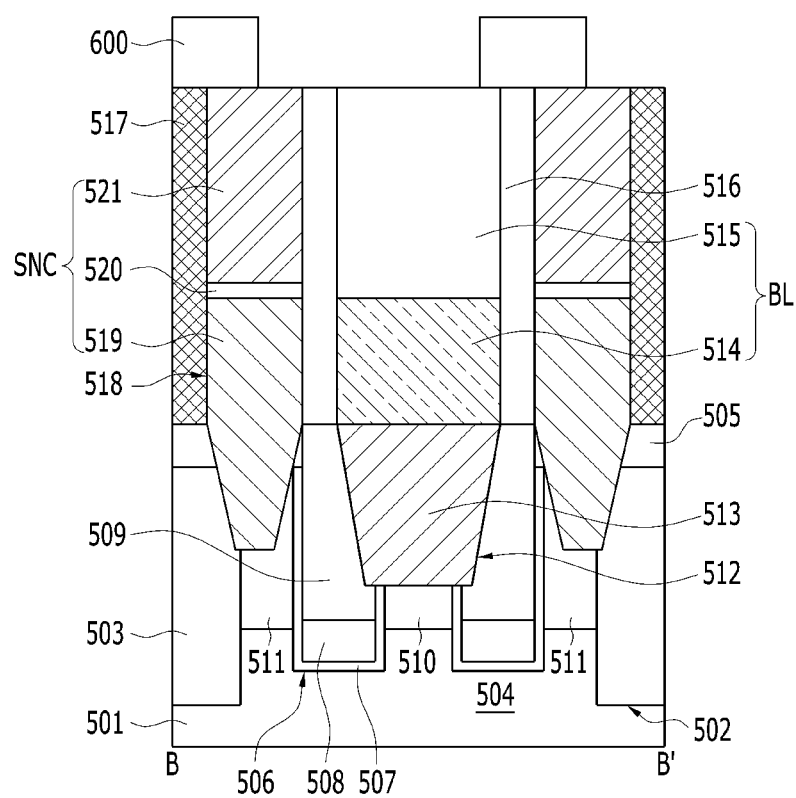

FIGS. 20A to 20C illustrate memory cells. FIG. 20B is a cross-sectional view taken along a line A-A' of FIG. 20A. FIG. 20C is a cross-sectional view taken along a line B-B' of FIG. 20A.

A memory cell 500 may include a cell transistor including a buried word line 508, a bit line 514, and a capacitor 600. The capacitor 600 may include a dielectric layer stack, which may include one among the dielectric layer stacks of the above-described embodiments of the present invention.

The memory cell 500 will be described in detail below.

An isolation layer 503 and an active region 504 may be formed in a substrate 501. A plurality of active regions 504 may be defined by the isolation layer 503. The substrate 501 may be made of a material suitable for semiconductor processing. The substrate 501 may include a semiconductor substrate. The substrate 501 may be formed of a material containing silicon. The substrate 501 may be or include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 501 may include other semiconductor materials such as germanium. The substrate 501 may include a III/V-group semiconductor substrate, for example, a compound semiconductor substrate, such as GaAs. The substrate 501 may be or include a silicon-On-Insulator (SOI) substrate. The isolation layer 503 may be formed in an isolation trench 502 by a Shallow Trench Isolation (STI) process.

A word line trench 506 may be formed in the substrate 501. The word line trench 506 may be referred to as a gate trench. A gate dielectric layer 507 may be formed on the surface of the word line trench 506. A buried word line 508 may be formed over the gate dielectric layer 507 to partially fill the word line trench 506. The buried word line 508 may be referred to as a buried gate electrode. A word line capping layer 509 may be formed over the buried word line 508. The top surface of the buried word line 508 may be lower than the surface of the substrate 501. The buried word line 508 may be a low-resistance metal material. In the buried word line 508, titanium nitride and tungsten may be sequentially stacked. According to another embodiment of the present invention, the buried word line 508 may be formed of titanium nitride alone (TiN only).

First and second impurity regions 510 and 511 may be formed in the substrate 501. The first and second impurity regions 510 and 511 may be spaced apart from each other by the word line trench 506. The first and second impurity regions 510 and 511 may be referred to as first and second source/drain regions. The first and second impurity regions 510 and 511 may include an N-type impurity, such as arsenic (As) or phosphorus (P). As a result, the buried word line 508 and the first and second impurity regions 510 and 511 may be a cell transistor. The cell transistor may improve a short channel effect by the buried word line 508.

A bit line contact plug 513 may be formed over the substrate 501. The bit line contact plug 513 may be coupled to the first impurity region 510. The bit line contact plug 513 may be disposed in the bit line contact hole 512. The bit line contact hole 512 may be formed in a hard mask layer 505. The hard mask layer 505 may be formed over the substrate 501. The bit line contact hole 512 may expose the first impurity region 510. The bottom surface of the bit line contact plug 513 may be lower than the top surface of the substrate 501. The bit line contact plug 513 may be formed of polysilicon or a metal material. A portion of the bit line contact plug 513 may have a line width which is smaller than the diameter of the bit line contact hole 512. A bit line 514 may be formed over the bit line contact plug 513. A bit line hard mask 515 may be formed over the bit line 514. The stacked structure of the bit line 514 and the bit line hard mask 515 may be referred to as a bit line structure BL. The bit line 514 may have a line shape extending in a direction intersecting with the buried word line 508. A portion of the bit line 514 may be coupled to the bit line contact plug 513. The bit line 514 may be or include a metal material. The bit line hard mask 515 may include a dielectric material.

The bit line spacer 516 may be formed on a sidewall of the bit line structure BL. The bottom portion of the bit line spacer 516 may extend to be formed on both sidewalls of the bit line contact plug 513. The bit line spacer 516 may be or include silicon oxide, silicon nitride, or a combination thereof. According to another embodiment of the present invention, the bit line spacer 516 may include an air gap. For example, it may have a NAN (Nitride-Air gap-Nitride) structure in which an air gap is disposed between silicon nitrides.

A storage node contact plug SNC may be formed between the neighboring bit line structures BL. The storage node contact plug SNC may be formed in a storage node contact hole 518. The storage node contact plug SNC may be coupled to the second impurity region 511. The storage node contact plug SNC may include a lower plug 519 and an upper plug 521. The storage node contact plug SNC may further include an ohmic contact layer 520 between the lower plug 519 and the upper plug 521. The ohmic contact layer 520 may include metal silicide. The upper plug 521 may be or include a metal material, and the lower plug 519 may be or include a silicon-containing material.

From the perspective of a direction parallel to the bit line structure BL, a plug isolation layer 517 may be formed between the neighboring storage node contact plugs SNC. The plug isolation layer 517 may be formed between the neighboring bit line structures BL and may provide the storage node contact hole 518 along with the hard mask layer 505.

FIGS. 21A to 21F illustrate application examples of a capacitor of a memory cell.

Figure 21A:
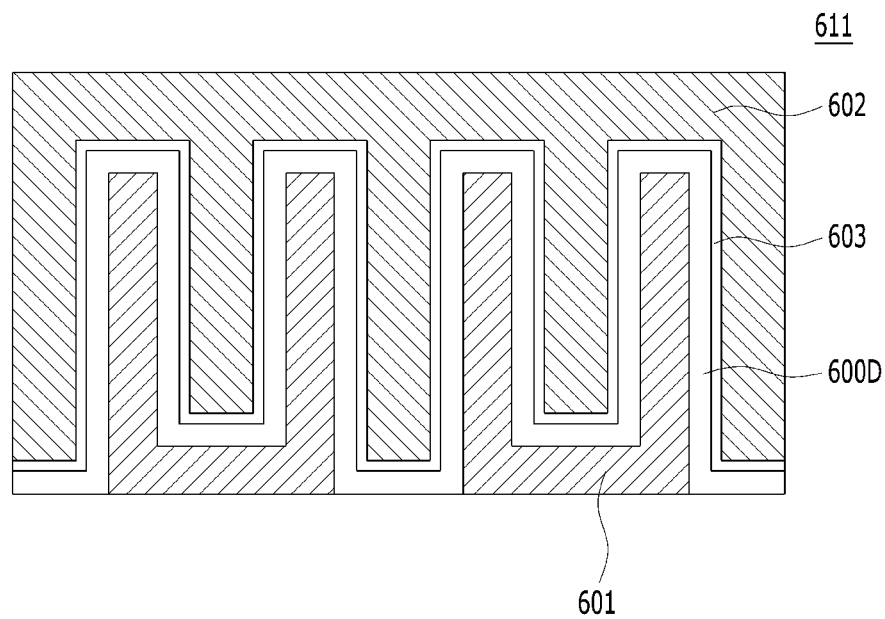
FIGS. 21A to 21F illustrate application examples of a capacitor of a memory cell.

Referring to FIG. 21A, a capacitor 611 may include a bottom electrode 601, a multi-layered stack 600D, a thermal source layer 603, and a top electrode 602. The bottom electrode 601 may have a cylindrical shape. The multi-layered stack 600D may be formed over the bottom electrode 601, and the thermal source layer 603 may be formed over the multi-layered stack 600D. The top electrode 602 may be formed over the thermal source layer 603. The multi-layered stack 600D may correspond to one among the multi-layered stacks of the above-described embodiments of the present invention. Thus, for example, the multi-layered stack 600D may be or include a stack of a booster layer, a hafnium oxide layer, a seed layer and a leakage barrier layer. According to another example, the multi-layered stack 600D may be or include a stack of a booster layer, a hafnium oxide layer, a seed layer, a leakage barrier layer, and an interface control layer.

Hereinafter, detailed descriptions on the constituent elements of FIGS. 21B to 21F that also appear in the embodiment of FIG. 21A may be omitted.

Figure 21B:
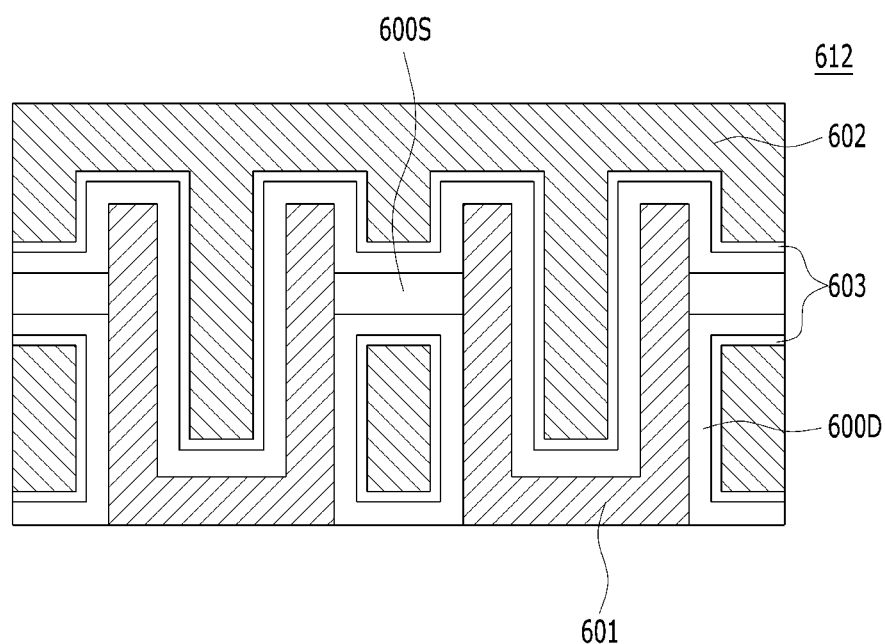

Referring to FIG. 21B, a capacitor 612 may include a cylindrical bottom electrode 601, a multi-layered stack 600D, and a top electrode 602. The capacitor 612 may further include a supporter 600S. The supporter 600S may be a structure that supports the outer wall of the bottom electrode 601. The supporter 600S may be or include silicon nitride. According to another embodiment of the present invention, a multi-level supporter including a plurality of supporters 600S may support the bottom electrode 601. For example, the multi-level supporter may be a two-level supporter structure including a lower level supporter and an upper level supporter. Also, the multi-level supporter may be a three-level supporter structure including a lower level supporter, a middle level supporter, and an upper level supporter.

Figure 21C:
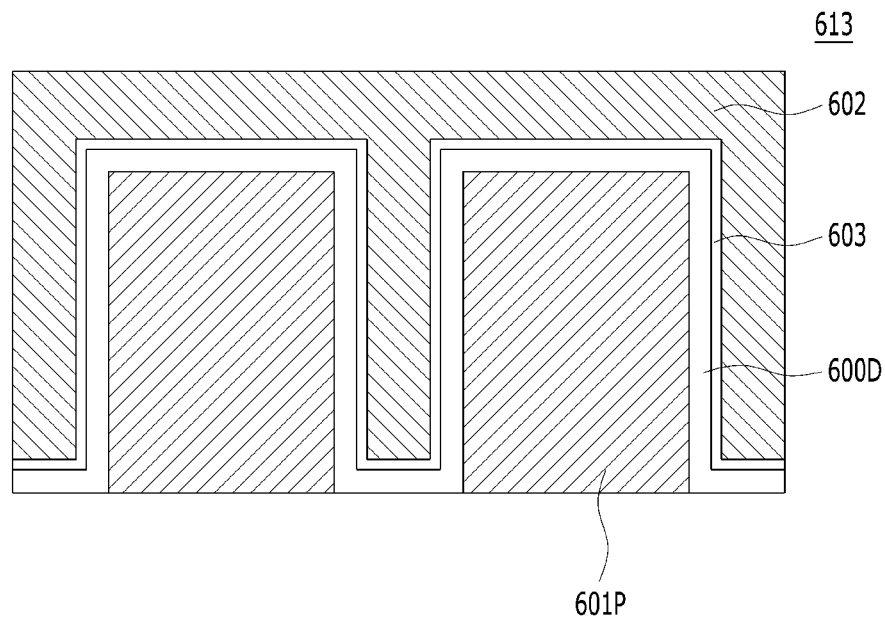
Figure 21D:
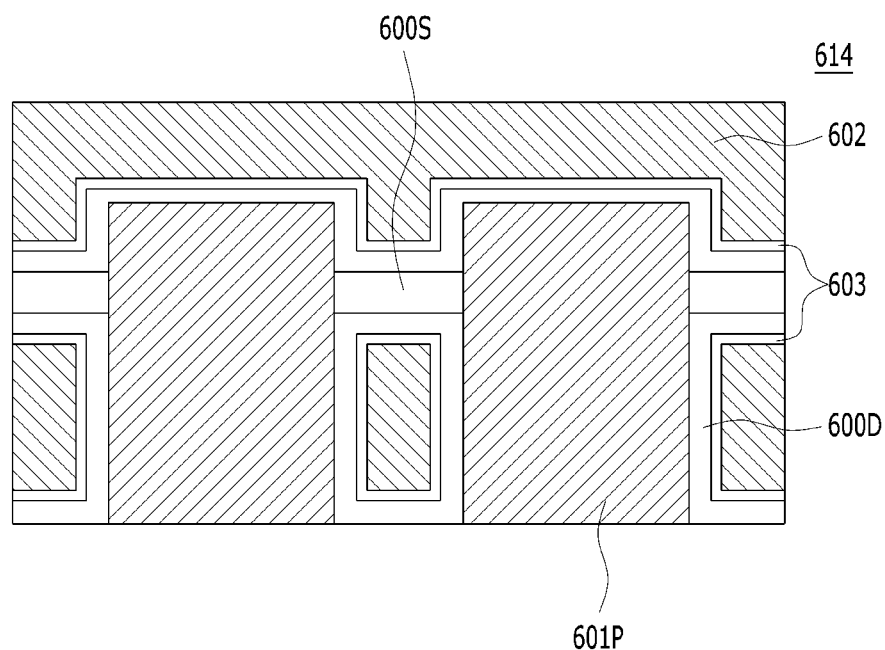

Referring to FIGS. 21C and 21D, capacitors 613 and 614 may include a pillar-shaped bottom electrode 601P, a multi-layered stack 600D, a thermal source layer 603, and a top electrode 602. The capacitor 614 of FIG. 21D may further include a supporter 600S.

Figure 21E:
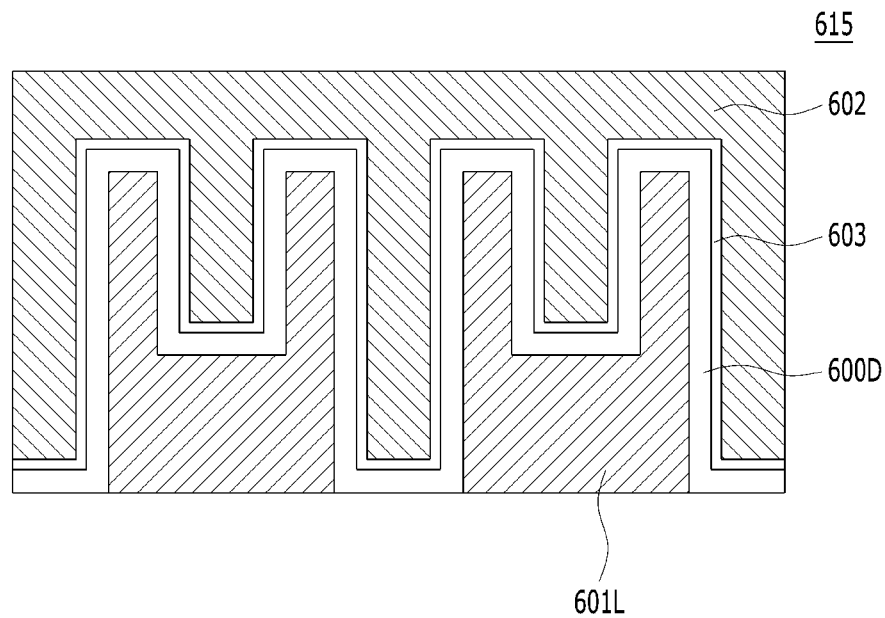
Figure 21F:
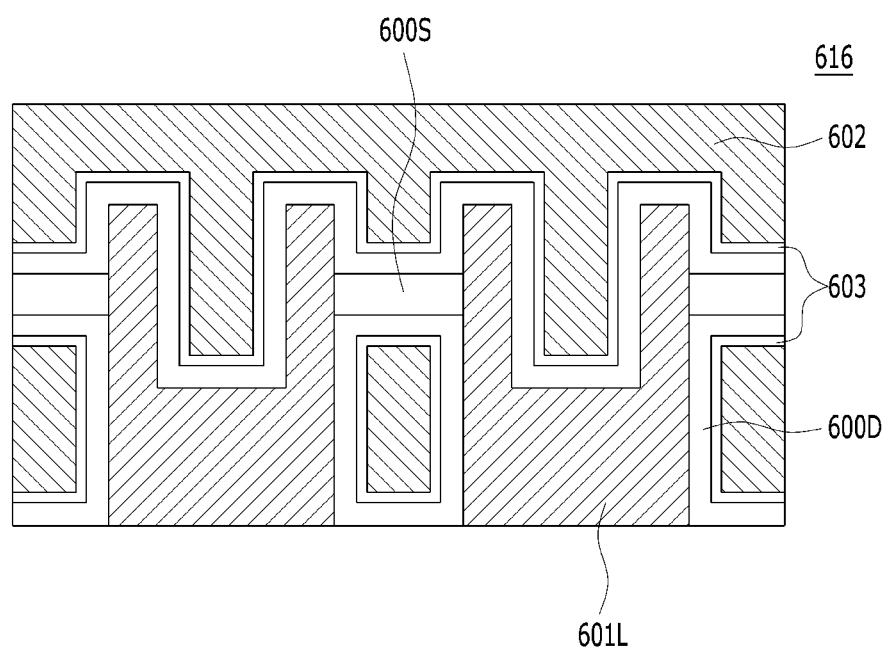

Referring to FIGS. 21E and 21F, capacitors 615 and 616 may include a pylinder-shaped bottom electrode 601L, a multi-layered stack 600D, a thermal source layer 603, and a top electrode 602. The capacitor 616 of FIG. 21F may further include a supporter 600S. The bottom electrode 601L may have a hybrid structure in which a pillar shape and a cylinder shape are merged. As such, the hybrid structure of the pillar shape and the cylinder shape may be referred to as a pylinder-shape.

According to another embodiment of the present invention, in FIGS. 21A to 21F, an additional booster layer may be formed in advance prior to forming the cylindrical bottom electrode 601, a pillar-shaped bottom electrode 601P or a pylinder-shaped bottom electrode 601L.

FIGS. 22A to 22D are cross-sectional views illustrating a method for forming a capacitor in accordance with another embodiment of the present invention. FIGS. 22A to 22D show an example of a method for fabricating a capacitor according to a modified example of FIG. 21A.

Figure 22A:
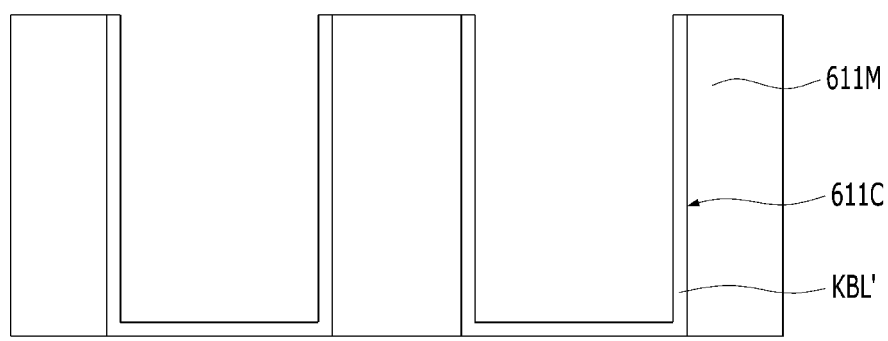
FIGS. 22A to 22D are cross-sectional views illustrating a method for forming a capacitor in accordance with another embodiment of the present invention.

Referring to FIG. 22A, after a mold layer 611M is formed, a capacitor opening 611C may be formed by etching the mold layer 611M. The mold layer 611M may be or include silicon oxide.

An additional booster layer KBL' may be conformally formed over the bottom and sidewalls of the capacitor opening 611C. The additional booster layer KBL' may be formed of the same material as those of the booster layers of the above-described embodiments.

Figure 22B:
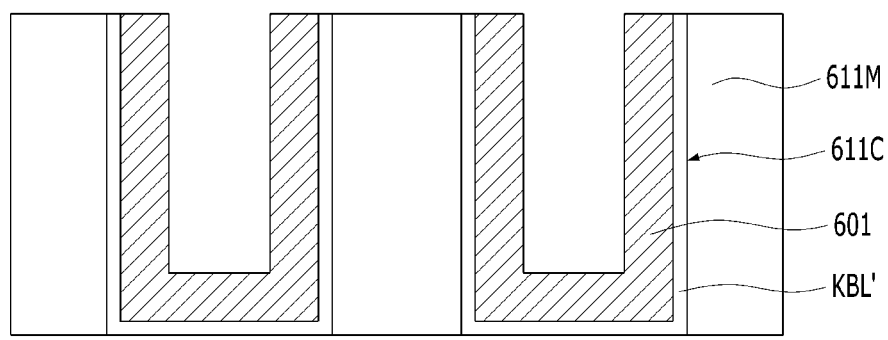

Referring to FIG. 22B, a cylindrical bottom electrode 601 may be formed over the additional booster layer KBL'.

Figure 22C:
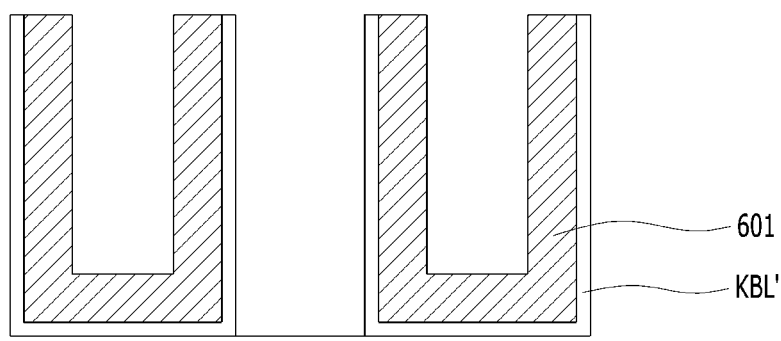

Referring to FIG. 22C, the mold layer 611M may be removed by a dip-out process. The additional booster layer KBL' may remain unremoved.

Figure 22D:
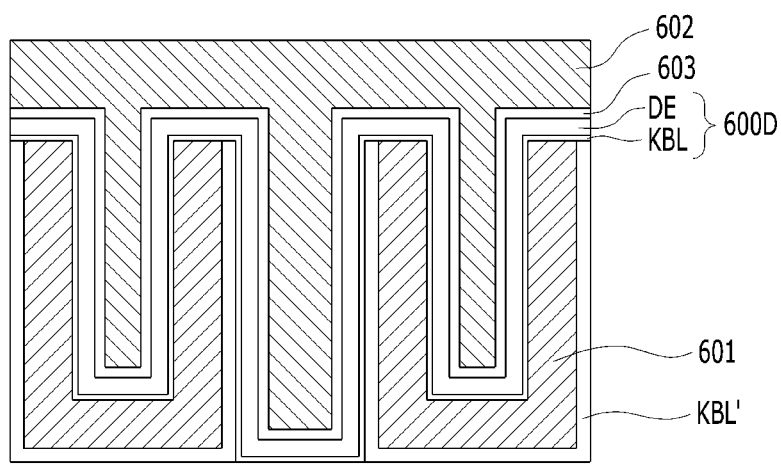

Referring to FIG. 22D, a multi-layered stack 600D may be formed over the bottom electrode 601 and the additional booster layer KBL'. The multi-layered stack 600D may include a booster layer KBL and a dielectric layer stack DE. The dielectric layer stack DE may be a hafnium oxide-based material and may further include a leakage barrier layer and an interface control layer. The dielectric layer stack DE may further include a plurality of booster layers.

A thermal source layer 603 may be formed over the multi-layered stack 600D. The top electrode 602 may be formed over the thermal source layer 603.

As described above, a capacitor with high dielectric constant and low leakage current may be obtained by forming the multi-layered stack 600D to include a booster layer, a hafnium oxide-based dielectric layer and a leakage barrier layer and forming the thermal source layer 603 over the multi-layered stack 600D. As a result, a highly integrated DRAM memory cell with improved refresh characteristics and reliability may be fabricated.

The dielectric layer stack according to the above embodiments of the present invention may be applied to a peripheral circuit of a DRAM. For example, a DRAM may include a memory cell region including memory cells (500 of FIG. 20A) and a peripheral circuit region including a peripheral transistor. At least one of the capacitor 600 of the memory cell 500 and a peripheral transistor that may include one among the multi-layered stacks of the above-described embodiments of the present invention. For example, a hafnium oxide-based dielectric layer and a leakage barrier layer may be included, and the hafnium oxide-based dielectric layer may include a tetragonal hafnium oxide layer, a tetragonal seed layer, and a doped layer.

The dielectric layer stack in accordance with the embodiments of the present invention described above may be applied to a metal-insulator-metal (MIM) capacitor. For example, the MIM capacitor may be or include a first metal electrode, a second metal electrode, a hafnium oxide-based dielectric layer and a leakage barrier layer formed between the first metal electrode and the second metal electrode, where the hafnium oxide-based dielectric layer includes a tetragonal hafnium oxide layer, a tetragonal seed layer, and a doped layer.

The dielectric layer stack in accordance with embodiments of the present invention described above may be applied to an embedded DRAM. For example, the embedded DRAM may include a logic circuit and an embedded DRAM, and a capacitor of the embedded DRAM may include a hafnium oxide-based dielectric layer and a leakage barrier layer, where the hafnium oxide-based dielectric layer may include a tetragonal hafnium oxide layer, a tetragonal seed layer, and a doped layer.

The dielectric layer stack in accordance with the above embodiments of the present invention may be applied to a three-dimensional (3D) NAND. For example, 3D NAND may include a pillar-shaped channel layer, a word line surrounding the pillar-shaped channel layer, and a hafnium oxide-based dielectric layer and a leakage barrier layer between the pillar-shaped channel layer and the word line, where the hafnium oxide-based dielectric layer may include a tetragonal hafnium oxide layer, a tetragonal seed layer, and a doped layer.

According to embodiments of the present invention, it is possible to easily form tetragonal hafnium oxide at a low temperature by using a seed layer and a thermal source layer.

According to embodiments of the present invention, with tetragonal hafnium oxide having a high dielectric constant and a low leakage current, the capacitance of the capacitor may be increased.

According to embodiments of the present invention, the capacitance of the capacitor may be increased further, as a booster layer boosts the dielectric constant of the hafnium oxide layer. While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
a first electrode;
a first booster layer over the first electrode;
a first tetragonal hafnium oxide layer over the first booster layer;
a seed layer over the first tetragonal hafnium oxide layer;
a second booster layer over the seed layer;
a second tetragonal hafnium oxide layer over the second booster layer;
a niobium oxide layer over the second hafnium oxide layer;
a niobium nitride layer over the niobium oxide layer; and
a second electrode over the niobium nitride layer.

2. The semiconductor device of claim 1, wherein the seed layer includes:
a lower tetragonal seed layer;
an upper tetragonal seed layer; and
a doped layer disposed between the lower tetragonal seed layer and the upper tetragonal seed layer, and
wherein the doped layer has a thickness that does not separate crystal grains of the lower tetragonal seed layer and crystal grains of the upper tetragonal seed layer.

3. The semiconductor device of claim 2, wherein the lower tetragonal seed layer and the upper tetragonal seed layer are thicker than the doped layer, and the upper tetragonal seed layer is thicker than the lower tetragonal seed layer.

4. The semiconductor device of claim 2, wherein the doped layer includes a doped tetragonal zirconium oxide doped with a dopant, and the lower tetragonal seed layer and the upper tetragonal seed layer include an undoped tetragonal zirconium oxide which is not doped with any dopant, and the dopant includes aluminum or beryllium.

5. The semiconductor device of claim 1, wherein the first and second booster layers have a thickness thinner than a thickness of the first and second hafnium oxide layers.

6. The semiconductor device of claim 1, wherein the first and second booster layers have a thickness of approximately 0.1 to 5 Å.

7. The semiconductor device of claim 1, wherein the first and second booster layers include a metal oxide, an oxygen content of the metal oxide ranging from approximately 1 to 50 at %.

8. The semiconductor device of claim 1, wherein the first and second booster layers include a metal oxynitride having an oxygen content higher than a nitrogen content.

9. The semiconductor device of claim 1, wherein the first and second booster layers include a divalent metal, a trivalent metal, or a penta-valent metal.

10. The semiconductor device of claim 1, wherein the first and second booster layers include at least one of niobium, tantalum, and vanadium.

11. The semiconductor device of claim 1, wherein the first and second booster layers include niobium oxide, niobium oxynitride, tantalum oxide, tantalum oxynitride, vanadium oxide or vanadium oxynitride.

12. The semiconductor device of claim 1, wherein the first and second hafnium oxide layers further include a crystallization promoting dopant.

13. The semiconductor device of claim 12, wherein the crystallization promoting dopant includes strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg), nitrogen (N), or a combination thereof.

14. The semiconductor device of claim 1, further comprising:
a leakage barrier layer disposed between the second hafnium oxide layer and the niobium oxide layer.

15. The semiconductor device of claim 14, wherein the leakage barrier layer includes an aluminum-containing material or a beryllium-containing material.

\* \* \* \* \*